United States Patent
Kajita et al.

(10) Patent No.: US 9,911,897 B2
(45) Date of Patent: Mar. 6, 2018

(54) METHOD FOR PRODUCING SUBSTRATE FOR SEMICONDUCTOR LIGHT EMITTING ELEMENTS, METHOD FOR MANUFACTURING SEMICONDUCTOR LIGHT EMITTING ELEMENT, SUBSTRATE FOR SEMICONDUCTOR LIGHT EMITTING ELEMENTS, AND SEMICONDUCTOR LIGHT EMITTING ELEMENT

(71) Applicant: OJI HOLDINGS CORPORATION, Tokyo (JP)

(72) Inventors: Yasuhito Kajita, Tokyo (JP); Kei Shinotsuka, Tokyo (JP); Kotaro Dai, Tokyo (JP)

(73) Assignee: OJI HOLDINGS CORPORATION, Tokyo (JP)

( * ) Notice: Subject to any disclaimer, the term of this patent is extended or adjusted under 35 U.S.C. 154(b) by 0 days.

(21) Appl. No.: 15/027,132

(22) PCT Filed: Oct. 9, 2014

(86) PCT No.: PCT/JP2014/077067
§ 371 (c)(1),
(2) Date: Apr. 4, 2016

(87) PCT Pub. No.: WO2015/053363
PCT Pub. Date: Apr. 16, 2015

(65) Prior Publication Data
US 2016/0247965 A1    Aug. 25, 2016

(30) Foreign Application Priority Data

Oct. 11, 2013 (JP) ................................. 2013-213492
Mar. 25, 2014 (JP) ................................. 2014-062605

(51) Int. Cl.
H01L 33/02     (2010.01)
H01L 33/22     (2010.01)
(Continued)

(52) U.S. Cl.
CPC .......... H01L 33/025 (2013.01); H01L 33/005 (2013.01); H01L 33/0062 (2013.01);
(Continued)

(58) Field of Classification Search
CPC . H01L 33/025; H01L 33/005; H01L 33/0062; H01L 33/0075; H01L 33/18; H01L 33/22; H01L 33/24; H01L 33/30
See application file for complete search history.

(56) References Cited

U.S. PATENT DOCUMENTS 7,977,695 B2 *  7/2011  Shim .................. H01L 33/22
                                                         257/98
2009/0093122 A1  4/2009  Ueda et al.
(Continued)

FOREIGN PATENT DOCUMENTS

JP    2007-19318 A    1/2007
JP    2009-94219 A    4/2009
(Continued)

OTHER PUBLICATIONS

International Search Report for PCT/JP2014/077067 dated Dec. 4, 2014.
(Continued)

Primary Examiner — Matthew Reames
(74) Attorney, Agent, or Firm — Caesar Rivise, PC

(57) ABSTRACT

An upper surface of a substrate is etched using a first single-particle film as a mask. The first single-particle film is constituted of first particles having a first particle diameter. The upper surface of the substrate is etched using a second single-particle film as a mask. The second single-
(Continued)

particle film is constituted of second particles having a second particle diameter. The second particle diameter is different from the first particle diameter.

21 Claims, 19 Drawing Sheets

(51) Int. Cl.
H01L 33/00 (2010.01)
H01L 33/18 (2010.01)
H01L 33/24 (2010.01)
H01L 33/30 (2010.01)
H01L 33/32 (2010.01)

(52) U.S. Cl.
CPC .......... *H01L 33/0075* (2013.01); *H01L 33/18* (2013.01); *H01L 33/22* (2013.01); *H01L 33/24* (2013.01); *H01L 33/30* (2013.01); *H01L 33/32* (2013.01)

(56) References Cited

U.S. PATENT DOCUMENTS

| 2009/0236629 | A1 | 9/2009 | Nishikawa et al. |
| 2010/0224894 | A1 | 9/2010 | Kim et al. |
| 2012/0009768 | A1 | 1/2012 | Tadatomo et al. |
| 2012/0138985 | A1 | 6/2012 | Ono et al. |
| 2013/0203192 | A1 | 8/2013 | Ono et al. |
| 2015/0048380 | A1 | 2/2015 | Koike et al. |

FOREIGN PATENT DOCUMENTS

| JP | 2009-130027 A | 6/2009 |
| JP | 2009-223154 A | 10/2009 |
| JP | 2011-49609 A | 3/2011 |
| JP | 2012-109491 A | 6/2012 |
| JP | 2012-124257 A | 6/2012 |
| KR | 10-2011-0018560 A | 2/2011 |
| KR | 10-2011-0139250 | 12/2011 |
| KR | 10-2011-0139250 A | 12/2011 |
| WO | 2007/105782 A1 | 9/2007 |
| WO | WO 2012/150984 | 10/2013 |
| WO | WO 2013/150984 | 10/2013 |

OTHER PUBLICATIONS

International Preliminary Report on Patentability for PCT/JP2014/077067 dated Apr. 12, 2016.
KR Office Action, Translation.
KR10-2011-0018560, Abstract.
Korean Office Action for Application No. 10-2016-7011579 dated Feb. 7, 2017.
English Abstract of WO 2013/150984.
Extended European Search Report for European Patent Application No. 14851533.1, dated Feb. 2, 2017.

\* cited by examiner

METHOD FOR PRODUCING SUBSTRATE FOR SEMICONDUCTOR LIGHT EMITTING ELEMENTS, METHOD FOR MANUFACTURING SEMICONDUCTOR LIGHT EMITTING ELEMENT, SUBSTRATE FOR SEMICONDUCTOR LIGHT EMITTING ELEMENTS, AND SEMICONDUCTOR LIGHT EMITTING ELEMENT

CROSS REFERENCES TO RELATED APPLICATIONS

This U.S. national phase application claims the benefit under 35 U.S.C. § 371 of PCT Application No.: PCT/JP2014/0770767 filed on Oct. 9, 2014, which in turn claims the benefit under Japanese Application Serial No 2013-213492 filed on Oct. 11, 2013 and Japanese Application Serial No. 2014-062605 filed on Mar. 25, 2014 and all of whose entire disclosures are incorporated by reference herein.

FIELD OF INVENTION

The technique of the present disclosure relates to a method for manufacturing a substrate used in semiconductor light emitting elements, a method for manufacturing a semiconductor light emitting element, a substrate for semiconductor light emitting elements, and a semiconductor light emitting element.

BACKGROUND OF THE INVENTION

The development of semiconductor light emitting elements used in light-emitting diodes, for example, has been progressing recently. As described in Patent Document 1, for example, a semiconductor light emitting element includes a substrate and a light emitting structure layered upon the substrate. The substrate is formed from sapphire, silicon carbide, or the like, for example, and the light emitting structure is a group III-V semiconductor thin film multilayer body, for example. When a current is supplied to the light emitting structure, the light emitting structure emits light. The emitted light traverses the substrate and exits to the exterior of the semiconductor light emitting element.

CITATION LIST

Patent Literature

Patent Literature 1: Japanese Unexamined Patent Application Publication No. 2011-49609A

SUMMARY OF INVENTION

However, light produced in the light emitting structure may be totally reflected at an interface between the light emitting structure and the substrate due to a difference in the refractive indices of the light emitting structure and the substrate. If such total reflection is repeated, the light produced in the light emitting structure will attenuate within the light emitting structure, which reduces the light extraction efficiency of the semiconductor light emitting element.

An object of the technique in the present disclosure is to provide a method for manufacturing a substrate for semiconductor light emitting elements, the substrate being capable of improving the light extraction efficiency of a semiconductor light emitting element; a method for manufacturing a semiconductor light emitting element; a substrate for semiconductor light emitting elements; and a semiconductor light emitting element.

A method for manufacturing a substrate for semiconductor light emitting elements that solves the above-described problem includes a first step of etching an upper surface of a substrate using a first single-particle film constituted of first particles having a first particle diameter as a mask, and a second step of etching the upper surface of the substrate using a second single-particle film constituted of second particles having a second particle diameter that is different from the first particle diameter as a mask.

In the above-described method for manufacturing a substrate for semiconductor light emitting elements, it is preferable that the method further include a step of forming the first single-particle film on the upper surface of the substrate and a step of forming the second single-particle film on the upper surface of the substrate after the first step, and that the etching of the second step be carried out after the etching of the first step.

In the above-described method for manufacturing a substrate for semiconductor light emitting elements, the method may further include a step of layering the first single-particle film on the second single-particle film, and that the etching of the first step and the etching of the second step be carried out simultaneously.

In the above-described method for manufacturing a substrate for semiconductor light emitting elements, the first particle diameter may be greater than the second particle diameter.

In the above-described method for manufacturing a substrate for semiconductor light emitting elements, the first particle diameter may be smaller than the second particle diameter.

In the above-described method for manufacturing a substrate for semiconductor light emitting elements, it is preferable that the first particle diameter be no less than 300 nm and no greater than 5 µm, the second particle diameter be no less than 100 nm and no greater than 1 µm, and the second particle diameter be no less than $\frac{1}{50}$ and no greater than $\frac{1}{3}$ the first particle diameter.

In the above-described method for manufacturing a substrate for semiconductor light emitting elements, it is preferable that the first particle diameter be no less than 100 nm and no greater than 1 µm, the second particle diameter be no less than 300 nm and no greater than 5 µm, and the first particle diameter be no less than $\frac{1}{10}$ and no greater than $\frac{1}{3}$ the second particle diameter.

In the above-described method for manufacturing a substrate for semiconductor light emitting elements, it is preferable that in at least one of the first step and the second step, the single-particle film used as a mask in the step be removed from the upper surface of the substrate before the single-particle film is etched away.

In the above-described method for manufacturing a substrate for semiconductor light emitting elements, the first particle diameter may be smaller than the second particle diameter, and the etching of the second step may be ended before the second particles are etched away.

In the above-described method for manufacturing a substrate for semiconductor light emitting elements, it is preferable that a flat part that extends along a single crystal plane of the substrate, a plurality of large-diameter projections that project from the flat part, and a plurality of small-diameter projections that are smaller than the large-diameter projections be formed on the upper surface of the substrate through the first step and the second step; and that the plurality of small-diameter projections include first small-diameter projections that project from an outside surface of the large-diameter projection.

In the above-described method for manufacturing a substrate for semiconductor light emitting elements, the plurality of small-diameter projections may include second small-diameter projections that project from the flat part.

In the above-described method for manufacturing a substrate for semiconductor light emitting elements, it is preferable that each of the large-diameter projections has a base that connects with the flat part and a tip, and has a conical shape that becomes narrower from the base toward the tip.

In the above-described method for manufacturing a substrate for semiconductor light emitting elements, it is preferable that each of the large-diameter projections has a base that connects with the flat part and a tip, and has a truncated cone shape that becomes narrower from the base toward the tip and has a flat surface on the tip.

In the above-described method for manufacturing a substrate for semiconductor light emitting elements, it is preferable that each of the small-diameter projections has a base that connects with the surface from which the plurality of small-diameter projections project and a tip, and has a conical shape that becomes narrower from the base toward the tip.

In the above-described method for manufacturing a substrate for semiconductor light emitting elements, the first small-diameter projections may be positioned on the outside surface of the large-diameter projection in a location aside from the flat surface.

In the above-described method for manufacturing a substrate for semiconductor light emitting elements, it is preferable that each of the small-diameter projections has a base that connects with the surface from which the plurality of small-diameter projections project and a tip, and has a truncated cone shape that becomes narrower from the base toward the tip and has a flat surface on the tip.

In the above-described method for manufacturing a substrate for semiconductor light emitting elements, it is preferable that bridge portions that project from the flat part be further formed on the upper surface of the substrate through the first step and the second step, and that the bridge portions connect the large-diameter projections that are mutually-adjacent on the flat part.

A method for manufacturing a semiconductor light emitting element that solves the above-described problem includes a step of forming a substrate for semiconductor light emitting elements through the above-described method for manufacturing a substrate for semiconductor light emitting elements, the step including forming a stepped portion on the upper surface of the substrate through the etching and a step of forming a light emitting structure including a semiconductor layer on the upper surface.

A substrate for semiconductor light emitting elements that solves the above-described problem includes a light emitting structure formation surface in which a light emitting structure including a semiconductor layer is formed. The light emitting structure formation surface includes a flat part that extends along a single crystal plane of the substrate, a plurality of large-diameter projections that project from the flat part, and a plurality of small-diameter projections that are smaller than the large-diameter projections. At least some of the plurality of small-diameter projections are first small-diameter projections that project from an outside surface of the large-diameter projection.

In the above-described substrate for semiconductor light emitting elements, it is preferable that a height of each of the first small-diameter projections be lower the closer the position of the first small-diameter projection is to the base of the corresponding large-diameter projection in the outside surface of the large-diameter projection.

In the above-described substrate for semiconductor light emitting elements, it is preferable that a width of each of the first small-diameter projections on the outside surface of the corresponding large-diameter projection be greater the closer the position of the first small-diameter projection is to the base of the corresponding large-diameter projection in the outside surface of the large-diameter projection.

A semiconductor light emitting element that solves the above-described problem includes the above-described substrate for semiconductor light emitting elements and a light emitting structure including a semiconductor layer. The substrate for semiconductor light emitting elements supports the light emitting structure.

According to the technique of the present disclosure, the light extraction efficiency of a semiconductor light emitting element can be improved. Furthermore, according to the technique of the present disclosure, a film can be formed on the substrate for semiconductor light emitting elements with ease, and crystal defects can be reduced, while also improving the light extraction efficiency.

DETAILED DESCRIPTION OF THE PREFERRED EMBODIMENTS

First Embodiment

Referring to FIGS. 1 to 4, an embodiment of a substrate for semiconductor light emitting elements will be described as a first embodiment of the technique of the present disclosure.

Figure 1:
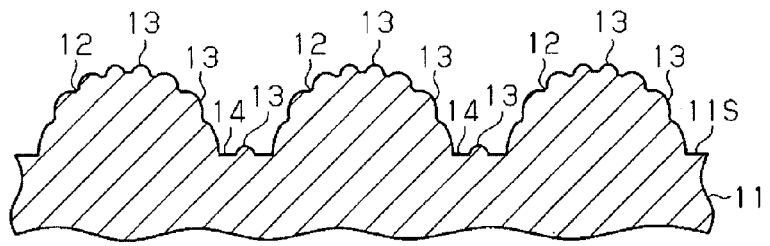
FIG. 1 is a cross-sectional view illustrating the cross-sectional structure of a substrate for semiconductor light emitting elements according to a first embodiment of the technique of the present disclosure.

As illustrated in FIG. 1, an element substrate 11, which is a substrate for semiconductor light emitting elements, has a light emitting structure formation surface 11S as one of the surfaces of the substrate. A light emitting structure is formed on the light emitting structure formation surface 11S during a process for manufacturing the semiconductor light emitting element.

The material of which the element substrate 11 is formed has thermal, mechanical, chemical, and optical resistance in the process for manufacturing the semiconductor light emitting element. The material of which the element substrate 11 is formed is one selected from the group consisting of, for example, $Al_2O_3$ (sapphire), SiC, Si, Ge, $MgAl_2O_4$, $LiTaO_3$, $LiNbO_3$, $ZrB_2$, GaP, GaN, GaAs, InP, InSn, AlN, and $CrB_2$. Of these, sapphire has relatively high mechanical, thermal, chemical, and optical resistance, and is also light-transmissive, and is therefore preferable as the material of which the element substrate 11. The light emitting structure formation surface 11S itself has crystalline properties suited to providing the light emitting structure with crystalline properties.

The light emitting structure formation surface 11S has a recessing and protruding structure constituted of many fine concavities and convexities. The fine concavities and convexities are repeated along the directions in which the light emitting structure formation surface 11S extends. The recessing and protruding structure of the light emitting structure formation surface 11S is constituted of a plurality of large-diameter projections 12, a plurality of small-diameter projections 13, and a flat part 14.

The flat part 14 is a flat surface that extends along a single crystal plane. In the case where the crystal system of the element substrate 11 is a hexagonal crystal system, the flat part 14 is a flat surface in which one plane selected from the group consisting of a C plane, an M plane, an A plane, and an R plane, for example, is continuous. In the case where the crystal system of the element substrate 11 is a cubic crystal system, the flat part 14 is a flat surface in which one plane selected from the group consisting of a (001) plane, a (111) plane, and a (110) plane, for example, is continuous. Note that the crystal plane of the flat part 14 may be a higher index plane than the stated index plane, and any single crystal plane suitable for providing the light emitting structure with crystalline properties may be employed. The crystal plane of the flat part 14 ensures that a semiconductor layer on the light emitting structure formation surface 11S has crystalline properties.

Each of the plurality of large-diameter projections 12 projects from the flat part 14. Each of the plurality of large-diameter projections 12 has a conical shape, growing narrower toward the tip thereof as the projection progresses from a base that is connected to the flat part 14.

Some of the plurality of small-diameter projections 13 project from the flat part 14, and the remaining plurality of small-diameter projections 13 project from the large-diameter projections 12. Each of the plurality of small-diameter projections 13 has a conical shape, growing narrower toward the tip thereof as the projection progresses from a base that is connected to a corresponding large-diameter projection 12 or the flat part 14. When viewed in plan view facing the light emitting structure formation surface 11S, the radius of a circle that circumscribes the small-diameter projections 13 is smaller than the radius of a circle that circumscribes the large-diameter projections 12.

Note that the each of projections 12 and 13 may have a hemispherical shape, a circular cone shape, a pyramid shape, or the like. That is, when the projections 12 and 13 are cut by a plane that passes through the apex of the projection 12 or 13 and is perpendicular to the flat part 14, a generating line in the vertical cross-section, which is the cross-section corresponding to the stated plane, may be a curved line or a straight line; it is sufficient for the generating line to be located in a region enclosed by a triangle that takes the apex of the projection 12 or 13 as an apex and a semicircle that passes through the apex of the projection 12 or 13. Meanwhile, the large-diameter projections 12 and the small-diameter projections 13 may have mutually different shapes. Furthermore, the shapes of individual large-diameter projections 12 may be mutually different, and the shapes of individual small-diameter projections 13 may be mutually different.

Figure 2:
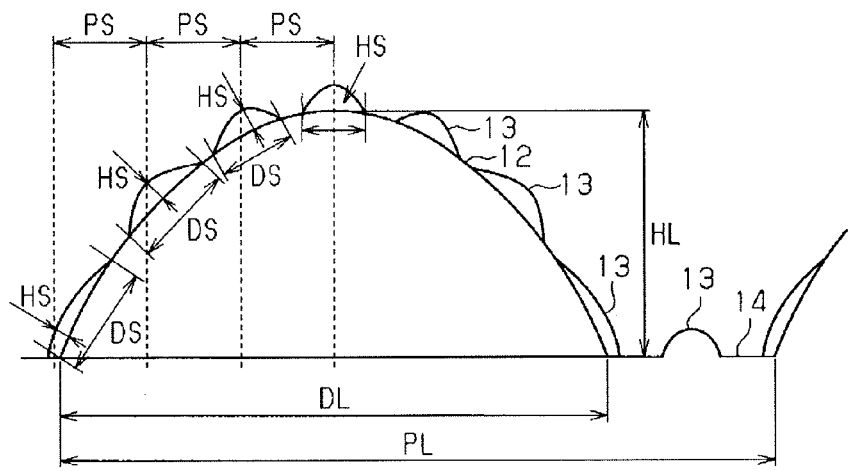
FIG. 2 is a cross-sectional view illustrating the cross-sectional structure of the substrate for semiconductor light emitting elements according to the first embodiment in an enlarged manner.

As illustrated in FIG. 2, a distance between mutually-adjacent large-diameter projections 12, in a direction parallel to the flat part 14, is a pitch PL of the large-diameter projections 12. The outside surfaces of the large-diameter projections 12 and the surface of the flat part 14 connect with the small-diameter projections 13. In the normal direction of the surface that connects with the small-diameter projection 13, a maximum value of a distance between the surface that connects with the small-diameter projection 13 and the surface of that small-diameter projection 13 is a height HS of that small-diameter projection 13. The part of each of the plurality of small-diameter projections 13 that has the height HS is the apex of that small-diameter projection 13, and a distance between the apexes of mutually-adjacent small-diameter projections 13 in a direction parallel to the flat part 14 is a pitch PS of the small-diameter projections 13.

A modal value of the pitch PL of the large-diameter projections 12 is preferably no less than 300 nm and no greater than 5.0 µm, and a modal value of the pitch PS of the small-diameter projections 13 is preferably no less than 100 nm and no greater than 1.0 µm. Assuming the pitches PL and PS of the projections 12 and 13 are within the stated range, the projections 12 and 13 will be formed in the light emitting structure formation surface 11S at the required positions and densities while suppressing the total reflection of light at the light emitting structure formation surface 11S.

The modal value of the pitch PL of the large-diameter projections 12 is found through image processing based on an atomic force microscope image, as indicated below. First, an atomic force microscope image is taken of a randomly-selected rectangular region that follows the flat part 14. At that time, the length of one side of the rectangular region in the obtained atomic force microscope image is from 30 to 40 times the modal value of the pitch PL. Next, a fast Fourier transform image based on the atomic force microscope image is obtained through waveform separation of the atomic force microscope image using a Fourier transform. Next, the distance between a zero-order peak and a first-order peak in the fast Fourier transform image is found, and the inverse of that distance is handled as the pitch PL in that single rectangular region. Then, the pitch PL is measured for rectangular regions in 25 or more mutually-different locations, and an average of the measured values obtained in such a manner is taken as the modal value of the pitch PL. It is preferable that the rectangular regions be at least 1 mm apart from each other, and further preferable that the rectangular regions be from 5 mm to 1 cm apart from each other.

Likewise, the modal value of the pitch PS of the small-diameter projections 13 is found by taking an atomic force microscope image of a randomly-selected rectangular region in the outside surface of a large-diameter projection 12 or the flat part 14 and carrying out the same image processing as described above on the basis of that atomic force microscope image.

It is preferable that a height HL of the large-diameter projections 12 from the flat part 14 be no less than 100 nm and no greater than 4.0 µm, and that the height HS of the small-diameter projections 13 from the outside surface of the large-diameter projections 12 or from the flat part 14 connecting with the small-diameter projections 13 be no less than 10 nm and no greater than 800 nm. Assuming the heights HL and HS of the projections 12 and 13 are within this range, it is easy to suppress total reflection of light at the light emitting structure formation surface 11S. Note that the height HL of the large-diameter projections 12 and the height HS of the small-diameter projections 13 are, in the aforementioned vertical cross-section, the maximum lengths of those projections 12 and 13 in a direction orthogonal to a straight line connecting both ends of the base of each of the projections 12 and 13.

The modal value of the height HL of the large-diameter projections 12 is found through image processing based on an atomic force microscope image, as indicated below. First, an atomic force microscope image is taken of a randomly-selected rectangular region that follows the flat part 14, and the cross-sectional shape of the recessing and protruding structure is obtained from that atomic force microscope image. Next, for five or more consecutive large-diameter projections 12 in the cross-sectional shape, a difference between the height of the apex of the large-diameter projection 12 and the height of the flat part 14 connected with that large-diameter projection 12 is found. The heights of the large-diameter projections 12 are measured in the same manner in five or more mutually-different rectangular regions, so that the heights of a total of 25 or more large-diameter projections 12 are measured. An equatorial direction profile using a two-dimensional Fourier transform image is then created, and the modal value of the height HL of the large-diameter projections 12 is found from the inverse of a first-order peak thereof. It is preferable that the rectangular regions be at least 1 mm apart from each other, and further preferable that the rectangular regions be from 5 mm to 1 cm apart from each other.

Likewise, the modal value of the height HS of the small-diameter projections 13 is found by taking an atomic force microscope image of a randomly-selected rectangular region in the outside surface of a large-diameter projection 12 or the flat part 14 and carrying out the same image processing as described above on the basis of that atomic force microscope image.

In the plurality of small-diameter projections 13 that connect with a corresponding large-diameter projection 12, it is preferable that the height HS of the small-diameter projections 13 be lower the closer the small-diameter projection 13 is to the base of the large-diameter projection 12. Meanwhile, in the stated vertical cross-section, the length of a line segment connecting both ends of the base of a large-diameter projection 12 is a width DL of the large-diameter projection 12, and the length of a line segment connecting both ends of the base of a small-diameter projection 13 is a width DS of the small-diameter projection 13. In the plurality of small-diameter projections 13 that connect with the outside surface of a corresponding large-diameter projection 12, it is preferable that the width DS of that small-diameter projection 13 be greater the closer the small-diameter projection 13 is to the base of the large-diameter projection 12. Here, of the plurality of small-diameter projections 13 that connect with a corresponding large-diameter projection 12, the height HS of the small-diameter projection 13 is lower and the width DS of the small-diameter projection 13 is greater, such that the small-diameter projection 13 has a flatter shape, the closer the small-diameter projection 13 is located to the base of that large-diameter projection 12.

It is preferable, when the small-diameter projections 13 are each cut by a plane that passes through the apex of that small-diameter projection 13 and is parallel to the flat part 14, that the length of a line segment connecting both ends of the base of each small-diameter projection 13 in the resulting cross-section be essentially constant regardless of the position where the small-diameter projection 13 connects with the corresponding large-diameter projection 12. In this case, among the plurality of small-diameter projections 13, the height HS of the small-diameter projection 13 is lower and the width DS of the small-diameter projection 13 is greater the closer the small-diameter projection 13 is to the base of the large-diameter projection 12. Of the plurality of small-diameter projections 13, the small-diameter projections 13 have a more essentially hemispherical shape the closer the small-diameter projection 13 is located to the tip of the corresponding large-diameter projection 12. Furthermore, the small-diameter projections 13 have shapes that extend essentially in a more elliptical manner from the tip to the base of the large-diameter projection 12 the closer to the base of the corresponding large-diameter projection 12 the small-diameter projection 13 is located. To rephrase, of the plurality of small-diameter projections 13, the small-diameter projections 13 closer to the base of the corresponding large-diameter projection 12 are formed on the outside surface of the large-diameter projection 12 so as to have strip shapes or droplet shapes extending from the tip to the base of the large-diameter projection 12.

Meanwhile, a ratio of the length of the flat part 14 (PL−DL) to the pitch PL (that is, (PL−DL/PL)) is preferably no less than 1/10 and no greater than 1/2, and further preferably no less than 1/6 and no greater than 1/3.

A ratio of the height HL to the width DL of the large-diameter projections 12 is an aspect ratio of the large-diameter projections 12, and a ratio of the height HS to the width DS of the small-diameter projections 13 is an aspect ratio of the small-diameter projections 13. The aspect ratio of the large-diameter projections 12 is preferably no less than 0.3 and no greater than 0.9, and more preferably no less than 0.5 and no greater than 0.8. Furthermore, the aspect ratio of the small-diameter projections 13 near the apex of a corresponding large-diameter projection 12 is preferably no less than 0.3 and no greater than 0.9, and more preferably no less than 0.5 and no greater than 0.8. Assuming the aspect ratio of the large-diameter projections 12 is no less than 0.5 and the aspect ratio of the small-diameter projections 13 is no less than 0.5, it is easy to suppress total reflection of light at the light emitting structure formation surface 11S. Furthermore, assuming the aspect ratio of the large-diameter projections 12 is no greater than 0.6 and the aspect ratio of the small-diameter projections 13 is no greater than 0.6, it is easy to embed a semiconductor layer in order to form the light emitting structure, in particular a buffer layer and undoped GaN, between the projections 12 and 13.

The aforementioned strip or droplet shapes of the small-diameter projections 13 will be described in detail with reference to FIG. 3.

Figure 3:
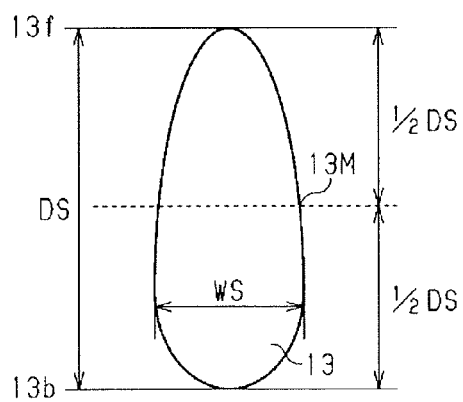
FIG. 3 is a forward cross-sectional view illustrating a small-diameter projection in the substrate for semiconductor light emitting elements according to the first embodiment in an enlarged manner.

As illustrated in FIG. 3, when viewed in a front view facing the surface of the corresponding large-diameter projection 12, the small-diameter projection 13 has an essentially elliptical shape whose long axis extends from the tip toward the base of the large-diameter projection 12 on the surface of the large-diameter projection 12. Each small-diameter projection 13 has a different shape depending on the location thereof. The closer the small-diameter projection 13 is to the tip of the corresponding large-diameter projection 12, the closer the shape of the small-diameter projection 13 is to a circle. In each of the elliptical plurality of small-diameter projections 13, a part that is closest to the tip of the corresponding large-diameter projection 12 is a tip 13f of that small-diameter projection 13, and a part that is closest to the base of the corresponding large-diameter projection 12 is a base 13b of the small-diameter projection 13. In the elliptical small-diameter projections 13, a distance between the tip 13f and the base 13b corresponds to a width in the long axis direction, and is the aforementioned width DS of that small-diameter projection 13.

In the elliptical small-diameter projections 13, a center point between the tip 13f and the base 13b is a center area 13M of that small-diameter projection 13. A distance, in a circumferential direction of the large-diameter projection 12, between both end portions of the elliptical small-diameter projection 13 corresponds to a width along a short axis direction thereof, and is a minor axis width WS of the small-diameter projection 13. In each of the plurality of small-diameter projections 13, a maximum width area where the minor axis width WS is greatest is located between the center area 13M and the base 13b in the long axis direction of that small-diameter projection 13. The location of the maximum width area of the width DS in the long axis direction differs in each of the small-diameter projections 13. For example, of the plurality of small-diameter projections 13 that connect with a large-diameter projection 12, the maximum width area is closer to the center area 13M the closer the small-diameter projection 13 is to the tip of the large-diameter projection 12, and conversely, the maximum width area is closer to the base 13b the closer the small-diameter projection 13 is to the base of the large-diameter projection 12. The area, along the width DS in the long axis direction of each small-diameter projection 13, that has the height HS, or in other words, the position of the apex thereof, also differs in each small-diameter projection 13, and the position of the apex is closer to the tip 13f the closer the small-diameter projection 13 is to the tip of the large-diameter projection 12.

Figure 4:
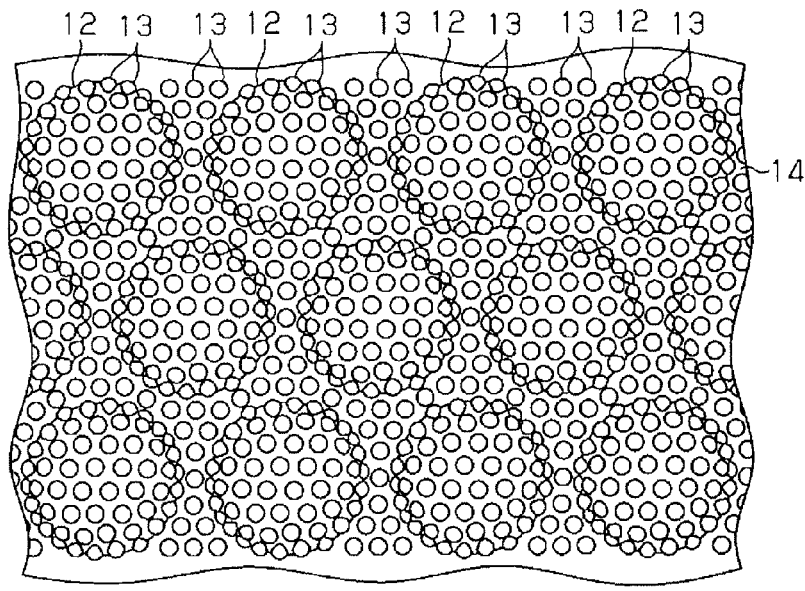
FIG. 4 is a plan view illustrating the planar structure of the substrate for semiconductor light emitting elements according to the first embodiment.

As illustrated in FIG. 4, when the light emitting structure formation surface 11S is viewed in plan view, the small-diameter projections 13 project from outer circumferential edges of the large-diameter projections 12. In other words, an outer shape of the projections formed by the large-diameter projections 12 and the small-diameter projections 13 that connect with those large-diameter projections 12 is a concavo-convex rippled shape.

The large-diameter projections 12 and the small-diameter projections 13 may be arranged regularly or irregularly. To suppress the total reflection of light at the light emitting structure formation surface 11S, it is preferable that the large-diameter projections 12 and the small-diameter projections 13 both be as close-packed as possible two-dimensionally, when the light emitting structure formation surface 11S is viewed in plan view. According to such a structure, the film stress on the light emitting structure formed in the light emitting structure formation surface 11S is also suppressed from concentrating in a single small-diameter projection 13, which also serves to suppress the mechanical strength necessary for the small-diameter projections 13.

In a semiconductor light emitting element that uses the element substrate 11 according to the first embodiment, the areas of the light emitting structure formation surface 11S where the large-diameter projections 12 are formed have a lower angle of incidence for light produced by the light emitting structure with respect to the light emitting structure formation surface 11S, than in the case where the light emitting structure formation surface 11S is flat. As a result, the angle of incidence of the light is suppressed from becoming greater than a critical angle, which in turn suppresses total reflection from repeating at the interface between the light emitting structure and the element substrate 11.

Furthermore, in addition to changing the angle of reflection of the light as described above, providing the light emitting structure formation surface 11S with the small-diameter projections 13 makes it easier for light produced in the light emitting structure to diffract by striking the small-diameter projections 13. In the first embodiment in particular, the small-diameter projections 13 project from the flat part 14 as well, which makes such diffraction of light easier to occur.

Because the light emitting structure formation surface 11S includes the large-diameter projections 12 and the small-diameter projections 13, the direction in which the light produced in the light emitting structure travels is dispersed, which makes it possible to increase the effect of suppressing total reflection at the interface between the light emitting structure and the element substrate 11 and increase the light extraction efficiency.

In addition, because the small-diameter projections 13 become flatter from the tip toward the base of each large-diameter projection 12, the concavities and convexities in the outside surface of the large-diameter projection 12 are less pronounced at the base of the large-diameter projection 12 than at the tip thereof. Grooves formed between adjacent small-diameter projections 13 are therefore shallower at the base of the large-diameter projection 12 than at the tip of the large-diameter projection 12. Accordingly, when a semiconductor layer including a buffer layer and undoped GaN is formed on the light emitting structure formation surface 11S, it is easier to fill the grooves with the semiconductor layer including the buffer layer and undoped GaN near the base of the large-diameter projections 12. As a result, the semiconductor layer including the buffer layer and undoped GaN is formed more uniformly than in the case where the depths of the groove formed between adjacent small-diameter projections 13 are constant regardless of the positions of the small-diameter projections 13.

Furthermore, because the outer shape of the projections formed by the large-diameter projections 12 and the small-diameter projections 13 is a concavo-convex rippled shape when the light emitting structure formation surface 11S is viewed in plan view, crystal defects are suppressed from arising when the semiconductor layer including the buffer layer and undoped GaN is formed on the light emitting structure formation surface 11S. Normally, when a semiconductor layer including a buffer layer and undoped GaN is formed through crystal growth, the crystal growth begins at a part of the light emitting structure formation surface 11S that is flat, progressing in a direction parallel to that flat surface and a direction perpendicular to that flat surface. Here, crystal transition occurs with ease when crystals produced at several flat areas progress in a direction parallel to the flat surface and collide with each other, but at this time, the recessing and protruding structure of the light emitting structure formation surface 11S acts as an obstruction, restricting the directions in which the crystal transition can progress. As a result, an increase in crystal defects resulting from the crystal transition progressing in the directions in which such transition occurs with ease is suppressed. In the first embodiment in particular, the outer shape of the stated projections is a complex concavo-convex ripple shape, and thus provides an improved effect of suppressing crystal defects.

According to the first embodiment as described thus far, the following effects are achieved.

(1) Because the light emitting structure formation surface 11S includes the large-diameter projections 12 and the small-diameter projections 13, the direction in which the light produced in the light emitting structure travels is dispersed due to reflection, diffraction, and the like of the light. As a result, total reflection is suppressed from occurring at the interface between the light emitting structure and the element substrate 11, which makes it possible to increase the light extraction efficiency.

(2) The small-diameter projections 13 project from the flat part 14 as well, which increases the effect described in (1).

(3) Because the height HS of the small-diameter projections 13 decreases from the tip toward the base of each large-diameter projection 12, the concavities and convexities in the outside surface of the large-diameter projection 12 become less pronounced. Forming a semiconductor layer including a buffer layer and undoped GaN becomes easier as a result. In addition, because the width DS of the small-diameter projections 13 increases from the tip toward the base of each large-diameter projection 12, the concavities and convexities in the outside surface of the large-diameter projection 12 become even less pronounced.

(4) Because the outer shape of the projections formed by the large-diameter projections 12 and the small-diameter projections 13 is a concavo-convex rippled shape when the light emitting structure formation surface 11S is viewed in plan view, crystal defects are suppressed from arising when the semiconductor layer including the buffer layer and undoped GaN is formed on the light emitting structure formation surface 11S.

A first modified example, which is a modified example of the first embodiment, will now be described with reference to FIG. 5. In the first modified example, the shape of the large-diameter projections is different from that in the first embodiment. The following descriptions will focus on the differences from the first embodiment; elements that are the same as in the first embodiment will be given the same reference numerals, and descriptions thereof will be omitted.

Figure 5:
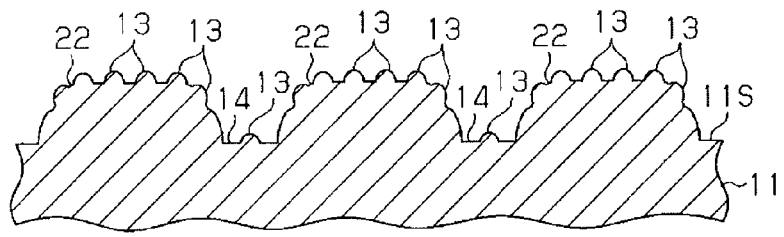
FIG. 5 is a cross-sectional view illustrating the cross-sectional structure of a substrate for semiconductor light emitting elements according to a first modified example of the technique of the present disclosure.

As illustrated in FIG. 5, large-diameter projections 22 have a truncated cone shape, with the tip area thereof being formed flat such that no apex is present. The shape of the large-diameter projections 22 may be a shape obtained by cutting the apex from a hemisphere, or may be a truncated circular cone or pyramid shape. To rephrase, in the aforementioned vertical cross-section, the generating line that forms a side surface of the large-diameter projections 22 may be a curved line or a straight line. Meanwhile, the large-diameter projections 22 may have mutually different shapes.

According to this configuration as well, in the plurality of small-diameter projections 13 that connect with a corresponding large-diameter projection 22, it is preferable that the height HS of the small-diameter projections 13 be lower the closer the small-diameter projection 13 is to the base of the large-diameter projection 22. Furthermore, with respect to the vertical cross-section, in the plurality of small-diameter projections 13 that connect with the outside surface of a corresponding large-diameter projection 22, it is preferable that the width DS of the small-diameter projections 13 be greater the closer the small-diameter projection 13 is to the base of the large-diameter projection 22.

Such a configuration provides equivalent effects as the effects (1) to (4) of the first embodiment described above.

A second modified example, which is a modified example of the first embodiment, will now be described with reference to FIG. 6. In the second modified example, the shape of the small-diameter projections is different from that in the first embodiment. The following descriptions will focus on the differences from the first embodiment; elements that are the same as in the first embodiment will be given the same reference numerals, and descriptions thereof will be omitted.

Figure 6:
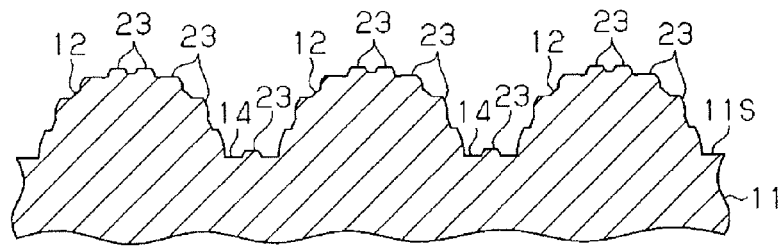
FIG. 6 is a cross-sectional view illustrating the cross-sectional structure of a substrate for semiconductor light emitting elements according to a second modified example of the technique of the present disclosure.

As illustrated in FIG. 6, small-diameter projections 23 have a truncated cone shape, with the tip area thereof being formed flat such that no apex is present. The shape of the small-diameter projections 23 may be a shape obtained by cutting the apex from a hemisphere, or may be a truncated circular cone or pyramid shape. To rephrase, in the aforementioned vertical cross-section, the generating line that forms a side surface of the small-diameter projections 23 may be a curved line or a straight line. Meanwhile, the small-diameter projections 23 may have mutually different shapes.

According to this configuration as well, in the plurality of small-diameter projections 23 that connect with a corresponding large-diameter projection 12, it is preferable that the height HS of the small-diameter projections 23 be lower the closer the small-diameter projection 23 is to the base of the large-diameter projection 12. Furthermore, with respect to the vertical cross-section, in the plurality of small-diameter projections 23 that connect with the outside surface of a corresponding large-diameter projection 12, it is preferable that the width DS of the small-diameter projections 23 be greater the closer the small-diameter projection 23 is to the base of the large-diameter projection 12.

Such a configuration provides equivalent effects as the effects (1) to (4) of the first embodiment described above.

A third modified example, which is a modified example of the first embodiment, will now be described with reference to FIG. 7. In the third modified example, the shapes of the large-diameter projections and the small-diameter projections are different from those in the first embodiment. The following descriptions will focus on the differences from the first embodiment; elements that are the same as in the first embodiment will be given the same reference numerals, and descriptions thereof will be omitted.

Figure 7:
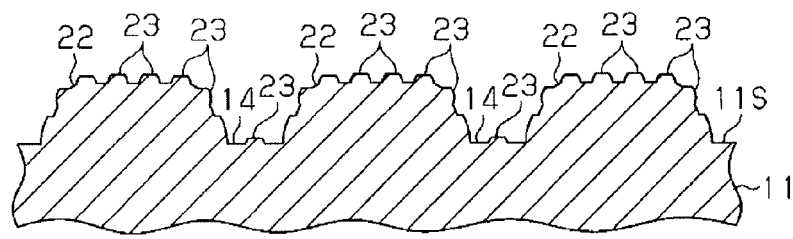
FIG. 7 is a cross-sectional view illustrating the cross-sectional structure of a substrate for semiconductor light emitting elements according to a third modified example of the technique of the present disclosure.

As illustrated in FIG. 7, the large-diameter projections 22 have a truncated cone shape, with the tip area thereof being formed flat such that no apex is present. Likewise, the small-diameter projections 23 have a truncated cone shape, with the tip area thereof being formed flat such that no apex is present.

The shapes of the projections 22 and 23 may be shapes obtained by cutting the apex from a hemisphere, or may be truncated circular cones or pyramid shapes. To rephrase, in the aforementioned vertical cross-section, the generating lines that form side surfaces of the projections 22 and 23 may be curved lines or straight lines. Meanwhile, the large-diameter projections 22 and the small-diameter projections 23 may have mutually different truncated cone shapes. Furthermore, the shapes of individual large-diameter projections 22 may be mutually different, and the shapes of individual small-diameter projections 23 may be mutually different.

According to this configuration as well, in the plurality of small-diameter projections 23 that connect with a corresponding large-diameter projection 22, it is preferable that the height HS of the small-diameter projections 23 be lower the closer the small-diameter projection 23 is to the base of the large-diameter projection 22. Furthermore, with respect to the vertical cross-section, in the plurality of small-diameter projections 23 that connect with the outside surface of a corresponding large-diameter projection 22, it is preferable that the width DS of the small-diameter projections 23 be greater the closer the small-diameter projection 23 is to the base of the large-diameter projection 22.

Such a configuration provides equivalent effects as the effects (1) to (4) of the first embodiment described above.

A fourth modified example, which is a modified example of the first embodiment, will now be described with reference to FIGS. 8 and 9. In the fourth modified example, the shape of the large-diameter projections is different from that in the first embodiment. The following descriptions will focus on the differences from the first embodiment; elements that are the same as in the first embodiment will be given the same reference numerals, and descriptions thereof will be omitted.

Figure 8:
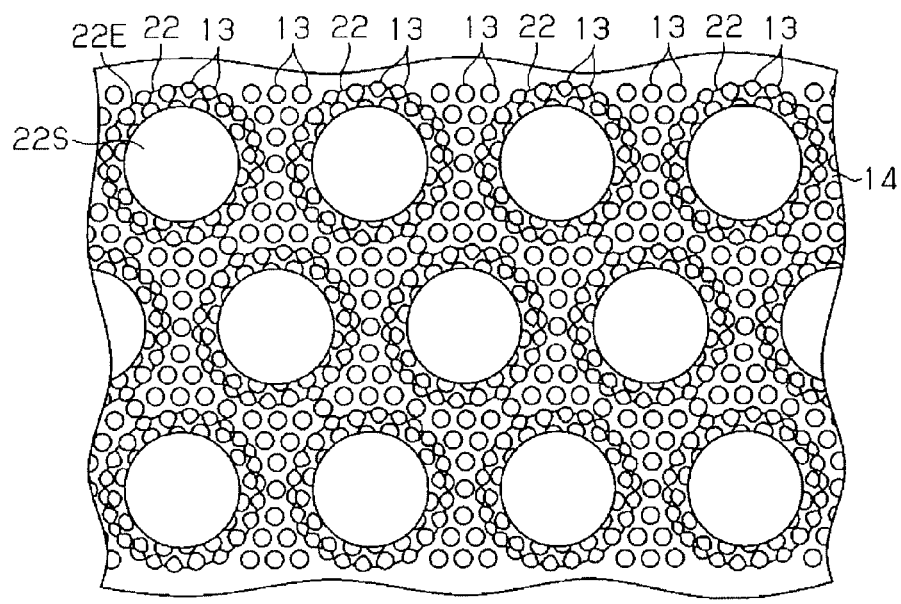
FIG. 8 is a cross-sectional view illustrating the planar structure of a substrate for semiconductor light emitting elements according to a fourth modified example of the technique of the present disclosure.

As illustrated in FIG. 8, the large-diameter projections 22 have a truncated cone shape, with the tip area thereof having a flat surface 22S. The shape of the large-diameter projections 22 may be a shape obtained by cutting the apex from a hemisphere, or may be a truncated circular cone or pyramid shape. To rephrase, in the aforementioned vertical cross-section, the generating line that forms a side surface of the large-diameter projections 22 may be a curved line or a straight line. Meanwhile, the large-diameter projections 22 may have mutually different shapes.

The flat surface 22S of the large-diameter projections 22 is a flat surface that extends along a single crystal plane. Assuming the crystal system of the element substrate 11 is a hexagonal crystal system, the flat surface 22S is a flat surface in which one plane selected from the group consisting of a C plane, an M plane, an A plane, and an R plane, for example, is continuous. Assuming the crystal system of the element substrate 11 is a cubic crystal system, the flat surface 22S is a flat surface in which one plane selected from the group consisting of a (001) plane, a (111) plane, and a (110) plane, for example, is continuous. Note that the crystal plane of the flat surface 22S may be a higher index plane than the stated index plane, and any single crystal plane suitable for providing the light emitting structure with crystalline properties may be employed.

The plurality of small-diameter projections 13 located on the outside surface of a corresponding large-diameter projection 22 are arranged along the circumferential direction of the large-diameter projection 22. In a base 22E of each large-diameter projection 22 that connects with the flat part 14, a first level of the small-diameter projections 13 is arranged along the circumferential direction of the large-diameter projections 22. Meanwhile, in a part of the outside surface of the large-diameter projection 22 that is closer to the tip of the large-diameter projection 22 than the first level of the small-diameter projections 13, a second level of the small-diameter projections 13 is again arranged along the circumferential direction of the large-diameter projection 22.

Figure 9:
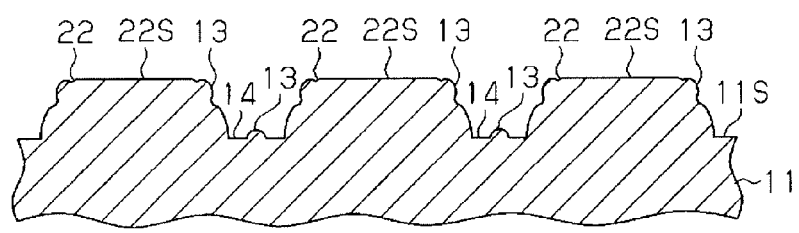
FIG. 9 is a cross-sectional view illustrating the cross-sectional structure of the substrate for semiconductor light emitting elements according to the fourth modified example of the technique of the present disclosure.

As illustrated in FIG. 9, the plurality of small-diameter projections 13 located on the outside surface of a corresponding large-diameter projection 22 project from the outside surface of the large-diameter projection 22 aside from where the flat surface 22S is located. Each of the plurality of small-diameter projections 13 has a conical shape, growing narrower toward the tip thereof as the projection progresses from the base that is connected to the outside surface of the corresponding large-diameter projection 22. Note that in the outside surface of the large-diameter projections 22, the plurality of small-diameter projections 13 may be constituted of only the first level of small-diameter projections 13, or may be constituted of three or more levels of small-diameter projections 13.

According to this configuration as well, in the plurality of small-diameter projections 13 that connect with a corresponding large-diameter projection 22, it is preferable that the height HS of the small-diameter projections 13 be lower the closer the small-diameter projection 13 is to the base of the large-diameter projection 22. Furthermore, with respect to the vertical cross-section, in the plurality of small-diameter projections 13 that connect with the outside surface of a corresponding large-diameter projection 22, it is preferable that the width DS of the small-diameter projections 13 be greater the closer the small-diameter projection 13 is to the base of the large-diameter projection 22.

Such a configuration provides equivalent effects as the effects (1) to (4) of the first embodiment described above. Furthermore, because the tip of each large-diameter projection 22 has the flat surface 22S, it is possible to ensure that the semiconductor layer has crystalline properties at the tip of the large-diameter projection 22.

A fifth modified example, which is a modified example of the first embodiment, will now be described with reference to FIGS. 10 and 11. In the second modified example, the shapes of the large-diameter projections and the small-diameter projections are different from those in the first embodiment. The following descriptions will focus on the differences from the first embodiment; elements that are the same as in the first embodiment will be given the same reference numerals, and descriptions thereof will be omitted.

Figure 10:
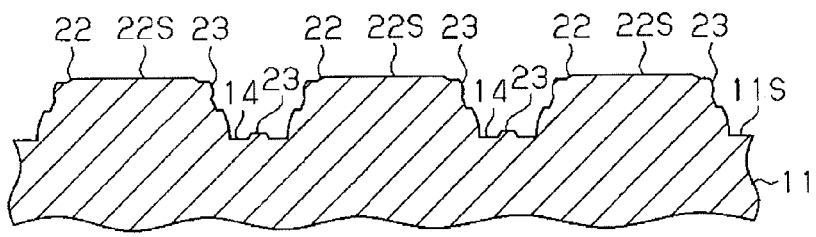
FIG. 10 is a cross-sectional view illustrating the cross-sectional structure of a substrate for semiconductor light emitting elements according to a fifth modified example of the technique of the present disclosure.

As illustrated in FIG. 10, the large-diameter projections 22 have a truncated cone shape, with the tip area thereof having a flat surface 22S. Likewise, the small-diameter projections 23 have a truncated cone shape, with the tip area thereof having flat surfaces.

The shapes of the large-diameter projections 22 and the small-diameter projections 23 may be shapes obtained by cutting the apex from a hemisphere, or may be truncated circular cones or pyramid shapes. To rephrase, in the aforementioned vertical cross-section, the generating lines that form side surfaces of the large-diameter projections 22 and the small-diameter projections 23 may be curved lines or straight lines. Meanwhile, the large-diameter projections 22 and the small-diameter projections 23 may have mutually different truncated cone shapes. Furthermore, the shapes of individual large-diameter projections 22 may be mutually different, and the shapes of individual small-diameter projections 23 may be mutually different.

According to this configuration as well, in the plurality of small-diameter projections 23 that connect with a corresponding large-diameter projection 22, it is preferable that the height HS of the small-diameter projections 23 be lower the closer the small-diameter projection 23 is to the base of the large-diameter projection 22. Furthermore, with respect to the vertical cross-section, in the plurality of small-diameter projections 13 that connect with the outside surface of a corresponding large-diameter projection 22, it is preferable that the width DS of the small-diameter projections 23 be greater the closer the small-diameter projection 23 is to the base of the large-diameter projection 22.

Figure 11:
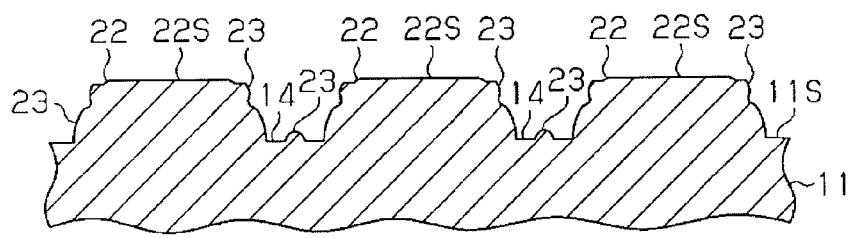
FIG. 11 is a cross-sectional view illustrating the cross-sectional structure of a substrate for semiconductor light emitting elements according to a fifth modified example of the technique of the present disclosure.

Note that as illustrated in FIG. 11, it is preferable that, of the small-diameter projections 23, the second level of the small-diameter projections 23 have a truncated cone shape with the tip area thereof having a flat surface, and that, of the small-diameter projections 23, the small-diameter projections 23 projecting from the flat part 14 and the first level of small-diameter projections 23 have a conical shape, so as to make it easier to set the conditions for forming the small-diameter projections 23.

Such a configuration provides equivalent effects as the effects (1) to (4) of the first embodiment described above. Furthermore, because the tip of each large-diameter projection 22 has the flat surface 22S, it is possible to ensure that the semiconductor layer has crystalline properties at the tip of the large-diameter projection 22. In addition, because the tip of each small-diameter projection 23 has the flat surface, it is possible to ensure that the semiconductor layer has crystalline properties at the tip of the small-diameter projection 23 as well.

A sixth modified example, which is a modified example of the first embodiment, will now be described with reference to FIG. 12. The sixth modified example differs from the first embodiment in that the light emitting structure formation surface 11S includes bridge portions. The following descriptions will focus on the differences from the first embodiment; elements that are the same as in the first embodiment will be given the same reference numerals, and descriptions thereof will be omitted.

Figure 12:
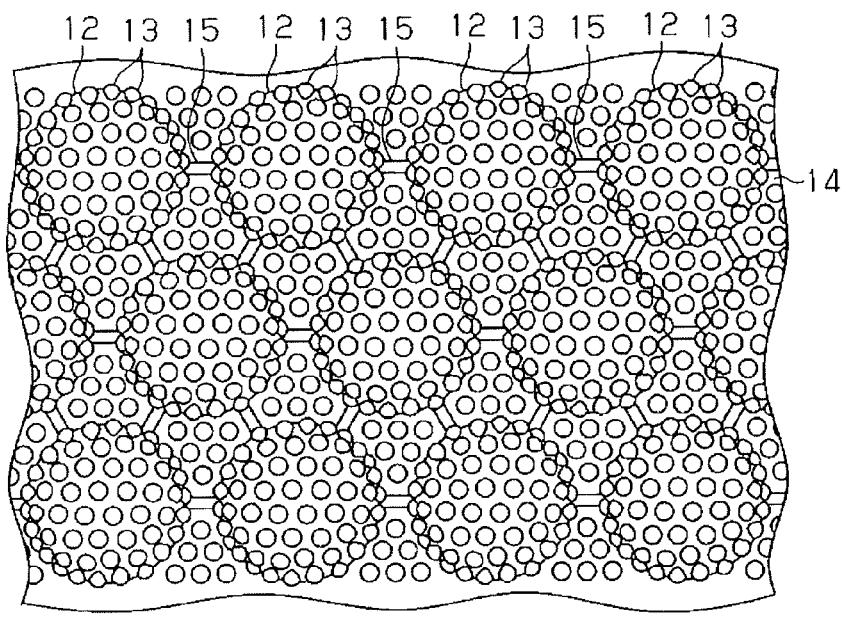
FIG. 12 is a plan view illustrating the planar structure of a substrate for semiconductor light emitting elements according to a sixth modified example of the technique of the present disclosure.

As illustrated in FIG. 12, a plurality of bridge portions 15 are included in the recessing and protruding structure of the light emitting structure formation surface 11S, in addition to the large-diameter projections 12, the small-diameter projections 13, and the flat part 14.

Each of the plurality of bridge portions 15 projects from the flat part 14 and forms a link between mutually-adjacent large-diameter projections 12. The bridge portions 15 have a ridge shape that connects the respective centers of the conical-shaped large-diameter projections 12, and the bridge portions 15 are lower in height than the large-diameter projections 12. Note that the bridge portions 15 are not limited to a straight line shape, and the bridge portions 15 may have a curved line shape, a bent line shape, or the like. Meanwhile, the bridge portions 15 may have mutually different shapes.

Such a configuration provides equivalent effects as the effects (1) to (4) of the first embodiment described above. By forming the bridge portions 15, the direction in which light produced in the light emitting structure changes, due to reflection and the like, at the positions where the bridge portions 15 are located as well, which further increases the light extraction efficiency. Furthermore, forming the bridge portions 15 makes the recessing and protruding structure of the light emitting structure formation surface 11S more complex, which improves the effect of suppressing crystal defects in the same manner as when the outer shape of the projections formed by the large-diameter projections 12 and the small-diameter projections 13 has a concavo-convex shape.

Note that the first embodiment and the first to sixth modifications may be combined. For example, the bridge portions 15 of the sixth modified example may be provided on the substrate for semiconductor light emitting elements according to the first to fifth modifications. Furthermore, for example, projections constituted by the large-diameter projections 12 and the small-diameter projections 13 according to the first embodiment and projections constituted by the large-diameter projections and the small-diameter projections according to the first to fifth modifications may be intermixed on a single substrate for semiconductor light emitting elements.

Figure 13:
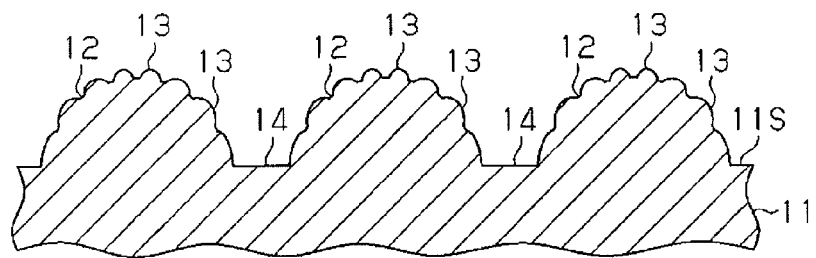
FIG. 13 is a cross-sectional view illustrating the cross-sectional structure of the substrate for semiconductor light emitting elements according to the sixth modified example of the technique of the present disclosure.
Figure 14:
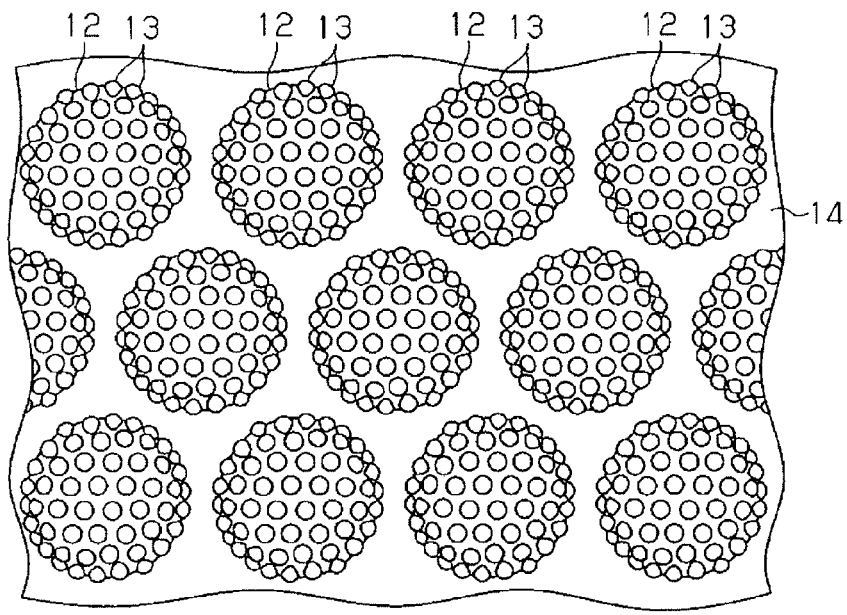
FIG. 14 is a plan view illustrating the planar structure of a substrate for semiconductor light emitting elements according to a second embodiment.

Referring to FIGS. 13 and 14, an embodiment of a substrate for semiconductor light emitting elements will be described as a second embodiment of the technique of the present disclosure. In the second embodiment, the arrangement of the small-diameter projections is different from that in the first embodiment. The following descriptions will focus on the difference from the first embodiment; elements that are the same as in the first embodiment will be given the same reference numerals, and descriptions thereof will be omitted.

[Configuration of Substrate for Semiconductor Light Emitting Elements]

As illustrated in FIG. 13, all of the small-diameter projections 13 of the element substrate 11 project from the large-diameter projections 12, and no small-diameter projections 13 project from the flat part 14.

Conditions regarding the shape, arrangement, and the like of the large-diameter projections 12 are the same as those regarding the shape, arrangement, and the like of the large-diameter projections 12 in the first embodiment. Likewise, conditions regarding the shape, arrangement, and the like of the small-diameter projections 13 are the same as those regarding the shape, arrangement, and the like of the small-diameter projections 13 that connect with the large-diameter projections 12 in the first embodiment.

In other words, according to the second embodiment as well, in the plurality of small-diameter projections 13 that connect with a corresponding large-diameter projection 12, it is preferable that the height HS of the small-diameter projections 13 be lower the closer the small-diameter projection 13 is to the base of the large-diameter projection 12. Furthermore, with respect to the aforementioned vertical cross-section, in the plurality of small-diameter projections 13 that connect with the outside surface of a corresponding large-diameter projection 12, it is preferable that the width DS of the small-diameter projections 13 be greater the closer the small-diameter projection 13 is to the base of the large-diameter projection 12.

As illustrated in FIG. 14, when the light emitting structure formation surface 11S is viewed in plan view, the small-diameter projections 13 are not formed in the flat part 14. The small-diameter projections 13 project from the outer circumferential edge of the large-diameter projections 12, and the shape of the projections constituted by the large-diameter projections 12 and the small-diameter projections 13 that connect with those large-diameter projections 12 is a concavo-convex rippled shape.

According to the second embodiment, the small-diameter projections 13 are not formed in the flat part 14, and thus the flat part of the light emitting structure formation surface 11S has a greater surface area. As described above, when a semiconductor layer including a buffer layer and undoped GaN is formed through crystal growth on the light emitting structure formation surface 11S, the crystal growth begins at a part of the light emitting structure formation surface 11S that is flat and progresses therefrom. With respect to this point, the flat part of the light emitting structure formation surface 11S is greater in the second embodiment than in the first embodiment, and thus it is easier to form the semiconductor layer including the buffer layer and undoped GaN.

According to the second embodiment as described thus far, the following effects are achieved in addition to the effects (1), (3), and (4) achieved by the first embodiment.

(5) the small-diameter projections 13 are not formed in the flat part 14, and thus the flat part of the light emitting structure formation surface 11S has a greater surface area, making it easier to form the semiconductor layer including the buffer layer and undoped GaN.

A seventh modified example, which is a modified example of the second embodiment, will now be described with reference to FIG. 15. In the fifth modified example, the shape of the large-diameter projections is different from that in the second embodiment. The following descriptions will focus on the differences from the second embodiment; elements that are the same as in the second embodiment will be given the same reference numerals, and descriptions thereof will be omitted.

Figure 15:
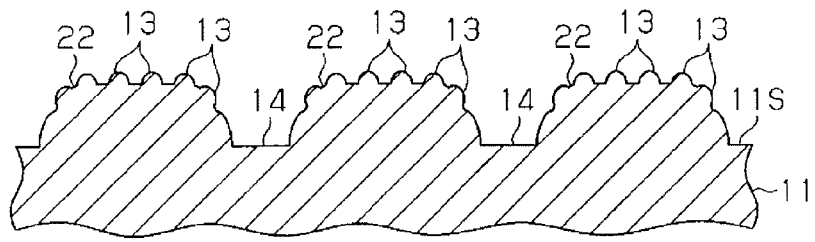
FIG. 15 is a cross-sectional view illustrating the cross-sectional structure of a substrate for semiconductor light emitting elements according to a seventh modified example of the technique of the present disclosure.

As illustrated in FIG. 15, the large-diameter projections 22 have a truncated cone shape, with the tip area thereof being formed flat such that no apex is present. The shape of the large-diameter projections 22 may be a shape obtained by cutting the apex from a hemisphere, or may be a truncated circular cone or pyramid shape. To rephrase, in the aforementioned vertical cross-section, the generating line that forms a side surface of the large-diameter projections 22 may be a curved line or a straight line. Meanwhile, the large-diameter projections 22 may have mutually different shapes.

According to this configuration as well, in the plurality of small-diameter projections 13 that connect with a corresponding large-diameter projection 22, it is preferable that the height HS of the small-diameter projections 13 be lower the closer the small-diameter projection 13 is to the base of the large-diameter projection 22. Furthermore, with respect to the vertical cross-section, in the plurality of small-diameter projections 13 that connect with the outside surface of a corresponding large-diameter projection 22, it is preferable that the width DS of the small-diameter projections 13 be greater the closer the small-diameter projection 13 is to the base of the large-diameter projection 22.

In other words, the seventh modified example has a configuration obtained by not forming the small-diameter projections 13 in the flat part 14 according to the first modified example.

Such a configuration provides an equivalent effect as the affect (5) according to the second embodiment, in addition to the effects (1), (3), and (4) according to the first embodiment.

An eighth modified example, which is a modified example of the second embodiment, will now be described with reference to FIG. 16. In the eighth modified example, the shape of the small-diameter projections is different from that in the second embodiment. The following descriptions will focus on the differences from the second embodiment; elements that are the same as in the second embodiment will be given the same reference numerals, and descriptions thereof will be omitted.

Figure 16:
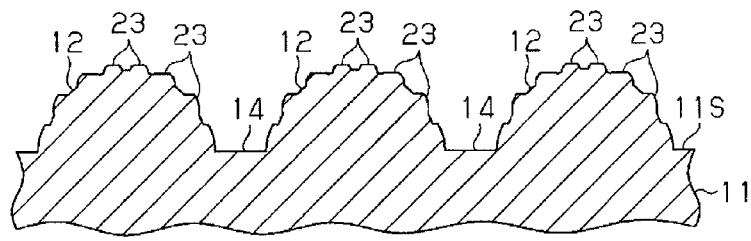
FIG. 16 is a cross-sectional view illustrating the cross-sectional structure of a substrate for semiconductor light emitting elements according to an eighth modified example of the technique of the present disclosure.

As illustrated in FIG. 16, small-diameter projections 23 have a truncated cone shape, with the tip area thereof being formed flat such that no apex is present. The shape of the small-diameter projections 23 may be a shape obtained by cutting the apex from a hemisphere, or may be a truncated circular cone or pyramid shape. To rephrase, in the aforementioned vertical cross-section, the generating line that forms a side surface of the small-diameter projections 23 may be a curved line or a straight line. Meanwhile, the small-diameter projections 23 may have mutually different shapes.

According to this configuration as well, in the plurality of small-diameter projections 23 that connect with a corresponding large-diameter projection 12, it is preferable that the height HS of the small-diameter projections 23 be lower the closer the small-diameter projection 23 is to the base of the large-diameter projection 12. Furthermore, with respect to the vertical cross-section, in the plurality of small-diameter projections 13 that connect with the outside surface of a corresponding large-diameter projection 12, it is preferable that the width DS of the small-diameter projections 23 be greater the closer the small-diameter projection 23 is to the base of the large-diameter projection 12.

In other words, the sixth modified example has a configuration obtained by not forming the small-diameter projections 23 in the flat part 14 according to the second modified example.

Such a configuration provides an equivalent effect as the effect (5) according to the second embodiment, in addition to the effects (1), (3), and (4) of the first embodiment.

A ninth modified example, which is a modified example of the second embodiment, will now be described with reference to FIG. 17. In the ninth modified example, the shapes of the large-diameter projections and the small-diameter projections are different from those in the second embodiment. The following descriptions will focus on the differences from the second embodiment; elements that are the same as in the second embodiment will be given the same reference numerals, and descriptions thereof will be omitted.

Figure 17:
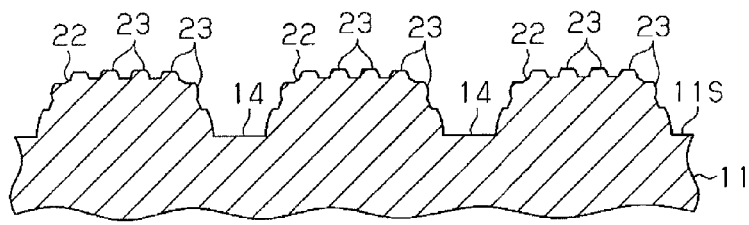
FIG. 17 is a cross-sectional view illustrating the cross-sectional structure of a substrate for semiconductor light emitting elements according to a ninth modified example of the technique of the present disclosure.

As illustrated in FIG. 17, large-diameter projections 22 have a truncated cone shape, with the tip area thereof being formed flat such that no apex is present. Likewise, the small-diameter projections 23 have a truncated cone shape, with the tip area thereof being formed flat such that no apex is present.

The shapes of the large-diameter projections 22 and the small-diameter projections 23 may be shapes obtained by cutting the apex from a hemisphere, or may be truncated circular cones or pyramid shapes. To rephrase, in the aforementioned vertical cross-section, the generating lines that form side surfaces of the large-diameter projections 22 and the small-diameter projections 23 may be curved lines or straight lines. Meanwhile, the large-diameter projections 22 and the small-diameter projections 23 may have mutually different truncated cone shapes. Furthermore, the shapes of individual large-diameter projections 22 may be mutually different, and the shapes of individual small-diameter projections 23 may be mutually different.

According to this configuration as well, in the plurality of small-diameter projections 23 that connect with a corresponding large-diameter projection 22, it is preferable that the height HS of the small-diameter projections 23 be lower the closer the small-diameter projection 23 is to the base of the large-diameter projection 22. Furthermore, with respect to the vertical cross-section, in the plurality of small-diameter projections 13 that connect with the outside surface of a corresponding large-diameter projection 22, it is preferable that the width DS of the small-diameter projections 23 be greater the closer the small-diameter projection 23 is to the base of the large-diameter projection 22.

In other words, the ninth modified example has a configuration obtained by not forming the small-diameter projections 23 in the flat part 14 according to the ninth modified example.

Such a configuration provides an equivalent effect as the effect (5) according to the second embodiment, in addition to the effects (1), (3), and (4) of the first embodiment.

A tenth modified example, which is a modified example of the second embodiment, will now be described with reference to FIGS. 18 and 19. In the tenth modified example, the shape of the large-diameter projections is different from that in the second embodiment. The following descriptions will focus on the differences from the second embodiment; elements that are the same as in the second embodiment will be given the same reference numerals, and descriptions thereof will be omitted.

Figure 18:
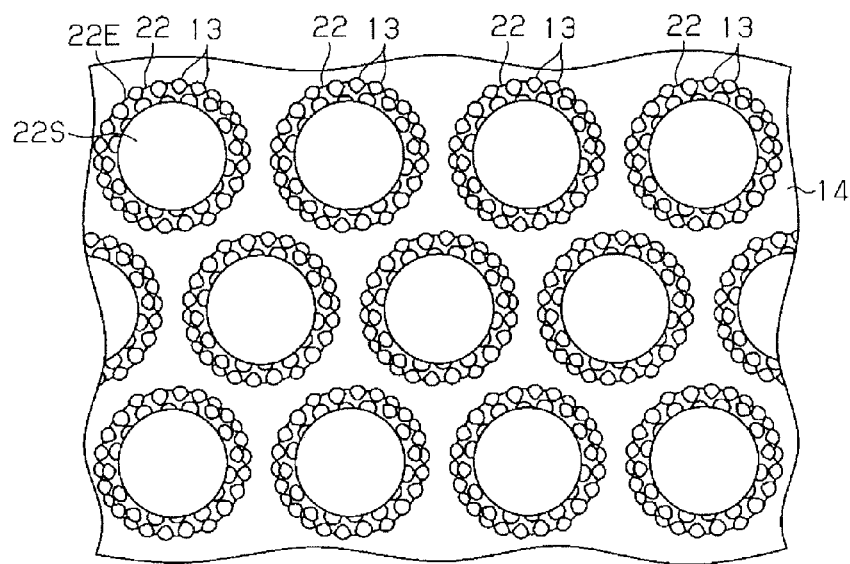
FIG. 18 is a plan view illustrating the planar structure of a substrate for semiconductor light emitting elements according to a tenth modified example of the technique of the present disclosure.

As illustrated in FIG. 18, the large-diameter projections 22 have a truncated cone shape, with the tip area thereof having the flat surface 22S. The shape of the large-diameter projections 22 may be a shape obtained by cutting the apex from a hemisphere, or may be a truncated circular cone or pyramid shape. To rephrase, in the aforementioned vertical cross-section, the generating line that forms a side surface of the large-diameter projections 22 may be a curved line or a straight line. Meanwhile, the large-diameter projections 22 may have mutually different shapes.

The flat surface 22S of the large-diameter projections 22 is a flat surface that extends along a single crystal plane. Assuming the crystal system of the element substrate 11 is a hexagonal crystal system, the flat surface 22S is a flat surface in which one plane selected from the group consisting of a C plane, an M plane, an A plane, and an R plane, for example, is continuous. Assuming the crystal system of the element substrate 11 is a cubic crystal system, the flat surface 22S is a flat surface in which one plane selected from the group consisting of a (001) plane, a (111) plane, and a (110) plane, for example, is continuous. Note that the crystal plane of the flat surface 22S may be a higher index plane than the stated index plane, and any single crystal plane suitable for providing the light emitting structure with crystalline properties may be employed.

The plurality of small-diameter projections 13 located on the outside surface of a corresponding large-diameter projection 22 are arranged along the circumferential direction of the large-diameter projection 22. In a base 22E of each large-diameter projection 22 that connects with the flat part 14, a first level of the small-diameter projections 13 is arranged along the circumferential direction of the large-diameter projections 22. Meanwhile, in a part of the outside surface of the large-diameter projection 22 that is closer to the tip of the large-diameter projection 22 than the first level of the small-diameter projections 13, a second level of the small-diameter projections 13 is again arranged along the circumferential direction of the large-diameter projections 22.

Figure 19:
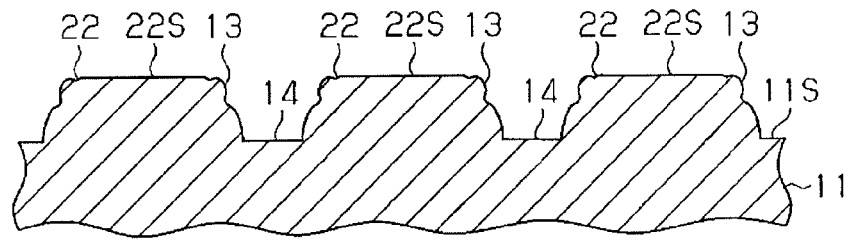
FIG. 19 is a cross-sectional view illustrating the cross-sectional structure of the substrate for semiconductor light emitting elements according to the tenth modified example of the technique of the present disclosure.

As illustrated in FIG. 19, the plurality of small-diameter projections 13 located on the outside surface of the large-diameter projections 22 project from the outside surface of the large-diameter projections 22 aside from where the flat surface 22S is located. Each of the plurality of small-diameter projections 13 has a conical shape, growing narrower toward the tip thereof as the projection progresses from the base that is connected to the outside surface of the corresponding large-diameter projection 22. Note that in the outside surface of the large-diameter projections 22, the plurality of small-diameter projections 13 may be constituted of only the first level of small-diameter projections 13, or may be constituted of three or more levels of small-diameter projections 13.

According to this configuration as well, in the plurality of small-diameter projections 13 that connect with a corresponding large-diameter projection 22, it is preferable that the height HS of the small-diameter projections 13 be lower the closer the small-diameter projection 13 is to the base of the large-diameter projection 22. Furthermore, with respect to the vertical cross-section, in the plurality of small-diameter projections 13 that connect with the outside surface of a corresponding large-diameter projection 22, it is preferable that the width DS of the small-diameter projections 13 be greater the closer the small-diameter projection 13 is to the base of the large-diameter projection 22.

In other words, the tenth modified example has a configuration obtained by not forming the small-diameter projections 13 in the flat part 14 according to the fourth modified example.

Such a configuration provides an equivalent effect as the effect (5) of the second embodiment described above. Furthermore, the flat surface 22S has the same function as the function of the flat part 14 with respect to the crystal growth of the semiconductor layer. As such, the same crystalline properties as the crystalline properties required by the semiconductor layer upon the flat part 14 can be provided in the semiconductor layer upon the tip of the large-diameter projections 22.

An eleventh modified example, which is a modified example of the second embodiment, will now be described with reference to FIGS. 20 and 21. In the eleventh modified example, the shapes of the large-diameter projections and the small-diameter projections are different from those in the second embodiment. The following descriptions will focus on the differences from the second embodiment; elements that are the same as in the second embodiment will be given the same reference numerals, and descriptions thereof will be omitted.

Figure 20:
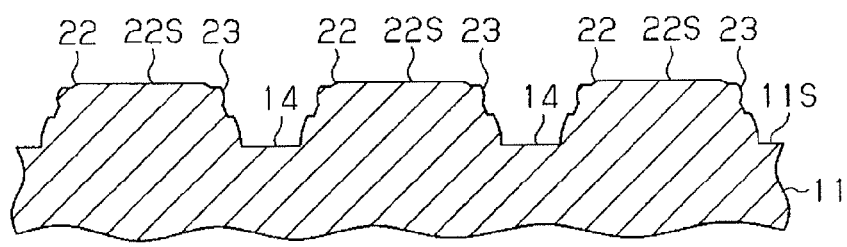
FIG. 20 is a cross-sectional view illustrating the cross-sectional structure of a substrate for semiconductor light emitting elements according to an eleventh modified example of the technique of the present disclosure.

As illustrated in FIG. 20, the large-diameter projections 22 have a truncated cone shape, with the tip area thereof having the flat surface 22S. Likewise, the small-diameter projections 23 have a truncated cone shape, with the tip area thereof having flat surfaces.

The shapes of the large-diameter projections 22 and the small-diameter projections 23 may be shapes obtained by cutting the apex from a hemisphere, or may be truncated circular cones or pyramid shapes. To rephrase, in the afore-mentioned vertical cross-section, the generating lines that form side surfaces of the large-diameter projections 22 and the small-diameter projections 23 may be curved lines or straight lines. Meanwhile, the large-diameter projections 22 and the small-diameter projections 23 may have mutually different truncated cone shapes. Furthermore, the shapes of individual large-diameter projections 22 may be mutually different, and the shapes of individual small-diameter projections 23 may be mutually different.

According to this configuration as well, in the plurality of small-diameter projections 13 that connect with a corresponding large-diameter projection 22, it is preferable that the height HS of the small-diameter projections 23 be lower the closer the small-diameter projection 13 is to the base of the large-diameter projection 22. Furthermore, with respect to the vertical cross-section, in the plurality of small-diameter projections 13 that connect with the outside surface of a corresponding large-diameter projection 22, it is preferable that the width DS of the small-diameter projections 23 be greater the closer the small-diameter projection 13 is to the base of the large-diameter projection 22.

Figure 21:
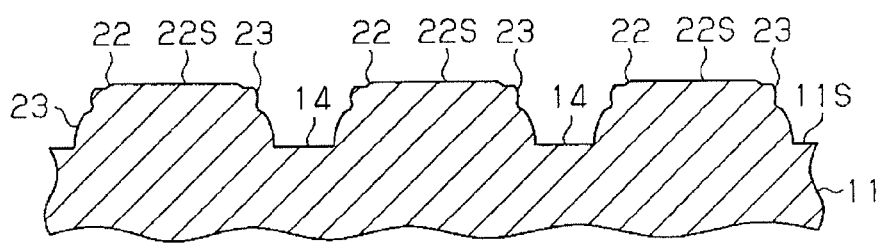
FIG. 21 is a cross-sectional view illustrating the cross-sectional structure of the substrate for semiconductor light emitting elements according to the eleventh modified example of the technique of the present disclosure.

Note that as illustrated in FIG. 21, it is preferable that, of the small-diameter projections 23, the second level of the small-diameter projections 23 have a truncated cone shape with the tip area thereof having a flat surface, and that, of the small-diameter projections, the small-diameter projections 23 projecting from the flat part 14 and the first level of small-diameter projections 23 have a conical shape, so as to make it easier to set the conditions for forming the small-diameter projections 23.

In other words, the eleventh modified example has a configuration obtained by not forming the small-diameter projections 23 in the flat part 14 according to the fifth modified example.

Such a configuration provides an equivalent effect as the effect (5) of the second embodiment described above. Furthermore, the flat surface 22S and the tips of the small-diameter projections 23 have the same function as the function of the flat part 14 with respect to the crystal growth of the semiconductor layer. As such, the same crystalline properties as the crystalline properties required by the semiconductor layer upon the flat part 14 can be provided in the semiconductor layer upon the tip of the large-diameter projections 22 and in the semiconductor layer upon the tip of the small-diameter projections 23.

A twelfth modified example, which is a modified example of the second embodiment, will now be described with reference to FIGS. 22 and 23. The twelfth modified example differs from the second embodiment in that the light emitting structure formation surface 11S includes bridge portions. The following descriptions will focus on the differences from the second embodiment; elements that are the same as in the second embodiment will be given the same reference numerals, and descriptions thereof will be omitted.

Figure 22:
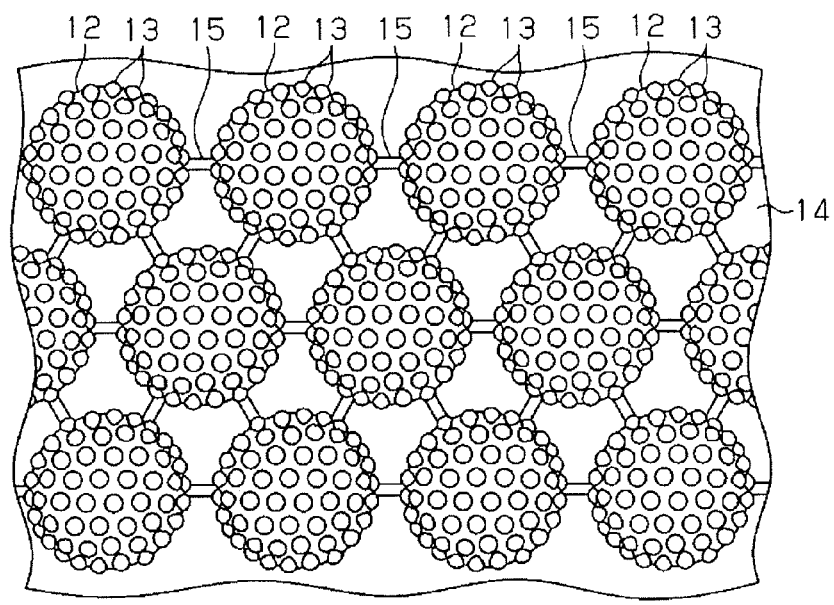
FIG. 22 is a plan view illustrating the planar structure of a substrate for semiconductor light emitting elements according to a twelfth modified example of the technique of the present disclosure.

As illustrated in FIG. 22, a plurality of bridge portions 15 are included in the recessing and protruding structure of the light emitting structure formation surface 11S, in addition to the large-diameter projections 12, the small-diameter projections 13, and the flat part 14.

Each of the plurality of bridge portions 15 projects from the flat part 14 and forms a link between mutually-adjacent large-diameter projections 12. The bridge portions 15 have a ridge shape that connects the respective centers of the conical-shaped large-diameter projections 12, and the bridge portions 15 are lower in height than the large-diameter projections 12. Note that the bridge portions 15 are not limited to a straight line shape, and the bridge portions 15 may have a curved line shape, a bent line shape, or the like. Meanwhile, the bridge portions 15 may have mutually different shapes.

Figure 23:
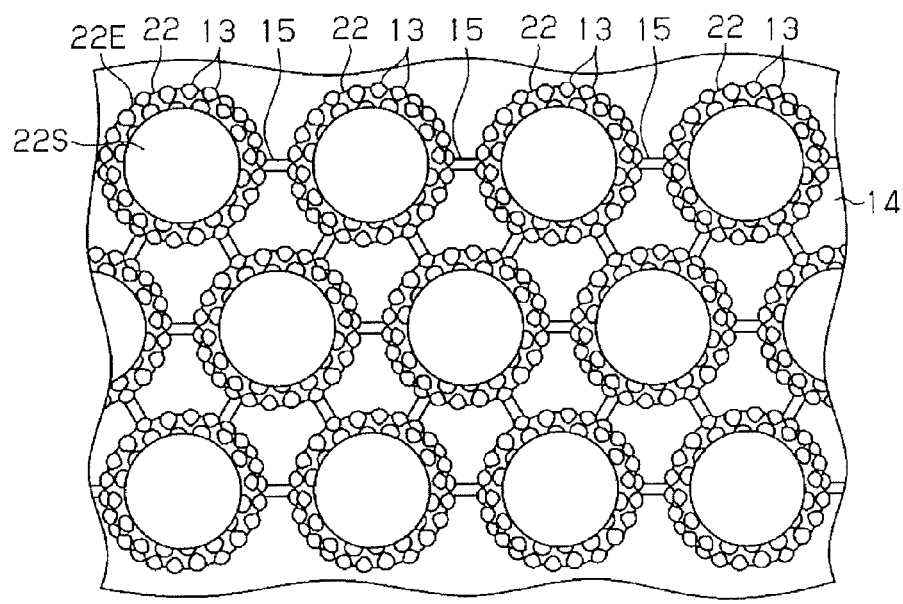
FIG. 23 is a plan view illustrating the planar structure of the substrate for semiconductor light emitting elements according to the twelfth modified example of the technique of the present disclosure.

Meanwhile, as illustrated in FIG. 23, the above-described plurality of bridge portions 15 may be included in the recessing and protruding structure of the light emitting structure formation surface 11S, in addition to the large-diameter projections 22 that have a truncated cone shape, the small-diameter projections 23 that have a conical shape, and the flat part 14. The bridge portions 15 have a ridge shape that connects the respective centers of the truncated cone-shaped large-diameter projections 22, and the bridge portions 15 are lower in height than the large-diameter projections 22. A configuration that includes the large-diameter projections 22 having a truncated cone shape and the bridge portions 15 is preferable from the standpoint of making it easy to set the conditions for forming flat surfaces on the tips of the large-diameter projections 22.

In other words, the twelfth modified example has a configuration obtained by not forming the small-diameter projections 23 in the flat part 14 according to the sixth modified example.

Such a configuration provides an equivalent effect as the effect (5) according to the second embodiment, in addition to the effects (1), (3), and (4) of the first embodiment. By forming the bridge portions 15, the direction in which light produced in the light emitting structure changes, due to reflection and the like, at the positions where the bridge portions 15 are located as well, which further increases the light extraction efficiency. Furthermore, forming the bridge portions 15 makes the recessing and protruding structure of the light emitting structure formation surface 11S more complex, which improves the effect of suppressing crystal defects in the same manner as when the outer shape of the projections formed by the large-diameter projections 12 and the small-diameter projections 13 has a concavo-convex shape.

Note that the second embodiment and the seventh to twelfth modifications may be combined. For example, the bridge portions 15 of the twelfth modified example may be provided on the substrate for semiconductor light emitting elements according to the seventh to eleventh modifications. Furthermore, for example, projections constituted by the large-diameter projections 12 and the small-diameter projections 13 according to the second embodiment and projections constituted by the large-diameter projections and the small-diameter projections according to the seventh to eleventh modifications may be intermixed on a single substrate for semiconductor light emitting elements.

Referring to FIGS. 24 to 30, an embodiment of a method for manufacturing a substrate for semiconductor light emitting elements will be described as a third embodiment of the technique of the present disclosure.

The method for manufacturing a substrate for semiconductor light emitting elements includes a large-diameter particle step and a small-diameter particle step of etching a substrate using two types of particles having mutually-different sizes.

The large-diameter particle step includes a large-diameter particle film forming step, and a large-diameter particle etching step serving as an example of a first step; the small-diameter particle step includes a small-diameter particle film forming step, and a small-diameter particle etching step serving as an example of a second step.

In the large-diameter particle film forming step, a single-particle film constituted of large-diameter particles is formed on the light emitting structure formation surface 11S, and in the large-diameter particle etching step, the light emitting structure formation surface 11S is etched using that single-particle film as a mask. In the small-diameter particle film forming step, a single-particle film constituted of small-diameter particles is formed on the light emitting structure formation surface 11S etched in the large-diameter particle etching step, and in the small-diameter particle etching step, the light emitting structure formation surface 11S is etched again using that single-particle film as a mask. The steps of the method for manufacturing a substrate for semiconductor light emitting elements will be described below in the order of the processes carried out.

Large-diameter particles SL that constitute the single-particle film used in the large-diameter particle step are one or more types of particles selected from the group constituted of organic particles, organic-inorganic composite particles, or inorganic particles. The material of which the organic particles are formed is one type selected from the group consisting of, for example, a thermoplastic resin such as polystyrene or PMMA, a thermosetting resin such as phenol resin or epoxy resin, diamond, graphite, and a fullerene. The material of which the organic-inorganic composite particles are formed is one type selected from the group consisting of, for example, SiC and boron carbide.

Preferably, the large-diameter particles SL are inorganic particles. Assuming the large-diameter particles SL are inorganic particles, it is easier, in a step in which the single-particle film constituted of the large-diameter particles SL is selectively etched, to achieve a selection ratio for the etching between the single-particle film and the light emitting structure formation surface 11S. The material of which the inorganic particles are formed is one type selected from the group consisting of, for example, an inorganic oxide, an inorganic nitride, an inorganic boride, an inorganic sulfide, an inorganic selenium compound, a metal compound, and a metal.

The inorganic oxide is one type selected from the group consisting of, for example, silica, alumina, zirconia, titania, ceria, zinc oxide, tin oxide, and yttrium aluminum garnet (YAG). The inorganic nitride is one type selected from the group consisting of, for example, silicon nitride, aluminum nitride, and boron nitride. The inorganic boride is one type selected from the group consisting of, for example, $ZrB_2$ and $CrB_2$. The inorganic sulfide is one type selected from the group consisting of, for example, zinc sulfide, calcium sulfide, cadmium sulfide, and strontium sulfide. The inorganic selenium compound is one type selected from the group consisting of, for example, zinc selenide and cadmium selenide. The metal particles are one type of particle selected from the group consisting of, for example, Si, Ni, W, Ta, Cr, Ti, Mg, Ca, Al, Au, Ag, and Zn.

In the material of which the large-diameter particles SL are formed, the constituent element may be partially replaced with a different constituent element. For example, the material of which the large-diameter particles SL may be a sialon constituted by silicon, aluminum, oxygen, and nitrogen. The large-diameter particles SL may also be a blend of two or more types of particles constituted of mutually-different materials. The large-diameter particles SL may be a multilayer body constituted of mutually-different materials, with, for example, inorganic particles constituted of an inorganic nitride covered with an inorganic oxide. The large-diameter particles SL may be phosphor particles obtained by introducing an activator such as cerium or europium into the inorganic particles. Of the above-described materials, it is preferable that the material of which the large-diameter particles SL are formed be an inorganic oxide, and of such inorganic oxides, further preferable that the material be silica, so as to ensure a stable shape for the large-diameter particles SL.

In order to form the large-diameter projections 12 at the sizes indicated in the above-described embodiments and modifications, it is preferable that the particle diameter of the large-diameter particles SL be no less than 300 nm and no greater than 5 μm.

One of the following three methods is used in the large-diameter particle film forming step.

the Langmuir-Blodgett technique (LB technique)
a particle adsorption technique
a binder layer fixing method In the LB technique, a dispersion in which particles are dispersed in a solvent having a lower specific gravity than water is used, and the dispersion is first dripped onto the surface of water. The solvent is then evaporated from the dispersion, forming a single-particle film constituted of the particles on the water surface. The single-particle film formed on the water surface is then transferred to the light emitting structure formation surface 11S, thus forming the single-particle film on the light emitting structure formation surface 11S.

In the particle adsorption technique, first, the element substrate 11 is immersed in a colloid particle suspension. Next, second and subsequent layers of particles are removed so that only a first particle layer electrostatically joined to the light emitting structure formation surface 11S remains. The single-particle film is formed on the light emitting structure formation surface 11S as a result.

In the binder layer fixing method, first, a binder layer is formed on the light emitting structure formation surface 11S, and then a particle dispersion is applied to the top of the binder layer. Next, the binder layer is thermally softened, causing only a first particle layer to be embedded in the binder layer; the particles of the second and subsequent layers are washed away. The single-particle film is formed on the light emitting structure formation surface 11S as a result.

A method in which a filling degree D (%), which is indicated by the following Formula (1), is no greater than 15% is preferable as the film forming method used in the large-diameter particle film forming step. The LB technique is preferable from many standpoints, including the precision of forming the single layer, the simplicity of operations required to form the film, the surface area expandability of the large-diameter particle film, the ability to reproduce the characteristics of the large-diameter particle film, and the like.

$$\text{Filling degree } D[\%]=|B-A|\times 100/A \quad (1)$$

In Formula (1), A represents an average particle diameter of the particles, B represents a modal value of the pitch between mutually-adjacent particles, and |B−A| represents the absolute value of the difference between A and B.

The filling degree D is an indicator of how closely packed the particles are in the single-particle film. The lower the filling degree D is, the more closely packed the particles are, with the arrangement of the particles in the single-particle film, whose intervals have been adjusted, being more precise. To increase the density of the particles in the single-particle film, the filling degree D is preferably no greater than 10%, and further preferably no less than 1.0% and no greater than 3.0%.

The average particle diameter A of the particles is an average primary particle diameter of the particles that constitute the single-particle film. The average primary particle diameter of the particles is found from a particle distribution peak. The particle distribution is obtained from a particle distribution approximation found through particle dynamic light scattering. Note that to ensure a filling degree D of no greater than 15%, a coefficient of variation of the particle diameter of the particles (a value obtained by dividing a standard deviation by an average value) is preferably no greater than 20%, further preferably no greater than 10%, and still further preferably no greater than 5%.

The modal value of the pitch between particles is a modal value of a distance between the apexes of two mutually-adjacent particles. Note that when the particles are spherical and make contact with each other with no interval therebetween, the distance between the apexes of the mutually-adjacent particles is a distance between the centers of the mutually-adjacent particles. Note also that the modal value of the pitch between particles is obtained on the basis of an atomic force microscope image of the single-particle film, in the same manner as the pitch PL of the large-diameter projections 12.

Next, a method using the LB technique will be described as an example of a method for forming the single-particle film.

First, a water tank, filled with water, and a dispersion are prepared. In the dispersion, the large-diameter particles SL are dispersed throughout a solvent having a lower specific gravity than that of water. The surfaces of the large-diameter particles SL are preferably hydrophobic, and the solvent in the dispersion medium is also preferably hydrophobic. Assuming the large-diameter particles SL and the solvent are hydrophobic, self-assembly of the large-diameter particles SL will occur on the water surface, making it easier to form a single-particle film that is closely packed two-dimensionally. The solvent in the dispersion medium is preferably highly volatile. One or more types of a volatile organic solvent selected from the group consisting of chloroform, methanol, ethanol, isopropanol, acetone, methyl ethyl ketone, ethyl ethyl ketone, toluene, hexane, cyclohexane, ethyl acetate, and butyl acetate is used as a solvent that is both highly volatile and hydrophobic.

When the large-diameter particles SL are inorganic particles, the surfaces of the large-diameter particles SL are normally hydrophilic. As such, when the large-diameter particles SL are inorganic particles, the surfaces of the large-diameter particles SL are preferably hydrophobized using a hydrophobizing agent. A surface reactant, a metal alkoxysilane, or the like, for example, is employed as the hydrophobizing agent used to hydrophobize the large-diameter particles SL.

Preferably, the dispersion is microfiltered using a membrane filter or the like so as to remove agglomerates contained in the dispersion, or in other words, secondary particles that are collections of a plurality of primary particles. Microfiltering the dispersion makes it difficult for areas where two or more layers of particles overlap, areas where no particles are present, and the like to arise, and makes it easier to obtain a high-precision single-particle film.

Figure 24:
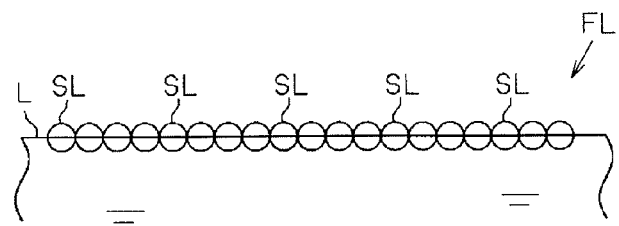
FIG. 24 is a diagram schematically illustrating a step in a method for manufacturing a substrate for semiconductor light emitting elements according to a third embodiment of the technique of the present disclosure, and is a schematic view illustrating a state of a single-particle film before the single-particle film is transferred to a light emitting structure formation surface in a large-diameter particle film forming step.

As illustrated in FIG. 24, upon the dispersion being dripped onto a water surface L and the solvent contained in the dispersion evaporating, the large-diameter particles SL spread out into a single layer on the water surface L. At this time, when the large-diameter particles SL dispersed on the water surface assemble, surface tension acts between mutually-adjacent large-diameter particles SL as a result of the solvent present therebetween. As a result, the mutually-adjacent large-diameter particles SL form a close-packed structure through two-dimensional self-assembly, rather than being arranged randomly. A single-particle film FL that is closely packed two-dimensionally is formed as a result.

The concentration of the large-diameter particles SL in the dispersion is preferably no less than 1 wt % and no greater than 40 wt %, and the rate at which the dispersion is dripped is preferably no less than 0.001 ml/sec and no greater than 10 ml/sec. Assuming the concentration of the large-diameter particles SL in the dispersion and the rate at which the dispersion is dripped are within those ranges, the large-diameter particles SL are suppressed from aggregating in clusters and building up in two or more layers. This also suppresses defect areas where no large-diameter particles SL are present from arising, and makes it easier to obtain a single-particle film in which the particles are closely packed two-dimensionally.

Meanwhile, the large-diameter particle film forming step is preferably carried out under conditions in which the water surface L is subjected to ultrasound waves. The large-diameter particles SL will be more closely packed in the case where the solvent of the dispersion is evaporated while subjecting the water surface L to ultrasound waves. Furthermore, evaporating the solvent in the dispersion while subjecting the water surface L to ultrasound waves breaks up soft agglomerates of the large-diameter particles SL and also repairs point defects, linear defects, crystal transitions, or the like that have arisen.

The single-particle film FL formed on the water surface L is transferred to the element substrate 11 while maintaining the single-layer state thereof. As a method for transferring the single-particle film FL to the element substrate 11, or example, the hydrophobic light emitting structure formation surface 11S and a main surface of the single-particle film FL are held essentially parallel to each other, and the light emitting structure formation surface 11S is then brought into contact with the single-particle film FL from above the single-particle film FL. The single-particle film FL is then transferred to the element substrate 11 using affinity force between the hydrophobic single-particle film FL and the similarly hydrophobic light emitting structure formation surface 11S. Alternatively, the light emitting structure formation surface 11S is disposed essentially parallel to the water surface L within the water before forming the single-particle film FL; after forming the single-particle film FL on the water surface L, the water surface L is gradually lowered, and the single-particle film FL is thus transferred to the light emitting structure formation surface 11S.

Such a method allows the single-particle film FL to be transferred to the light emitting structure formation surface 11S without using any special apparatus. On the other hand, an LB trough method, described below, is preferable from the standpoint of transferring a large surface area single-particle film FL to the light emitting structure formation surface 11S while maintaining the close-packed state thereof.

Figure 25:
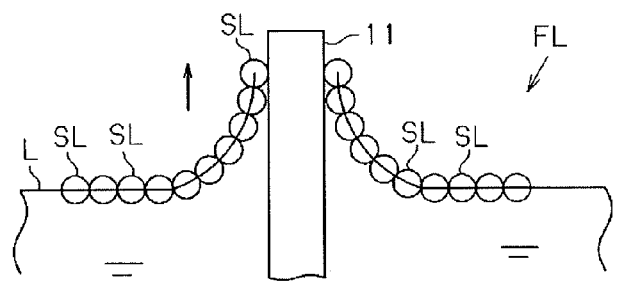
FIG. 25 is a diagram schematically illustrating a step in the method for manufacturing a substrate for semiconductor light emitting elements according to the third embodiment, and is a schematic view illustrating a state of the substrate for semiconductor light emitting elements partway through the single-particle film being transferred to the light emitting structure formation surface in the large-diameter particle film forming step.

As illustrated in FIG. 25, in the LB trough method, the element substrate 11 is immersed below the water surface L in an upright state, and the single-particle film FL is then formed on the water surface L. Then, with the element substrate 11 remaining upright, the element substrate 11 is gradually raised, thus transferring the single-particle film FL to the element substrate 11. At this time, the single-particle film FL transferred to the light emitting structure formation surface 11S often does not have an overall completely close-packed structure. As such, the single-particle film FL transferred to the light emitting structure formation surface 11S is constituted of a plurality of film elements that are separate from each other, and a continuous hexagonally-packed structure of large-diameter particles SL formed by each of the plurality of film elements is formed.

Although FIG. 25 illustrates a state in which the single-particle film FL is transferred to both sides of the element substrate 11, it is sufficient for the single-particle film FL to be transferred to at least the light emitting structure formation surface 11S. Furthermore, because the single-particle film FL is formed in a single layer on the water surface L, there is no risk of the single-particle film FL collapsing and forming multiple layers even if the speed at which the element substrate 11 is raised fluctuates slightly.

A fixing process for fixing the single-particle film FL to the light emitting structure formation surface 11S may be carried out on the single-particle film FL transferred to the light emitting structure formation surface 11S. A method that joins the large-diameter particles SL to the light emitting structure formation surface 11S using a binder, a sintering method that fuses the large-diameter particles SL to the light emitting structure formation surface 11S, or the like is used as the method for fixing the single-particle film FL to the light emitting structure formation surface 11S.

In the method of fixing using a binder, a binder solution is supplied to the light emitting structure formation surface 11S to which the single-particle film FL has been transferred, and the binder solution penetrates between the large-diameter particles SL constituting the single-particle film FL and the light emitting structure formation surface 11S. At this time, the amount of binder used is preferably no less than 0.001 times and no greater than 0.02 times the mass of the single-particle film FL. Assuming the amount used is within this range, the binder can be suppressed from clogging the spaces between mutually-adjacent large-diameter particles SL while also ensuring the large-diameter particles SL are fixed to the light emitting structure formation surface 11S. Metal alkoxysilane as well as typical organic and inorganic binders are used as the binder.

In the sintering method, the element substrate 11 to which the single-particle film FL has been transferred is heated so as to fuse the large-diameter particles SL constituting the single-particle film FL onto the light emitting structure formation surface 11S. A this time, the temperature to which the element substrate 11 is heated is determined as appropriate in view of the material of which the large-diameter particles SL are formed and the material of which the element substrate 11 is formed. Note that the element substrate 11 and the large-diameter particles SL may experience oxidization when the element substrate 11 is heated in the air. As such, when using the sintering method, it is preferable that the element substrate 11 be heated in an inert gas atmosphere.

Figure 26:
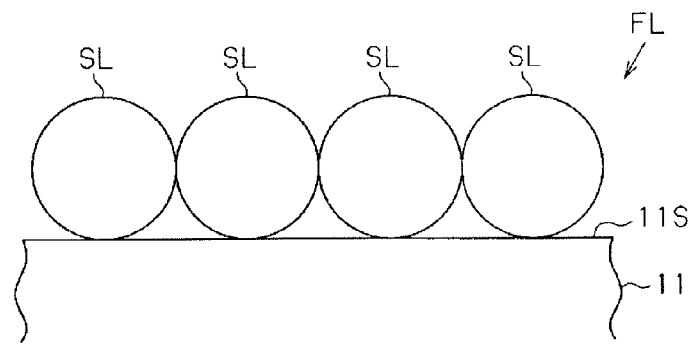
FIG. 26 is a diagram schematically illustrating a step in the method for manufacturing a substrate for semiconductor light emitting elements according to the third embodiment, and is a schematic view illustrating a state of the substrate for semiconductor light emitting elements after the single-particle film has been transferred to the light emitting structure formation surface in a large-diameter particle etching step.

As illustrated in FIG. 26, the single-particle film FL constituted by the single layer of large-diameter particles SL is formed on the light emitting structure formation surface 11S. When the light emitting structure formation surface 11S is viewed in plan view, the single-particle film FL has a hexagonally-packed structure in which the large-diameter particles SL are closely packed two-dimensionally.

In the large-diameter particle etching step, the etching may be carried out under conditions in which both the large-diameter particles SL and the element substrate 11 are etched together. However, it is preferable that the large-diameter particles SL that constitute the single-particle film FL be etched under etching conditions in which the element substrate 11 remains substantially unetched. At this time, the particle diameter of the large-diameter particles SL that constitute the single-particle film FL is reduced through selective etching, and new gaps are formed between mutually-adjacent large-diameter particles SL.

Under etching conditions in which the light emitting structure formation surface 11S remains substantially unetched, it is preferable that a percentage of the etching rate of the light emitting structure formation surface 11S relative to the etching rate of the large-diameter particles SL be no greater than 25%. The percentage of the etching rate of the light emitting structure formation surface 11S relative to the etching rate of the large-diameter particles SL is further preferably no greater than 15%, and particularly preferably no greater than 10%. Note that an etching gas used for reactive etching can be selected as appropriate for such etching conditions. In the case where the element substrate 11 is sapphire and the large-diameter particles SL are silica, for example, one or more types of gas may be selected from the group consisting of $CF_4$, $SF_6$, $CHF_3$, $C_2F_6$, $C_3F_8$, $CH_2F_2$, and $NF_3$, and used as the etching gas. Meanwhile, in the case where it is necessary to etch the element substrate 11, a noble gas such as Ar, $O_2$, or another such additional gas is preferably added to the etching gas. Note that the etching gas is not limited to these, and is selected as appropriate in view of the material of the particles that constitute the single-particle film FL.

Figure 27:
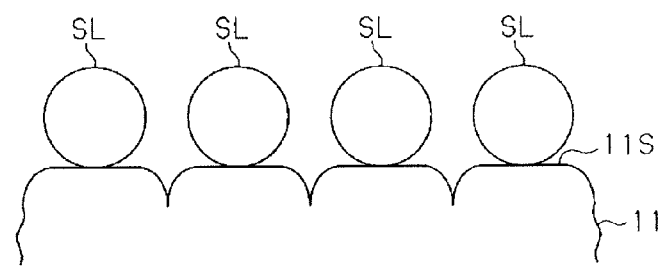
FIG. 27 is a diagram schematically illustrating a step in the method for manufacturing a substrate for semiconductor light emitting elements according to the third embodiment, and is a schematic view illustrating a state of the substrate for semiconductor light emitting elements partway through the single-particle film and the substrate for semiconductor light emitting elements being etched in the large-diameter particle etching step.

As illustrated in FIG. 27, the light emitting structure formation surface 11S is then etched using the reduced-diameter large-diameter particles SL as a mask. At this time, the light emitting structure formation surface 11S is exposed to the etching gas, which acts as an etchant, through the gaps between the mutually-adjacent large-diameter particles SL, and the large-diameter particles SL that constitute the single-particle film FL are also exposed to the etching gas, which acts as an etchant.

Here, the etching of the light emitting structure formation surface 11S progresses earlier the further the part of the light emitting structure formation surface 11S that opposes the large-diameter particle SL is from the center of the large-diameter particle SL. Then, as the large-diameter particles SL are etched away, regions that oppose the centers of the large-diameter particles SL are also etched.

Figure 28:
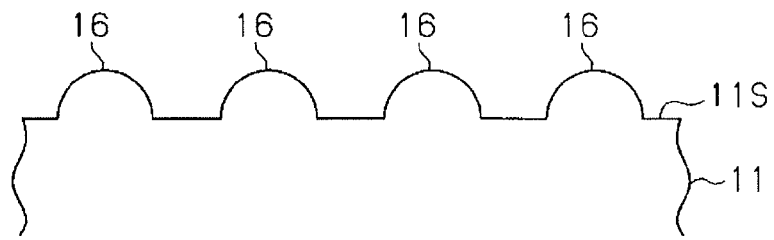
FIG. 28 is a diagram schematically illustrating a step in the method for manufacturing a substrate for semiconductor light emitting elements according to the third embodiment, and is a schematic view illustrating the substrate for semiconductor light emitting elements that has been etched in the large-diameter particle etching step.

As illustrated in FIG. 28, base projections 16 having a hemispherical shape with the apex at the areas that oppose the centers of the large-diameter particles SL are formed in the light emitting structure formation surface 11S as a result. The base projections 16 serve as bases of the large-diameter projections 12. The pitch PL of the base projections 16 is the same as the interval between mutually-adjacent large-diameter particles SL in the single-particle film FL, and the arrangement of the base projections 16 is also the same as the arrangement of the large-diameter particles SL. Meanwhile, regions that oppose the gaps between mutually-adjacent large-diameter particles SL and regions that oppose the vicinity of the outside surfaces of the large-diameter particles SL prior to the large-diameter particles SL being etched away are exposed to the etching gas for a particularly long period of time, and thus become flat as a result of the increased degree to which the etching progresses.

In the large-diameter particle etching step, it is preferable that the etching rate of the light emitting structure formation surface 11S be higher than the etching rate of the large-diameter particles SL. The percentage of the etching rate of the light emitting structure formation surface 11S relative to the etching rate of the large-diameter particles SL is preferably no less than 200%, and further preferably no greater than 300%. Note that an etching gas used for reactive etching can be selected as appropriate for such etching conditions. In the case where the element substrate 11 is sapphire and the large-diameter particles SL are silica, for example, one or more types of gas may be selected from the group consisting of $Cl_2$, $BCl_3$, $SiCl_4$, HBr, HI, HCl, and Ar, and used as the etching gas. Note that the etching gas used to etch the light emitting structure formation surface 11S is not limited to these, and is selected as appropriate in view of the material of which the element substrate 11 is formed.

Small-diameter particles SS that constitute a single-particle film used in the small-diameter particle step have different particle diameters than that of the large-diameter particles SL. On the other hand, the various types of materials indicated as examples in the above descriptions of the large-diameter particle film forming step are used for the material of the small-diameter particles SS as well.

In order to form the small-diameter projections 13 at the sizes indicated in the above-described embodiments and modifications, it is preferable that the particle diameter of the small-diameter particles SS be no less than 100 nm and no greater than 1 µm. Preferably, the particle diameter of the small-diameter particles SS is no less than 1/50 and no greater than 1/3 the particle diameter of the large-diameter particles SL. As long as the particle diameter of the small-diameter particles SS is no less than 1/50 the particle diameter of the large-diameter particles SL, an appropriate size can be ensured for the small-diameter particles SS, which makes it easier for the single-particle film constituted of the small-diameter particles SS to function as a mask. On the other hand, as long as the particle diameter of the small-diameter particles SS is no greater than 1/3 the particle diameter of the large-diameter particles SL, the small-diameter projections 13 will not be formed too large relative to the large-diameter projections 12, and thus the effect of the large-diameter projections 12 adjusting the angle of reflection of the light, the effect of the small-diameter projections 13 diffracting the light, and the like described in the first embodiment can be achieved with ease by each of the projections 12 and 13.

In the small-diameter particle film forming step, one of the single-particle film forming methods described as an example with reference to the large-diameter particle film forming step is used to form a single-particle film FS constituted of the small-diameter particles SS on the light emitting structure formation surface 11S on which the base projections 16 have been formed. As in the large-diameter particle film forming step, the LB trough method is preferable as the method for forming the single-particle film FS on the light emitting structure formation surface 11S. The same conditions as those indicated as examples with reference to the large-diameter particle film forming step are applied as the conditions of the method for forming the single-particle film FS as well.

Figure 29:
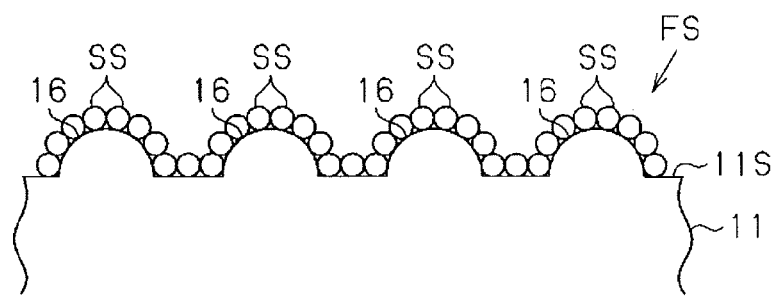
FIG. 29 is a diagram schematically illustrating a step in the method for manufacturing a substrate for semiconductor light emitting elements according to the third embodiment, and is a schematic view illustrating a state of the substrate for semiconductor light emitting elements after the single-particle film has been transferred to the light emitting structure formation surface in a small-diameter particle etching step.

As illustrated in FIG. 29, the single-particle film FS constituted by the single layer of small-diameter particles SS is formed on the light emitting structure formation surface 11S on which the base projections 16 have been formed in the large-diameter particle etching step. When the light emitting structure formation surface 11S is viewed in plan view, the single-particle film FS has a hexagonally-packed structure in which the small-diameter particles SS are closely packed two-dimensionally. The small-diameter particles SS are arranged on the outside surfaces of the base projections 16 and the flat parts between mutually-adjacent base projections 16.

In the small-diameter particle etching step, the light emitting structure formation surface 11S is etched using the small-diameter particles SS as a mask, through the same process as the large-diameter particle etching step.

First, the small-diameter particles SS that constitute the single-particle film FS are preferably etched under etching conditions in which the element substrate 11 remains substantially unetched. At this time, the particle diameter of the small-diameter particles SS that constitute the single-particle film SL is reduced through selective etching, and new gaps are formed between mutually-adjacent small-diameter particles SS. The same conditions as those described as an example with reference to the large-diameter particle etching step are applied as these etching conditions under which the light emitting structure formation surface 11S remains substantially unetched.

Next, the light emitting structure formation surface 11S is etched using the reduced-diameter small-diameter particles SS as a mask. At this time, the light emitting structure formation surface 11S is exposed to the etching gas, which acts as an etchant, through the gaps between the mutually-adjacent small-diameter particles SS, and the small-diameter particles SS that constitute the single-particle film FS are also exposed to the etching gas, which acts as an etchant.

The etching of the light emitting structure formation surface 11S progresses earlier the further the part of the light emitting structure formation surface 11S that opposes the small-diameter particles SS is from the center of the small-diameter particles SS. Then, as the small-diameter particles SS are etched away, regions that oppose the centers of the small-diameter particles SS are also etched.

Figure 30:
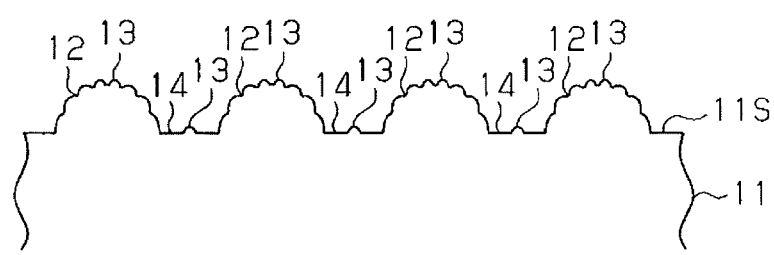
FIG. 30 is a diagram schematically illustrating a step in the method for manufacturing a substrate for semiconductor light emitting elements according to the third embodiment, and is a schematic view illustrating the substrate for semiconductor light emitting elements that has been etched in the small-diameter particle etching step.

As illustrated in FIG. 30, the large-diameter projections 12 having shapes that follow the shapes of the base projections 16, the small-diameter projections 13 that have a conical shape and are located in areas that oppose small-diameter particles SS, and the flat part 14 located in positions corresponding to the flat parts between the mutually-adjacent base projections 16, are formed in the light emitting structure formation surface 11S as a result. As described above, in a state where the single-particle film FS has been formed on the light emitting structure formation surface 11S, the small-diameter particles SS are arranged on the outside surfaces of the base projections 16 and on the flat part between mutually-adjacent base projections 16. Accordingly, the small-diameter projections 13 are formed on the outside surfaces of the large-diameter projections 12 and on the flat part 14.

Here, in the state where the single-particle film FS has been formed on the light emitting structure formation surface 11S, the small-diameter particles SS are arranged along the outside surfaces of the hemispherical base projections 16, and thus multiple small-diameter particles SS are disposed overlapping in a direction perpendicular to the light emitting structure formation surface 11S in the vicinities of the bases of the base projections 16. More overlap in the vertical direction occurs in the small-diameter particles SS from the tips of the base projections 16 to the bases thereof, and thus the light emitting structure formation surface 11S is exposed to the etching gas for a shorter amount of time as the base projections 16 progress from the tips to the bases thereof. As a result, the etching progresses more slowly as the base projections 16 progress from the tips to the bases thereof, and thus the heights of the small-diameter projections 13 decrease from the tips toward the bases of the base projections 16. Furthermore, regions that are covered by the small-diameter particles SS and that experience slower etching due to the small-diameter particles SS overlapping in the vertical direction are expanded. As a result, the widths of the small-diameter projections 13 increase from the tips toward the bases of the base projections 16.

Note that the same conditions as those described as an example with reference to the large-diameter particle etching step are applied as the etching conditions when the light emitting structure formation surface 11S is etched.

As described thus far, the substrate for semiconductor light emitting elements according to the first embodiment is manufactured through the manufacturing method according to the third embodiment.

Note that in the large-diameter particle etching step, after the etching of the light emitting structure formation surface 11S has been started, the etching of the light emitting structure formation surface 11S may be stopped before the large-diameter particles SL that constitute the single-particle film FL are etched away, and the small-diameter particle film forming step may then proceed after the single-particle film FL is removed from the light emitting structure formation surface 11S.

To be more specific, in a step for removing the single-particle film FL, the single-particle film FL may be physically removed using a method such as washing using ultrasound waves at no less than 30 kHz and no greater than 1.5 MHz, and preferably at no less than 40 kHz and no greater than 900 kHz, high-pressure washing at no less than 1 MPa and no greater than 15 MPa, and preferably at no less than 5 MPa and no greater than 15 MPa, or wiping, specifically contact washing using a cotton cloth or a PVA brush. Alternatively, the single-particle film FL alone may be chemically removed using a method such as dry etching with a gas such as CF4 or wet etching with HF or the like. In this case, the regions of the light emitting structure formation surface 11S that oppose the large-diameter particles SL until immediately before the single-particle film FL is removed are not etched and are thus flat. Accordingly, the large-diameter projections 22 are formed with the tip portions thereof being flat. The substrate for semiconductor light emitting elements according to the first modified example is manufactured through such a manufacturing method.

In addition, in the small-diameter particle etching step, after the etching of the light emitting structure formation surface 11S has been started, the etching of the light emitting structure formation surface 11S may be stopped before the small-diameter particles SS that constitute the single-particle film FS are etched away, and the single-particle film FS may then be removed from the light emitting structure formation surface 11S. In this case, the centers of the regions of the light emitting structure formation surface 11S that oppose the small-diameter particles SS until immediately before the single-particle film FS is removed are not etched and are thus flat. Accordingly, the small-diameter projections 23 are formed with the tip portions thereof being flat. The substrate for semiconductor light emitting elements according to the second modified example is manufactured through such a manufacturing method.

Meanwhile, the etching may be stopped before the particles are etched away in both the large-diameter particle etching step and the small-diameter particle etching step. In other words, in the large-diameter particle etching step, after the etching of the light emitting structure formation surface 11S has been started, the etching of the light emitting structure formation surface 11S is stopped before the large-diameter particles SL that constitute the single-particle film FL are etched away, and the small-diameter particle film forming step then proceeds after the single-particle film FL is removed from the light emitting structure formation surface 11S. Then, in the small-diameter particle etching step, after the etching of the light emitting structure formation surface 11S has been started, the etching of the light emitting structure formation surface 11S is stopped before the small-diameter particles SS that constitute the single-particle film FS are etched away, and the single-particle film FS is then removed from the light emitting structure formation surface 11S. In this case, the large-diameter projections 22 whose tip areas are flat, and the small-diameter projections 23 whose tip areas are flat, are formed. The substrate for semiconductor light emitting elements according to the third modified example is manufactured through such a manufacturing method.

As the above-described manufacturing method, descriptions were given of an example in which in the large-diameter particle etching step, of the regions in the light emitting structure formation surface 11S, first regions that oppose a gap between mutually-adjacent large-diameter particles SL and second regions that oppose the vicinity of the outside surfaces of the large-diameter particles SL before the large-diameter particles SL are reduced in size, are etched until those areas become flat. If a difference in the degree to which the etching proceeds between these regions is used instead, the bridge portions 15 are formed. Specifically, the first regions that oppose the gaps between mutually-adjacent large-diameter particles SL prior to the large-diameter particles SL being reduced in diameter are not masked by the large-diameter particles SL, and thus the degree to which the etching progresses is slightly higher in the first regions than in the second regions, which oppose the vicinity of the outside surfaces of the large-diameter particles SL. The difference between the degrees to which the etching proceeds is particularly great the larger the stated gaps are. The difference between the degrees to which the etching proceeds also changes when the etching gas is changed. Accordingly, by adjusting the etching conditions such as the particle diameter of the large-diameter particles SL and the type of the etching gas, in the light emitting structure formation surface 11S, regions that oppose parts in which mutually-adjacent large-diameter particles SL come in contact with each other, the regions being located in the second regions that oppose the vicinity of the outside surfaces of the large-diameter particles SL, will have shallower depressions than that of the first regions that oppose the gaps between mutually-adjacent large diameter particles SL. The bridge portions 15 are formed as a result. The substrate for semiconductor light emitting elements according to the sixth modified example is manufactured through such a manufacturing method.

Meanwhile, in the above-described manufacturing method and the modifications thereof, the small-diameter particle film forming step and the small-diameter particle etching step may be carried out after forming a mask that will not be etched by the etching gas in the flat parts between mutually-adjacent base projections 16. The substrates for semiconductor light emitting elements according to the second embodiment and the seventh to ninth modifications, in which the small-diameter projections 13 are not formed in the flat part 14, are manufactured through such a manufacturing method.

Note that in the third embodiment, the large-diameter particle film forming step corresponds to a first particle film forming step, the large-diameter particle etching step corresponds to a first particle etching step, the small-diameter particle film forming step corresponds to a second particle film forming step, and the small-diameter particle etching step corresponds to a second particle etching step.

According to the third embodiment as described thus far, the following effects are achieved.

(6) By etching the substrate using the two types of particles having mutually different sizes, a substrate for semiconductor light emitting elements that achieves the above-described effects (1), (3), and (4) can be manufactured.

(7) An etching step is carried out using the small-diameter particles SS after an etching step is carried out using the large-diameter particles SL. Such a manufacturing method is suited to the manufacture of a substrate for semiconductor light emitting elements in which the small-diameter projections 13 are formed in the flat part 14 as well, or in other words, a substrate for semiconductor light emitting elements that achieves the above-described effect (2).

(8) The particle diameter of the large-diameter particles SL is no less than 300 nm and no greater than 5 μm, the particle diameter of the small-diameter particles SS is no less than 100 nm and no greater than 1 μm, and the particle diameter of the small-diameter particles SS is no less than $\frac{1}{50}$ and no greater than $\frac{1}{3}$ the particle diameter of the large-diameter particles SL. According to this configuration, the projections 12 and 13 can be formed having shapes that easily provide the above-described effect (1).

(9) If, in at least one of the large-diameter particle etching step and the small-diameter particle etching step, the etching of the light emitting structure formation surface 11S is stopped before the single-particle film is etched away and the single-particle film is then removed from the light emitting structure formation surface 11S, the projections 22 and 23 are formed having a truncated cone shape. According to this manufacturing method, a substrate for semiconductor light emitting elements that achieves effects equivalent to the above-described (1), (3), and (4) can be manufacturing in a shorter amount of time than in the case where the etching is carried out until the single-particle film is etched away.

Referring to FIGS. 31 to 35, an embodiment of a method for manufacturing a substrate for semiconductor light emitting elements will be described as a fourth embodiment of the technique of the present disclosure. In the fourth embodiment, the order of the large-diameter particle step and the small-diameter particle step is different from that in the third embodiment. The following descriptions will focus on the differences from the third embodiment; elements that are the same as in the third embodiment will be given the same reference numerals, and descriptions thereof will be omitted.

In the method for manufacturing a substrate for semiconductor light emitting elements according to the fourth embodiment, the small-diameter particle step is carried out before the large-diameter particle step.

The small-diameter particle step includes a small-diameter particle film forming step and a small-diameter particle etching step, whereas the large-diameter particle step includes a large-diameter particle film forming step and a large-diameter particle etching step.

In the small-diameter particle film forming step, a single-particle film FS constituted of the small-diameter particles SS is formed on the light emitting structure formation surface 11S, and in the small-diameter particle etching step, the light emitting structure formation surface 11S is etched using that single-particle film FS as a mask. In the large-diameter particle film forming step, a single-particle film FL constituted of large-diameter particles SL is formed on the light emitting structure formation surface 11S etched in the small-diameter particle etching step, and the light emitting structure formation surface 11S is etched again using that single-particle film FL as a mask. The steps of the method for manufacturing a substrate for semiconductor light emitting elements will be described below in the order of the processes carried out.

The particle diameter, material, and the like of the small-diameter particles SS that constitute the single-particle film FS used in the small-diameter particle step are the same as the particle diameter, material, and the like described as examples in the third embodiment. However, in the fourth embodiment, it is preferable that the particle diameter of the small-diameter particles SS be no less than $\frac{1}{10}$ and no greater than $\frac{1}{3}$ the particle diameter of the large-diameter particles SL. In the fourth embodiment, the etching that uses the single-particle film FS, which is constituted of the small-diameter particles SS, as a mask is carried out first, and thus the base projections formed on the light emitting structure formation surface 11S are smaller than the base projections described in the third embodiment. These small base projections are exposed to the etching gas during the etching that uses the single-particle film FL, which is constituted of the large-diameter particles SL, as a mask. As long as the particle diameter of the small-diameter particles SS is no less than $\frac{1}{10}$ the particle diameter of the large-diameter particles SL, projections that are large enough as the small-diameter projections 13 are formed without the base projections being etched away, even if the large-diameter particle etching step is carried out.

In the small-diameter particle film forming step, the same method as the single-particle film forming method described as an example in the third embodiment is used to form the single-particle film FS constituted of the small-diameter particles SS on the light emitting structure formation surface 11S.

Figure 31:
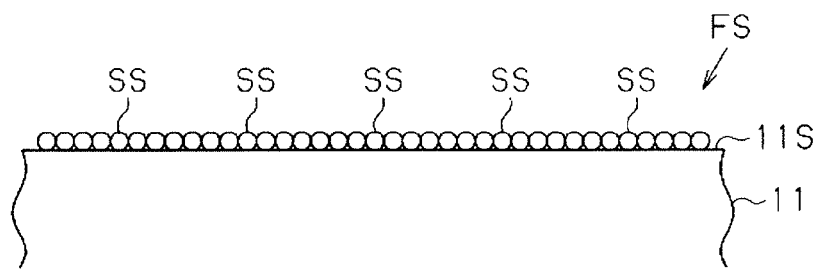
FIG. 31 is a diagram schematically illustrating a step in a method for manufacturing a substrate for semiconductor light emitting elements according to a fourth embodiment, and is a schematic view illustrating a state of a substrate for semiconductor light emitting elements after a single-particle film has been transferred to a light emitting structure formation surface in a small-diameter particle etching step.

As illustrated in FIG. 31, the single-particle film FS constituted by the single layer of small-diameter particles SS is formed on the light emitting structure formation surface 11S. When the light emitting structure formation surface 11S is viewed in plan view, the single-particle film FS has a hexagonally-packed structure in which the small-diameter particles SS are closely packed two-dimensionally.

In the small-diameter particle etching step, first, the small-diameter particles SS that constitute the single-particle film FS are preferably etched under etching conditions in which the element substrate 11 remains substantially unetched. At this time, the particle diameter of the small-diameter particles SS that constitute the single-particle film SL is reduced through selective etching, and new gaps are formed between mutually-adjacent small-diameter particles SS. The same conditions as those described as an example in the third embodiment are applied as these etching conditions under which the light emitting structure formation surface 11S remains substantially unetched.

Figure 32:
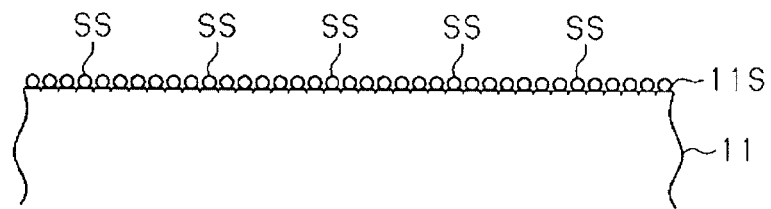
FIG. 32 is a diagram schematically illustrating a step in the method for manufacturing a substrate for semiconductor light emitting elements according to the fourth embodiment, and is a schematic view illustrating a state of the substrate for semiconductor light emitting elements partway through the single-particle film and the substrate for semiconductor light emitting elements being etched in the small-diameter particle etching step.

As illustrated in FIG. 32, the light emitting structure formation surface 11S is then etched using the reduced-diameter small-diameter particles SS as a mask. At this time, the light emitting structure formation surface 11S is exposed to the etching gas, which acts as an etchant, through the gaps between the mutually-adjacent small-diameter particles SS, and the small-diameter particles SS that constitute the single-particle film FS are also exposed to the etching gas, which acts as an etchant. The etching of the light emitting structure formation surface 11S progresses earlier the further the part of the light emitting structure formation surface 11S that opposes the small-diameter particles SS is from the center of the small-diameter particles SS. Then, as the small-diameter particles SS are etched away, regions that oppose the centers of the small-diameter particles SS are also etched.

Figure 33:
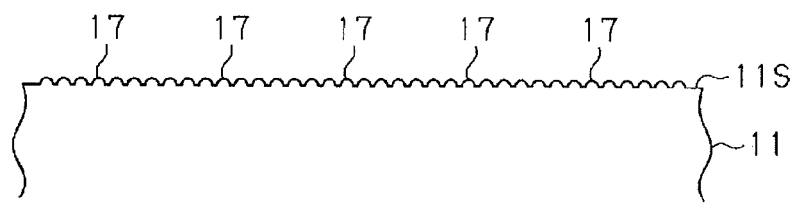
FIG. 33 is a diagram schematically illustrating a step in the method for manufacturing a substrate for semiconductor light emitting elements according to the fourth embodiment, and is a schematic view illustrating the substrate for semiconductor light emitting elements that has been etched in the small-diameter particle etching step.

As illustrated in FIG. 33, base projections 17 having a hemispherical shape with the apex at the areas that oppose the centers of the small-diameter particles SS are formed in the light emitting structure formation surface 11S as a result. The pitch PS of the base projections 17 is the same as the interval between mutually-adjacent small-diameter particles SS in the single-particle film FS, and the arrangement of the base projections 17 is also the same as the arrangement of the small-diameter particles SS. Meanwhile, regions that oppose the gaps between mutually-adjacent small-diameter particles SS and regions that oppose the vicinity of the outside surfaces of the small-diameter particles SS prior to the small-diameter particles SS being reduced in size are exposed to the etching gas for a particularly long period of time, and thus become flat as a result of the increased degree to which the etching progresses.

The same conditions as those described as an example in the third embodiment are applied as the etching conditions when the light emitting structure formation surface 11S is etched.

The particle diameter, material, and the like of the large-diameter particles SL that constitute the single-particle film used in the large-diameter particle step are the same as the particle diameter, material, and the like described as examples in the third embodiment.

In the large-diameter particle film forming step, the same method as the single-particle film forming method described as an example in the third embodiment is used to form the single-particle film FL constituted of the large-diameter particles SL on the light emitting structure formation surface 11S on which the base projections 17 have been formed. Here, in the third embodiment, the small-diameter particles SS disposed on the base projections 16 are smaller than the base projections 16. However, in the fourth embodiment, the large-diameter particles SL disposed on the base projections 17 are larger than the base projections 17. As such, according to the fourth embodiment, it is easier for the single-particle film formed on the light emitting structure formation surface 11S after the base projections have been formed to become flat, and easier for the particles to be arranged with regularity on the light emitting structure formation surface 11S, than in the third embodiment. As a result, the arrangement of the projections 12 and 13 on the light emitting structure formation surface 11S is more uniform in the fourth embodiment than in the third embodiment.

Figure 34:
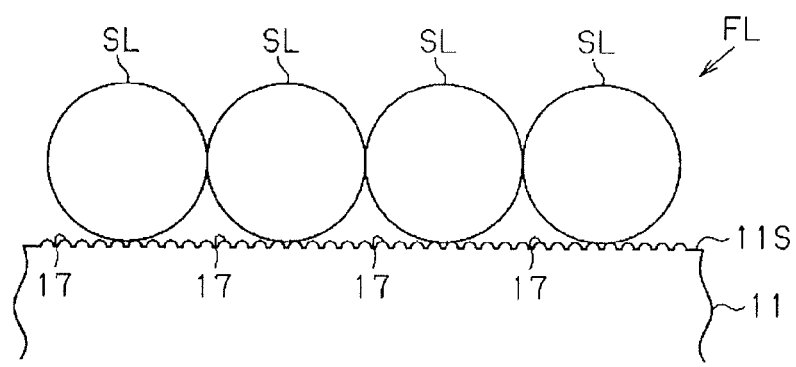
FIG. 34 is a diagram schematically illustrating a step in the method for manufacturing a substrate for semiconductor light emitting elements according to the fourth embodiment, and is a schematic view illustrating a state of the substrate for semiconductor light emitting elements after the single-particle film has been transferred to the light emitting structure formation surface in the large-diameter particle etching step.

As illustrated in FIG. 34, the single-particle film FL constituted by the single layer of large-diameter particles SL is formed on the light emitting structure formation surface 11S on which the base projections 17 have been formed in the small-diameter particle etching step. When the light emitting structure formation surface 11S is viewed in plan view, the single-particle film FL has a hexagonally-packed structure in which the large-diameter particles SL are closely packed two-dimensionally.

In the large-diameter particle etching step, first, the large-diameter particles SL that constitute the single-particle film FL are preferably etched under etching conditions in which the element substrate 11 remains substantially unetched. At this time, the particle diameter of the large-diameter particles SL that constitute the single-particle film FL is reduced through selective etching, and new gaps are formed between mutually-adjacent large-diameter particles SL. The same conditions as those described as an example in the third embodiment are applied as these etching conditions under which the light emitting structure formation surface 11S remains substantially unetched.

Next, the light emitting structure formation surface 11S is etched using the reduced-diameter large-diameter particles SL as a mask. At this time, the light emitting structure formation surface 11S is exposed to the etching gas, which acts as an etchant, through the gaps between the mutually-adjacent large-diameter particles SL, and the large-diameter particles SL that constitute the single-particle film FL are also exposed to the etching gas, which acts as an etchant.

The etching of the light emitting structure formation surface 11S progresses earlier the further the part of the light emitting structure formation surface 11S that opposes the large-diameter particle SL is from the center of the large-diameter particle SL. Then, as the large-diameter particles SL are etched away, regions that oppose the centers of the large-diameter particles SL are also etched.

Figure 35:
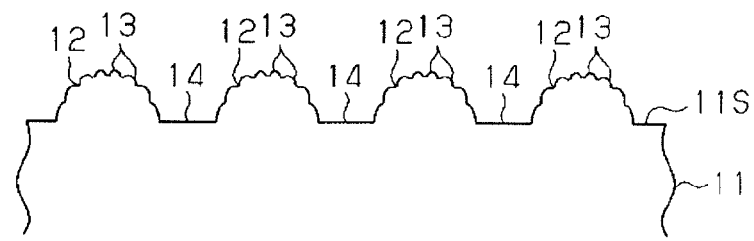
FIG. 35 is a diagram schematically illustrating a step in the method for manufacturing a substrate for semiconductor light emitting elements according to the fourth embodiment, and is a schematic view illustrating the substrate for semiconductor light emitting elements that has been etched in the large-diameter particle etching step.

As illustrated in FIG. 35, the large-diameter projections 12 having a conical shape whose apex is a part opposing the center of the large-diameter particle SL, and the small-diameter projections 13 located in positions corresponding to the positions of the base projections 17, are formed in the light emitting structure formation surface 11S as a result. The pitch PL of the large-diameter projections 12 is the same as the interval between mutually-adjacent large-diameter particles SL in the single-particle film FL, and the arrangement of the large-diameter projections 12 is also the same as the arrangement of the large-diameter particles SL.

Here, the light emitting structure formation surface 11S is exposed to the etching gas for a longer period of time toward the outer sides of the light emitting structure formation surface 11S in a direction parallel thereto, than at the centers of the large-diameter projections 12. As a result, the degree to which the etching progresses with respect to the base projections 17 increases from the tips toward the bases of the large-diameter projections 12, and thus the heights of the small-diameter projections 13 decrease from the tips toward the bases of the large-diameter projections 12. Meanwhile, the outside surfaces of the large-diameter projections 12 become sloped due to the difference in the degrees to which the etching progresses, and thus the shapes of the small-diameter projections 13 extend along those slopes. As a result, the widths of the small-diameter projections 13 increase as the large-diameter projections 12 progress from the tips to the bases thereof.

Meanwhile, regions that oppose the gaps between mutually-adjacent large-diameter particles SL and regions that oppose the vicinity of the outside surfaces of the large-diameter particles SL prior to the large-diameter particles SL being reduced in size are exposed to the etching gas for a particularly long period of time. When there is a large difference between the sizes of the base projections 17 and the large-diameter particles SL, these regions are etched, as the etching of the large-diameter particles SL progresses, until the base projections 17 are etched away, becoming flat as a result. Accordingly, the small-diameter projections 13 are not formed in the flat part 14.

The same conditions as those described as an example in the third embodiment are applied as the etching conditions when the light emitting structure formation surface 11S is etched.

As described thus far, the substrate for semiconductor light emitting elements according to the second embodiment is manufactured through the manufacturing method according to the fourth embodiment.

Note that in the large-diameter particle etching step, after the etching of the light emitting structure formation surface 11S has been started, the etching of the light emitting structure formation surface 11S may be stopped before the large-diameter particles SL that constitute the single-particle film FL are etched away, and the single-particle film FL may then be removed from the light emitting structure formation surface 11S. In this case, the regions of the light emitting structure formation surface 11S that oppose the large-diameter particles SL until immediately before the single-particle film FL is removed are not etched, and thus the base projections 17 formed in the flat part remain. Accordingly, the large-diameter projections 22 are formed with the tip portions thereof being flat. The substrate for semiconductor light emitting elements according to the seventh modified example is manufactured through such a manufacturing method.

In addition, in the small-diameter particle etching step, after the etching of the light emitting structure formation surface 11S has been started, the etching of the light emitting structure formation surface 11S may be stopped before the small-diameter particles SS that constitute the single-particle film FS are etched away, and the large-diameter particle film forming step may then proceed after the single-particle film FS is removed from the light emitting structure formation surface 11S. In this case, the regions of the light emitting structure formation surface 11S that oppose the small-diameter particles SS until immediately before the single-particle film FS is removed are not etched and are thus flat. Accordingly, the small-diameter projections 23 are formed with the tip portions thereof being flat. The substrate for semiconductor light emitting elements according to the eighth modified example is manufactured through such a manufacturing method.

Meanwhile, the etching may be stopped before the particles are etched away in both the large-diameter particle etching step and the small-diameter particle etching step. In other words, in the small-diameter particle etching step, after the etching of the light emitting structure formation surface 11S has been started, the etching of the light emitting structure formation surface 11S is stopped before the small-diameter particles SS that constitute the single-particle film FS are etched away, and the large-diameter particle film forming step then proceeds after the single-particle film FS is removed from the light emitting structure formation surface 11S. Then, in the large-diameter particle etching step, after the etching of the light emitting structure formation surface 11S has been started, the etching of the light emitting structure formation surface 11S is stopped before the large-diameter particles SL that constitute the single-particle film FL are etched away, and the single-particle film FL is then removed from the light emitting structure formation surface 11S. In this case, the large-diameter projections 22 whose tip areas are flat, and the small-diameter projections 23 whose tip areas are flat, are formed. The substrate for semiconductor light emitting elements according to the ninth modified example is manufactured through such a manufacturing method.

As with the method described as the manufacturing method for the fourth modified example, in the large-diameter particle etching step, of the regions in the light emitting structure formation surface 11S, using the difference in the degrees to which etching progresses between regions that oppose a gap between mutually-adjacent large-diameter particles SL and regions that oppose the vicinity of the outside surfaces of the large-diameter particles SL prior to the large-diameter particles SL being reduced in size enables the bridge portions 15 to be formed. The substrate for semiconductor light emitting elements according to the twelfth modified example is manufactured through such a manufacturing method.

If the difference between the particle diameters of the small-diameter particles SS and the large-diameter particles SL is low, the difference between the sizes of the base projections 17 and the large-diameter particles SL will also be low. As a result, in the large-diameter particle etching step, the small-diameter projections 13 are also formed, with the base projections 17 remaining, in regions that oppose the gaps between mutually-adjacent large-diameter particles SL and regions that oppose the vicinity of the outside surfaces of the large-diameter particles SL prior to the large-diameter particles SL being reduced in size. The substrate for semiconductor light emitting elements according to the first embodiment and the first to third and sixth modifications is manufactured through such a manufacturing method.

Note that in the fourth embodiment, the small-diameter particle film forming step corresponds to a first particle film forming step, and the small-diameter particle etching step corresponds to a first particle etching step, which is an example of a first step. Meanwhile, the large-diameter particle film forming step corresponds to a second particle film forming step, and the large-diameter particle etching step corresponds to a second particle etching step, which is an example of a second step.

According to the fourth embodiment as described thus far, the following effects are achieved in addition to the effects (6) and (9) achieved by the third embodiment.

(10) An etching step is carried out using the large-diameter particles SL after an etching step is carried out using the small-diameter particles SS. Such a manufacturing method is suited to the manufacture of a substrate for semiconductor light emitting elements in which the small-diameter projections 13 are not formed in the flat part 14, or in other words, a substrate for semiconductor light emitting elements that achieves the above-described effect (5). Furthermore, because it is easy for the single-particle film formed on the light emitting structure formation surface 11S that was first subjected to the etching step to become flat, and easy for the particles to be arranged with regularity on the light emitting structure formation surface 11S, the projections 12 and 13 are arranged more uniformly on the light emitting structure formation surface 11S.

(11) The particle diameter of the large-diameter particles SL is no less than 300 nm and no greater than 5 µm, the particle diameter of the small-diameter particles SS is no less than 100 nm and no greater than 1 µm, and the particle diameter of the small-diameter particles SS is no less than $1/10$ and no greater than $1/3$ the particle diameter of the large-diameter particles SL. According to this configuration, the projections 12 and 13 can be formed having sizes that easily provide the above-described effect (1).

Figure 36:
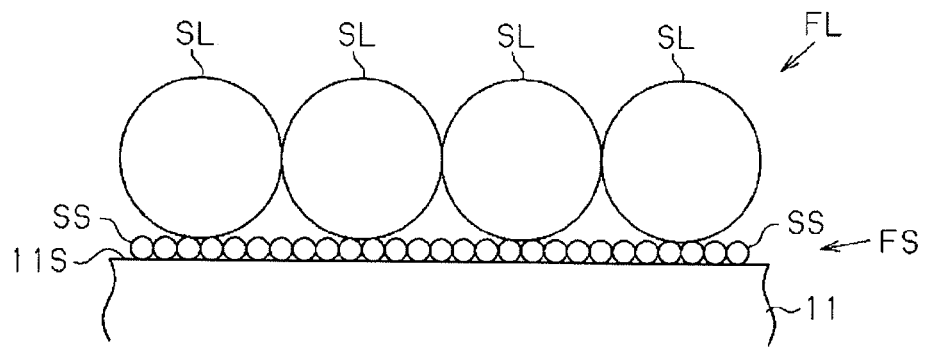
FIG. 36 is a diagram schematically illustrating a step in a method for manufacturing a substrate for semiconductor light emitting elements according to a fifth embodiment of the technique of the present disclosure, and is a schematic view illustrating a state of a substrate for semiconductor light emitting elements when a single-particle film has been transferred to a light emitting structure formation surface.
Figure 37:
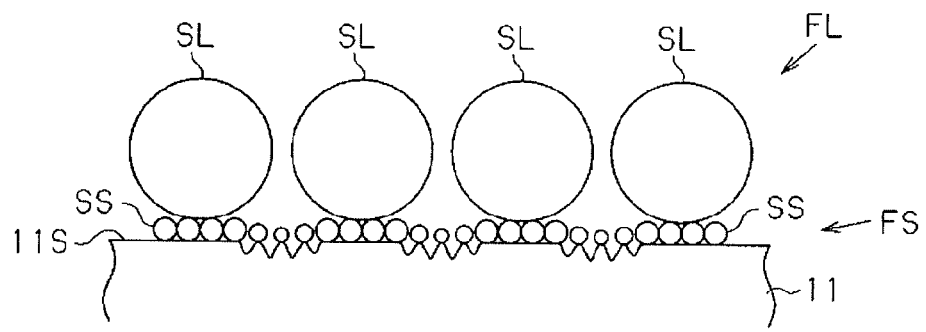
FIG. 37 is a diagram schematically illustrating a step in the method for manufacturing a substrate for semiconductor light emitting elements according to the fifth embodiment, and is a schematic view illustrating a state of the substrate for semiconductor light emitting elements partway through the single-particle film and the substrate for semiconductor light emitting elements being etched.
Figure 38:
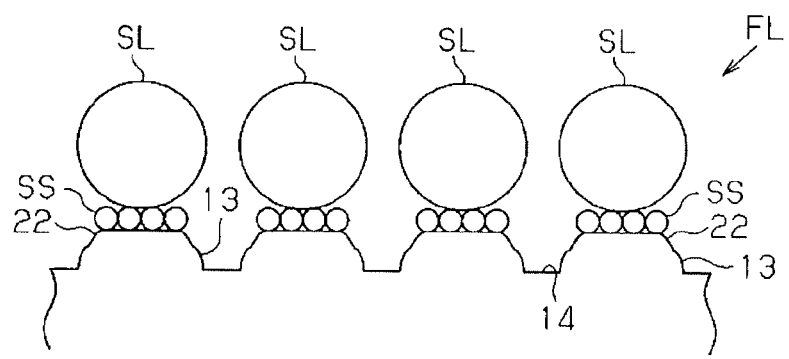
FIG. 38 is a diagram schematically illustrating a step in the method for manufacturing a substrate for semiconductor light emitting elements according to the fifth embodiment, and is a schematic view illustrating the substrate for semiconductor light emitting elements that has been etched.

Referring to FIGS. 36 to 38, an embodiment of a method for manufacturing a substrate for semiconductor light emitting elements will be described as a fifth embodiment of the technique of the present disclosure. In the fifth embodiment, the order of the steps of forming the respective single-particle films and the order of the steps of etching using the respective single-particle films as masks is different from that of the fourth embodiment. The following descriptions will focus on the differences from the fourth embodiment; elements that are the same as in the fourth embodiment will be given the same reference numerals, and descriptions thereof will be omitted.

In the method for manufacturing a substrate for semiconductor light emitting elements according to the fifth embodiment, the small-diameter particle film forming step is carried out before the large-diameter particle film forming step. Then, after the small-diameter particle film forming step and the large-diameter particle film forming step have been carried out in order, the first step, which is etching using the single-particle film FS constituted of the small-diameter particles SS as a mask, and the second step, which is etching using the single-particle film FL constituted of the large-diameter particles SL as a mask, are carried out simultaneously.

In the small-diameter particle film forming step, the single-particle film FS constituted of the small-diameter particles SS is formed on the light emitting structure formation surface 11S. In the large-diameter particle film forming step, the single-particle film FL constituted of the large-diameter particles SL is layered upon the single-particle film FS constituted of the small-diameter particles SS.

In the etching steps, the light emitting structure formation surface 11S is etched using the single-particle film FL as a mask, and the light emitting structure formation surface 11S is etched at locations between mutually-adjacent large-diameter particles SL using the single-particle film FS as a mask. The steps of the method for manufacturing a substrate for semiconductor light emitting elements will be described below in the order of the processes carried out.

As illustrated in FIG. 36, first, in the small-diameter particle film forming step, the single-particle film FS constituted by the single layer of small-diameter particles SS is formed on the light emitting structure formation surface 11S. In the small-diameter particle film forming step, the same method as the single-particle film forming method described as an example in the fourth embodiment is used to form the single-particle film FS on the light emitting structure formation surface 11S. The particle diameter, material, and the like of the small-diameter particles SS are the same as the particle diameter, material, and the like described as examples in the fourth embodiment. When the light emitting structure formation surface 11S is viewed in plan view, the single-particle film FS has a hexagonally-packed structure in which the small-diameter particles SS are closely packed two-dimensionally.

Next, in the large-diameter particle film forming step, the single-particle film FL constituted of a single layer of the large-diameter particles SL is layered upon the single-particle film FS. In the large-diameter particle film forming step, the same method as the single-particle film forming method described as an example in the fourth embodiment is used to form the single-particle film FL on the light emitting structure formation surface 11S. The particle diameter, material, and the like of the large-diameter particles SL are the same as the particle diameter, material, and the like described as examples in the fourth embodiment. In the large-diameter particle film forming step, the same method as the single-particle film forming method described as an example in the fourth embodiment is used to layer the single-particle film FL upon the single-particle film FS. The particle diameter, material, and the like of the large-diameter particles SL are the same as the particle diameter, material, and the like described as examples in the fourth embodiment. When the light emitting structure formation surface 11S is viewed in plan view, the single-particle film FL has a hexagonally-packed structure in which the large-diameter particles SL are closely packed two-dimensionally.

By layering the two single-particle films FS and FL, the light emitting structure formation surface 11S is divided into parts covered by the large-diameter particles SL, parts covered by the small-diameter particles SS at the gaps between mutually-adjacent large-diameter particles SL, and parts that are covered by neither the particles SS nor SL.

As illustrated in FIG. 37, in the etching step, first, the single-particle film FS and the single-particle film FL are preferably etched under etching conditions in which the element substrate 11 remains substantially unetched. As a result, the particle diameter of the large-diameter particles SL that constitute the single-particle film FL is reduced, and new gaps are formed between mutually-adjacent large-diameter particles SL. At this time, etching through the gaps between mutually-adjacent large-diameter particles SL also reduces the particle diameter of the small-diameter particles SS that constitute the single-particle film FS, and new gaps are formed between mutually-adjacent small-diameter particles SS. As a result, the light emitting structure formation surface 11S is etched using the reduced-diameter large-diameter particles SL and the reduced-diameter small-diameter particles SS as a mask.

Next, the etching of the element substrate 11, the single-particle film FS, and the single-particle film FL progresses under the etching conditions in which those respective elements are etched. At this time, the light emitting structure formation surface 11S is exposed to the etching gas, which acts as an etchant, through the gaps between the mutually-adjacent small-diameter particles SS, and the small-diameter particles SS that constitute the single-particle film FS are also exposed to the etching gas, which acts as an etchant. The etching of the light emitting structure formation surface 11S progresses earlier at parts thereof that are further from the center of the small-diameter particles SS. This etching progresses faster the further the part being etched is from the center of the large-diameter particles SL. Then, as the small-diameter particles SS are etched away, regions that oppose the centers of the small-diameter particles SS are also etched.

In the light emitting structure formation surface 11S, the small-diameter particles SS are etched away fastest in the centers of mutually-adjacent large-diameter particles SL, as illustrated in FIG. 38. The etching is stopped before the large-diameter particles SL are etched away.

At this time, the centers between mutually-adjacent large-diameter particles SL are exposed to the etching gas for a particularly long period of time, and thus the etching progresses more quickly after the small-diameter particles SS have been etched away. In such regions, a step formed by the mask of the small-diameter particles SS is etched away while the etching of the large-diameter particles SL proceeds, and thus the regions become flat. The flat part 14 is formed in the centers between mutually-adjacent large-diameter particles SL in the light emitting structure formation surface 11S as a result.

On the other hand, the peripheries of the flat part 14 are exposed to the etching gas for a shorter period of time than the flat part 14, and furthermore, areas closer to the centers of the large-diameter particles SL are exposed to the etching gas for a shorter period of time. As a result of this difference in the degrees to which the etching progresses, the large-diameter projections 22, which have a truncated cone shape and project from the flat part 14, are formed in the areas surrounding the flat part 14. The pitch PL of the large-diameter projections 22 is the same as the interval between mutually-adjacent large-diameter particles SL in the single-particle film FL, and the arrangement of the large-diameter projections 22 is also the same as the arrangement of the large-diameter particles SL.

Meanwhile, the small-diameter projections 13 having a hemispherical shape with the apex at the areas that oppose the centers of the small-diameter particles SS are formed in the outside surfaces of the large-diameter projections 22. As described above, the outside surfaces of the large-diameter projections 22 become sloped due to the difference in the degrees to which the etching progresses, and thus the shapes of the small-diameter projections 13 extend along those slopes. As a result, the widths of the small-diameter projections 13 increase as the large-diameter projections 22 progress from the tips to the bases thereof. In the light emitting structure formation surface 11S, the same flat surface as was present before the etching steps remains in the areas covered by the reduced-size large-diameter particles SL.

Note that in the fifth embodiment, etching using the single-particle film FS constituted of the small-diameter particles SS as a mask and etching using the single-particle film FL constituted of the large-diameter particles SL are carried out simultaneously. As such, the large-diameter particles SL continue to ensure the tips of the large-diameter projections 22 remain flat while the small-diameter projections 13 are being formed through the etching that uses the small-diameter particles SS as a mask. Therefore, projections that are large enough as the small-diameter projections 13 are formed even if the particle diameter of the small-diameter particles SS is not between 1/10 and 1/3 the particle diameter of the large-diameter particles SL as in the fourth embodiment.

As described thus far, the substrate for semiconductor light emitting elements according to the tenth modified example is manufactured through the manufacturing method according to the fifth embodiment.

Note that in the etching step, the etching of the light emitting structure formation surface 11S may be stopped when the steps formed by using the small-diameter particles SS as a mask are etched away from the flat part 14 and the reduced-diameter small-diameter particles SS remain in the outer circumferential surfaces of the large-diameter projections 22. In this case, the small-diameter projections 23 having a truncated cone shape remain in the regions opposing the reduced-diameter small-diameter particles SS. The substrate for semiconductor light emitting elements according to the eleventh modified example is manufactured through such a manufacturing method.

Here, to etch away the step formed using the small-diameter particles SS as a mask from the flat part 14, it is necessary to etch the flat part 14 sufficiently at the step formed using the small-diameter particles SS as a mask. Under such etching conditions, it is easier for the small-diameter particles SS that function as a mask for the first level of the small-diameter projections 23 to be etched away along with the step in the flat part 14. On the other hand, the small-diameter particles SS that function as a mask for the second level of small-diameter projections 23 are more difficult to etch away than the small-diameter particles SS that function as a mask for the first level of small-diameter projections 23. Therefore, it is preferable that, of the small-diameter projections 23, the second level of small-diameter projections 23 have a truncated cone shape, and that the first level of small-diameter projections 23 have a conical shape, as described in the eleventh modified example. Such a configuration makes it possible to reduce restrictions with respect to the etching conditions for forming the small-diameter projections 23. Likewise, in a configuration that includes three or more levels of small-diameter projections 23, it is preferable that the small-diameter projections 23 have more a conical shape the smaller the level where that small-diameter projection 23 is located is.

Furthermore, in the etching step, the etching of the light emitting structure formation surface 11S may be stopped after the small-diameter particles SS have been etched away and while the step formed using the small-diameter particles SS as a mask remains in the flat part 14. In this case, the small-diameter projections 13 remain in the regions of the light emitting structure formation surface 11S that oppose the small-diameter particles SS. The substrate for semiconductor light emitting elements according to the fourth modified example is manufactured through such a manufacturing method.

Furthermore, in the etching step, the etching of the light emitting structure formation surface 11S may be stopped before the small-diameter particles SS are etched away. In this case, the regions of the light emitting structure formation surface 11S that oppose the small-diameter particles SS have a truncated cone shape. The substrate for semiconductor light emitting elements according to the fifth modified example is manufactured through such a manufacturing method. At this time, to ensure the large-diameter projections 22 are formed, it is necessary for small-diameter particles SS to be etched to a suitably greater extent than the large-diameter particles SL. Under such etching conditions, it is easier for the small-diameter particles SS that function as a mask for the first level of the small-diameter projections 23, the small-diameter particles SS that function as a mask for the small-diameter projections 23 that project from the flat part 14, and the like to be etched away by the etching of the large-diameter particles SL. On the other hand, the small-diameter particles SS that function as a mask for the second level of small-diameter projections 13 are more difficult to etch away than the small-diameter particles SS that function as a mask for the first level of small-diameter projections 23. Therefore, it is preferable that, of the small-diameter projections 23, the second level of small-diameter projections 23 have a truncated cone shape, and that the first level of small-diameter projections 23 have a conical shape, as described in the fifth modified example. Such a configuration makes it possible to reduce restrictions with respect to the etching conditions for forming the small-diameter projections 23. Likewise, in a configuration that includes three or more levels of small-diameter projections 23, it is preferable that the small-diameter projections 23 have more a conical shape the smaller the level where that small-diameter projection 23 is located is.

As with the method described as the manufacturing method for the sixth modified example, in the etching step, of the regions in the light emitting structure formation surface 11S, using the difference in the degrees to which etching progresses between regions that oppose a gap between mutually-adjacent large-diameter particles SL and regions that oppose the vicinity of the outside surfaces of the large-diameter particles SL prior to the large-diameter particles SL being reduced in size enables the bridge portions 15 to be formed.

Note that a binder for fixing the small-diameter particles SS may be applied to the single-particle film FS before layering the single-particle film FL on the single-particle film FS to prevent the small-diameter particles SS from falling from the outside surface of the large-diameter projections 22 before and during the etching. At this time, the binder for fixing the small-diameter particles SS to the light emitting structure formation surface 11S is a resin, a silane coupling agent, or the like. Such a binder may have a function for fixing the small-diameter particles SS to the light emitting structure formation surface 11S and may have a higher etching rate than that of the small-diameter particles SS.

According to the fifth embodiment as described thus far, the following effects are achieved in addition to the effects (6) and (9) achieved by the fourth embodiment.

(12) The etching using the small-diameter particles SS as a mask and the etching using the large-diameter particles SL as a mask are carried out simultaneously, and thus the number of steps in the manufacturing process can be reduced as compared to a method in which the steps of etching are carried out separately.

(13) The tips of the large-diameter projections 22 are covered by the large-diameter particles SL throughout the entire period of the light emitting structure formation surface 11S is being etched. As such, it is easy to match plane orientations between the crystal plane of the light emitting structure formation surface 11S and the crystal plane of the tips of the large-diameter projections 22.

Note that the etching using the single-particle film FS constituted of the small-diameter particles SS and the single-particle film FL constituted of the large-diameter particles SL as masks may be carried out until the large-diameter particles SL are etched away. In this case, large-diameter projections 12 having a conical shape remain in the regions that oppose the large-diameter particles SL. The substrate for semiconductor light emitting elements according to the first embodiment, the second embodiment, the first to third modifications, and the seventh to ninth modifications is manufactured through such a manufacturing method.

Meanwhile, the single-particle film FL constituted of the large-diameter particles SL may be layered upon the light emitting structure formation surface 11S, and the single-particle film FS constituted of the small-diameter particles SS may be layered upon the single-particle film FL constituted of the large-diameter particles SL. In this case, the surfaces of the large-diameter particles SL are etched using the small-diameter particles SS as a mask, and thus concavities and convexities are formed in the outside surfaces of the large-diameter particles SL themselves, which function as a mask for the light emitting structure formation surface 11S. The substrate for semiconductor light emitting elements according to the first embodiment, the second embodiment, the first to third modifications, and the seventh to ninth modifications is manufactured through such a manufacturing method as well.

Figure 39:
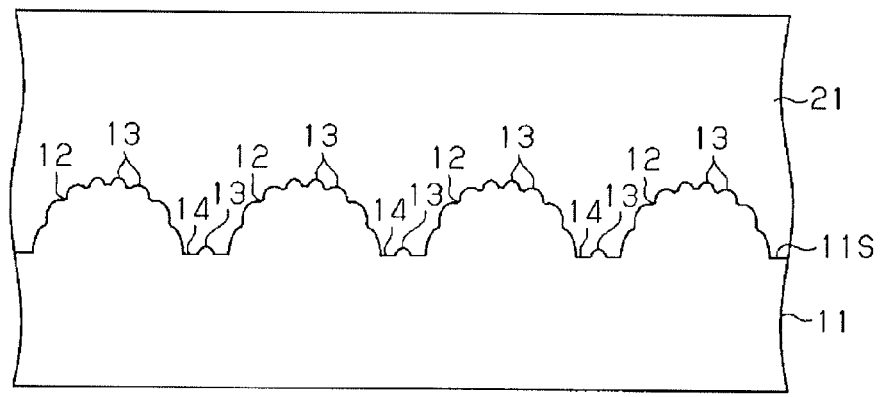
FIG. 39 is a cross-sectional view illustrating the cross-sectional configuration of a semiconductor light emitting element according to the sixth embodiment of the technique of the present disclosure.

Referring to FIG. 39, an embodiment of a semiconductor light emitting element will be described as a sixth embodiment of the technique of the present disclosure.

As illustrated in FIG. 39, the semiconductor light emitting element includes the element substrate 11 as a substrate. The substrate for semiconductor light emitting elements according to the above-described embodiments and modifications is used as the element substrate 11. The semiconductor light emitting element includes, on the light emitting structure formation surface 11S of the element substrate 11, a light emitting structure 21 that covers the recessing and protruding structure of the light emitting structure formation surface 11S. The light emitting structure 21 has a multilayer body that constituted a plurality of semiconductor layers, and emits light by recombination of carriers supplied from currents. The plurality of semiconductor layers are layered in order from the light emitting structure formation surface 11S.

It is preferable that the material that forms each of the plurality of semiconductor layers be a compound semiconductor such as GaN, InGaN, AlGaN, InAlGaN, GaAs, AlGaAs, InGaAsP, InAlGaAsP, InP, InGaAs, InAlAs, ZnO, ZnSe, or ZnS. Of these, a group III-V semiconductor whose group V element is nitrogen is preferable as the material of which each of the plurality of semiconductor layers is formed.

It is preferable that the functions of the plurality of semiconductor layers include n-type conductivity, p-type conductivity, and activation that recombines carriers. The multilayer structure of the plurality of semiconductor layers may be a double heterostructure in which an active layer is interposed between an n-type semiconductor layer and a p-type semiconductor layer, or may be a multiple quantum well structure in which a plurality of quantum well structures are layered.

The plurality of semiconductor layers may include a buffer layer. The buffer layer is layered upon the light emitting structure formation surface 11S, and causes the crystalline properties of the light emitting structure formation surface 11S to extend to the other semiconductor layers aside from the buffer layer. A multilayer film formed by layering a buffer layer formed from GaN, AlN, or the like, an n-type conductive layer formed from n-GaN, n-AlGaN, or the like (a cladding layer), a light-emitting layer formed from InGaN, GaN, or the like, a p-type conductive layer formed from undoped GaN, p-GaN, or the like (a cladding layer), and a capping layer formed from Mg-doped AlGaN and Mg-doped GaN, in that order, can be given as a specific example of the configuration of the semiconductor layers.

The semiconductor light emitting element may include a wavelength conversion layer. The wavelength conversion layer is layered upon the upper surface of the light-emitting element where light is obtained, and adjusts the wavelength of light generated in the active layer. For example, when the light generated in the active layer contains a large amount of light in the ultraviolet range, the wavelength conversion layer converts the light in the ultraviolet range into white light suitable for illumination. Such a wavelength conversion layer includes a blue phosphor that emits fluorescent light at a peak wavelength of 410 to 483 nm, a green phosphor that emits fluorescent light at a peak wavelength of 490 to 556 nm, and a red phosphor that emits fluorescent light at a peak wavelength of 585 to 770 nm. Meanwhile, when the light generated in the active layer contains a large amount of light in the blue range, the wavelength conversion layer converts the light in the blue range into white light suitable for illumination. Such a wavelength conversion layer includes a yellow phosphor that emits fluorescent light at a peak wavelength of 570 to 578.

An embodiment of a method for manufacturing a semiconductor light emitting element will be described as a seventh embodiment of the technique of the present disclosure.

The method for manufacturing a semiconductor light emitting element includes a step of manufacturing the element substrate 11 through the method for manufacturing a substrate for semiconductor light emitting elements according to the above-described embodiments, and a step of forming the light emitting structure 21 on the light emitting structure formation surface 11S of the element substrate 11.

Epitaxial growth, reactive sputtering, and the like can be given as examples of methods for forming the compound semiconductor layer in the light emitting structure 21. Epitaxial growth includes vapor phase epitaxial growth, liquid phase epitaxial growth, molecular beam epitaxial growth, and the like. In reactive sputtering, a target formed from the constituent elements of the compound semiconductor layer is sputtered, and the materials of the semiconductor layers are produced through a reaction between the particles sputtered from the target and vapor-phase impurity elements.

Any epitaxial growth, reactive sputtering, or the like that adds n-type impurities can be used as the method for forming the n-type semiconductor layer. Any epitaxial growth, reactive sputtering, or the like that adds p-type impurities can be used as the method for forming the p-type semiconductor layer.

In liquid phase epitaxial growth, a supersaturated solution containing the material for forming the compound semiconductor layer is held in equilibrium between a solid phase and a liquid phase, during which time the material for forming the compound semiconductor layer is grown as crystals on the light emitting structure formation surface 11S. In vapor phase epitaxial growth, an atmosphere in which a source gas flows produces the compound semiconductor layer formation material, which is then caused to grow as crystals on the light emitting structure formation surface 11S. In molecular beam epitaxial growth, the light emitting structure formation surface 11S is irradiated with molecular or atomic beams of the constituent element of the compound semiconductor layer, which causes the compound semiconductor layer formation material to grow as crystals on the light emitting structure formation surface 11S. Of these, halide vapor phase growth using a hydride such as $AsH_3$ or $PH_3$ as the group V source is preferable in view of a greater thickness being obtained for the compound semiconductor layer that is grown.

The above-described substrate for semiconductor light emitting elements, semiconductor light emitting element, and manufacturing methods thereof will be described hereinafter using specific working examples.

First Working Example: Manufacture of Semiconductor Light Emitting Element (Small-Diameter Projections Present in Flat Part, Conical Shape for Large-Diameter Projections, Conical Shape for Small-Diameter Projections)

The small-diameter particle step was carried out after the large-diameter particle step to obtain a substrate for semiconductor light emitting elements and a semiconductor light emitting element according to the first working example. The manufacturing method is described in detail below.

A sapphire substrate 2 inches in diameter and 0.42 mm thick was coated with a single layer of ϕ1.0 μm $SiO_2$ colloidal silica particles using a single-layer coating method disclosed in WO 2008/001670.

Specifically, a 3.0 wt % spherical colloidal silica water dispersion (dispersion liquid) with $SiO_2$ colloidal silica particles having an average particle diameter of 1.02 μm (particle diameter coefficient of variation=2.69%) was prepared.

Next, brominated hexadecyl trimethyl ammonium (a surfactant) at a concentration of 50 wt % was added to the dispersion to 2.5 mmol/L and agitated for thirty minutes so as to cause the surfaces of the colloidal silica particles to absorb the brominated hexadecyl trimethyl ammonium. At this time, the dispersion and the brominated hexadecyl trimethyl ammonium were mixed so that the mass of the brominated hexadecyl trimethyl ammonium became 0.04 times the mass of the colloidal silica particles.

Next, the same volume of chloroform as the volume of the dispersion was added to the dispersion and thoroughly agitated, and hydrophobized colloidal silica was obtained through oil phase extraction.

A hydrophobic colloidal silica dispersion at a concentration of 1.5 wt % obtained as a result was dripped at a drip rate of 0.01 ml/sec onto a liquid surface (using water as the lower-layer water, at a temperature of 25° C.) in a water tank provided with a surface pressure sensor that measures the surface pressure of a single-particle film and a movable barrier that compresses the single-particle film in a direction that follows the liquid surface (that is, an LB trough device). Note that the stated sapphire substrate was already immersed in the lower-layer water of the water tank.

During the dripping, ultrasound waves (output: 120 W; frequency: 1.5 MHz) were emitted toward the water surface from the lower-layer water, evaporating the chloroform serving as the solvent of the dispersion while keeping the particles closely packed two-dimensionally, thus forming the single-particle film.

Next, the single-particle film was compressed to a diffusion pressure of 18 $mNm^{-1}$ by the movable barrier, and the sapphire substrate was raised at a rate of 5 mm/min, thus transferring the single-particle film to one surface of the substrate and obtaining a sapphire substrate having a single-particle film etching mask constituted of colloidal silica.

The sapphire substrate obtained in this manner was then processed through dry etching. Specifically, the $SiO_2$ mask/sapphire substrate were dry etched in $Cl_2$ gas at an antenna power of 1,500 W, a bias of 300 W, and a pressure of 1 Pa to obtain a sapphire substrate having a plurality of large-diameter base projections (conical shapes).

The base projections had a modal pitch of 1.0 μm, a structural height of 0.4 μm, and a flat part distance of 0.22 μm.

Next, using $SiO_2$ colloidal silica particles having an average particle diameter of 305 nm (particle diameter coefficient of variation=3.4%), the sapphire substrate having the base projections was microfabricated through the same particle mask method as in the large-diameter particle step, so as to obtain the substrate for semiconductor light emitting elements according to the first working example, which is a sapphire substrate having a multilayer structure in which a plurality of small-diameter projections are provided on the large-diameter projections. The small-diameter projections near the apexes of the large-diameter projections had a modal pitch of 300 nm, a structural height of 120 nm, and a flat part distance of 60 nm.

An n-type semiconductor layer, an active layer, and a p-type semiconductor layer were formed in that order on the surface, on which the projections are formed, of the substrate for semiconductor light emitting elements obtained in this manner; p electrodes and n electrodes were then formed, thus completing the semiconductor light emitting element according to the first working example. Each GaN-type semiconductor layer was formed through the widely-used Metal Organic Chemical Vapor Deposition (MOCVD) technique. In MOCVD, ammonia gas and an alkyl compound gas such as group III trimethyl gallium, trimethyl ammonium, or trimethyl indium are supplied to the surface of the sapphire substrate in an environment at 700-1,000° C. to produce a thermal decomposition reaction, which forms the desired crystals on the substrate through epitaxial growth.

15 nm of $Al_{0.9}Ga_{0.1}N$ as a low-temperature growth buffer layer, 4.5 μm of undoped GaN, 3 μm of Si-doped GaN as an n cladding layer, and 250 nm of undoped GaN were layered in that order as the n-type semiconductor layer.

As the active layer, multiple quantum wells for increasing the internal quantum efficiency were formed between several narrow band gap layers for increasing the rate of recombination. For this, 4 nm of undoped $In_{0.15}Ga_{0.85}N$ (a quantum well layer) and 10 nm of Si-doped GaN (a barrier layer) were formed in an alternating manner and layered so that there were nine layers of the undoped $In_{0.15}Ga_{0.85}N$ and ten layers of the Si-doped GaN.

15 nm of Mg-doped AlGaN, 200 nm of undoped GaN, and 15 nm of Mg-doped GaN were layered as the p-type semiconductor layer.

The region where the n electrode was to be formed was etched away from the Mg-doped GaN of the p-type semiconductor layer, which is the uppermost layer, to the undoped GaN of the n-type semiconductor layer, thus exposing the Si-doped GaN layer. An n electrode constituted of Al and W was formed on the exposed surface, and an n pad electrode constituted of Pt and Au was then formed upon the n electrode.

A p electrode constituted of Ni and Au was formed across the entire surface of the p-type semiconductor layer, and a p pad electrode constituted of Au was formed upon the p electrode.

A semiconductor element in a bare chip state (where the size of a single element is 300 μm×350 μm) was formed through this process.

Figure 40:
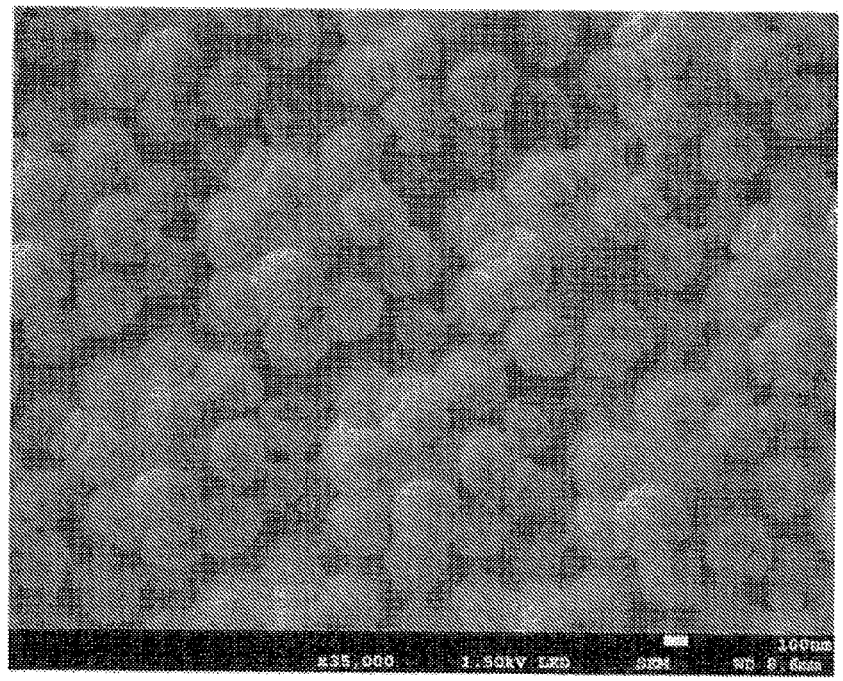
FIG. 40 is a micrograph, taken by a scanning type electron microscope, of a substrate for semiconductor light emitting elements according to a first working example, and is an image of the substrate for semiconductor light emitting elements taken from a direction orthogonal to the substrate.
Figure 41:
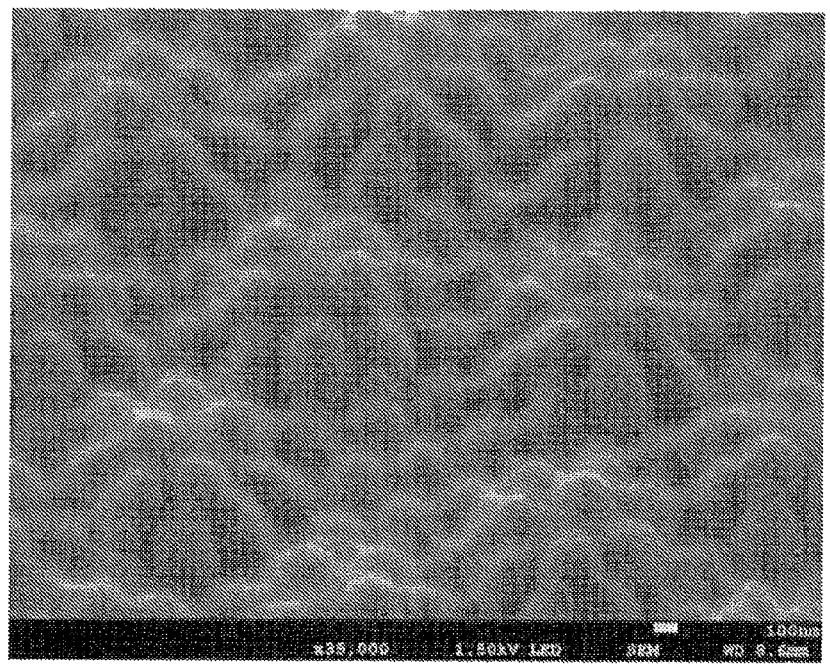
FIG. 41 is a micrograph, taken by a scanning type electron microscope, of the substrate for semiconductor light emitting elements according to the first working example, and is an image of the substrate for semiconductor light emitting elements taken at an angle thereto.

FIGS. 40 and 41 are micrographs, taken by a scanning type electron microscope, of the substrate for semiconductor light emitting elements according to the first working example. As illustrated in FIGS. 40 and 41, according to the first working example, conical-shaped large-diameter projections and small-diameter projections are formed on an upper surface of the substrate for semiconductor light emitting elements. Furthermore, the small-diameter projections are formed on the outside surfaces of the large-diameter projections and the flat part.

Second Working Example: Manufacture of Semiconductor Light Emitting Element (Small-Diameter Projections Present in Flat Part, Truncated Cone Shape for Large-Diameter Projections, Conical Shape for Small-Diameter Projections)

The small-diameter particle step was carried out after the large-diameter particle step to obtain a substrate for semiconductor light emitting elements and a semiconductor light emitting element according to the second working example. The manufacturing method is described in detail below.

A sapphire substrate 2 inches in diameter and 0.42 mm thick was coated with a single layer of φ3.0 μm $SiO_2$ colloidal silica particles using the single-layer coating method disclosed in WO 2008/001670.

Specifically, a 3.0 wt % spherical colloidal silica water dispersion (dispersion liquid) with $SiO_2$ colloidal silica particles having an average particle diameter of 3.02 μm (particle diameter coefficient of variation=0.85%) was prepared.

Next, brominated hexadecyl trimethyl ammonium (a surfactant) at a concentration of 50 wt % was added to the dispersion to 2.5 mmol/L and agitated for thirty minutes so as to cause the surfaces of the colloidal silica particles to absorb the brominated hexadecyl trimethyl ammonium. At this time, the dispersion and the brominated hexadecyl trimethyl ammonium were mixed so that the mass of the brominated hexadecyl trimethyl ammonium became 0.04 times the mass of the colloidal silica particles.

Next, the same volume of chloroform as the volume of the dispersion was added to the dispersion and thoroughly agitated, and hydrophobized colloidal silica was obtained through oil phase extraction.

A hydrophobic colloidal silica dispersion at a concentration of 1.5 wt % obtained as a result was dripped at a drip rate of 0.01 ml/sec onto a liquid surface (using water as the lower-layer water, at a temperature of 25° C.) in a water tank provided with a surface pressure sensor that measures the surface pressure of a single-particle film and a movable barrier that compresses the single-particle film in a direction that follows the liquid surface (that is, an LB trough device). Note that the stated sapphire substrate was already immersed in the lower-layer water of the water tank.

During the dripping, ultrasound waves (output: 120 W; frequency: 1.5 MHz) were emitted toward the water surface from the lower-layer water, evaporating the chloroform serving as the solvent of the dispersion while keeping the particles closely packed two-dimensionally, thus forming the single-particle film.

Next, the single-particle film was compressed to a diffusion pressure of 18 mNm$^{-1}$ by the movable barrier, and the sapphire substrate was raised at a rate of 5 mm/min, thus transferring the single-particle film to one surface of the substrate and obtaining a sapphire substrate having a single-particle film etching mask constituted of colloidal silica.

The sapphire substrate obtained in this manner was then processed through dry etching. Specifically, the $SiO_2$ mask/ sapphire substrate were dry etched in $Cl_2$ gas at an antenna power of 1,500 W, a bias of 300 W, and a pressure of 1 Pa. The conditions where then changed to an antenna power of 1,500 W, a bias of 80 W, and a pressure of 5 Pa partway through, and only the particles were dry etched in $CF_4$ gas, to obtain a sapphire substrate having large-diameter base projections (truncated cone shapes). The base projections had a modal pitch of 3 μm, a structural height of 0.7 μm, and a flat part distance of 0.3 μm.

Next, using $SiO_2$ colloidal silica particles having an average particle diameter of 403 nm (particle diameter coefficient of variation=3.1%), the sapphire substrate having the base projections was microfabricated through the same particle mask method as in the small-diameter particle step according to the first working example, so as to obtain the substrate for semiconductor light emitting elements according to the second working example, which is a sapphire substrate having a multilayer structure in which a plurality of small-diameter projections are provided on the large-diameter projections. The small-diameter projections near the apexes of the large-diameter projections had a modal pitch of 400 nm, a structural height of 160 nm, and a flat part distance of 80 nm.

An n-type semiconductor layer, an active layer, and a p-type semiconductor layer, these layers having the same configuration as in the first working example, were formed in that order on the surface, on which the projections are formed, of the substrate for semiconductor light emitting elements obtained in this manner; p electrodes and n electrodes were then formed, thus completing the semiconductor light emitting element according to the second working example (where the size of a single element is 300 μm×350 μm).

Figure 42:
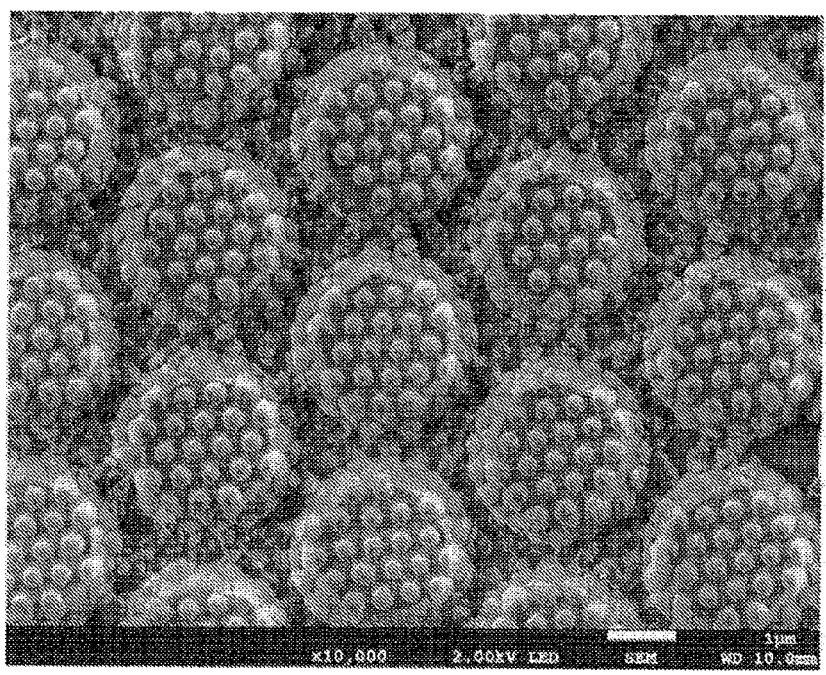
FIG. 42 is a micrograph, taken by a scanning type electron microscope, of a substrate for semiconductor light emitting elements according to a second working example, and is an image of the substrate for semiconductor light emitting elements taken from a direction orthogonal to the substrate.
Figure 43:
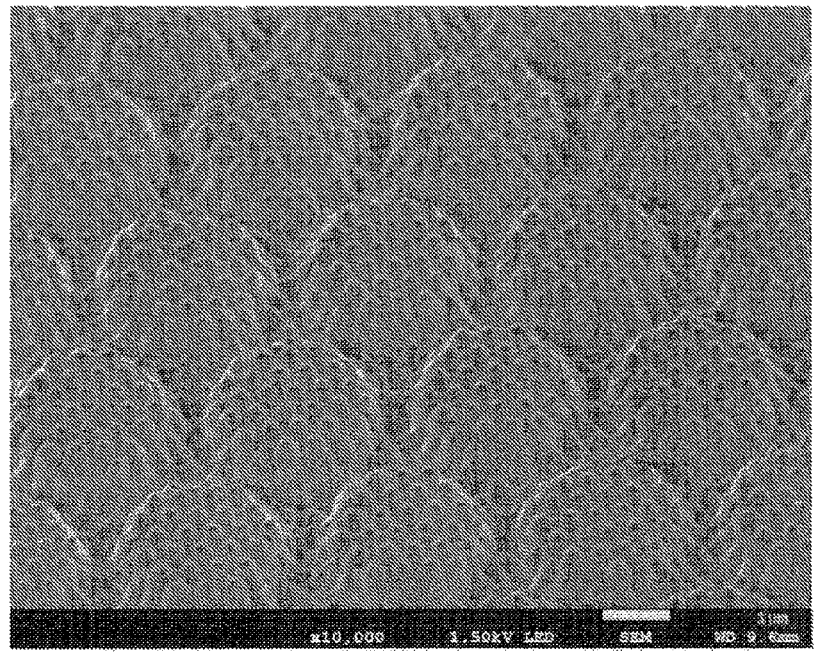
FIG. 43 is a micrograph, taken by a scanning type electron microscope, of the substrate for semiconductor light emitting elements according to the second working example, and is an image of the substrate for semiconductor light emitting elements taken at an angle thereto.

FIGS. 42 and 43 are micrographs, taken by a scanning type electron microscope, of the substrate for semiconductor light emitting elements according to the second working example. As illustrated in FIGS. 42 and 43, according to the second working example, truncated cone-shaped large-diameter projections and conical small-diameter projections are formed on an upper surface of the substrate for semiconductor light emitting elements. Furthermore, the small-diameter projections are formed on the outside surfaces of the large-diameter projections and the flat part.

Third Working Example: Manufacture of Semiconductor Light Emitting Element (Small-Diameter Projections not Present in Flat Part, Conical Shape for Large-Diameter Projections, Conical Shape for Small-Diameter Projections)

The large-diameter particle step was carried out after the small-diameter particle step to obtain a substrate for semiconductor light emitting elements and a semiconductor light emitting element according to the third working example. The manufacturing method is described in detail below.

Using $SiO_2$ colloidal silica particles having an average particle diameter of 403 nm (particle diameter coefficient of variation=3.1%), the surface of a sapphire substrate 2 inches in diameter and 0.42 mm thick was microfabricated through the same particle mask method as in the small-diameter particle step according to the second working example. Next, using $SiO_2$ colloidal silica particles having an average particle diameter of 3.02 μm (particle diameter coefficient of variation=0.85%), the sapphire substrate having a plurality of small-diameter base projections was microfabricated, using the same particle mask method as in the large-diameter particle step according to the second working example with the exception of the etching carried out until the particle mask is etched away. The substrate for semiconductor light emitting elements according to the third working example, which is a sapphire substrate having a multilayer structure in which a plurality of small-diameter projections are provided on the large-diameter projections, was obtained as a result. The large-diameter projections had a conical shape, with a modal pitch of 3.0 μm, a structural height of 1.5 μm, and a flat part distance of 0.5 μm.

An n-type semiconductor layer, an active layer, and a p-type semiconductor layer, there layers having the same configuration as in the first working example, were formed in that order on the surface, on which the projections are formed, of the substrate for semiconductor light emitting elements obtained in this manner; p electrodes and n electrodes were then formed, thus completing the semiconductor light emitting element according to the third working example (where the size of a single element is 300 μm×350 μm).

Figure 44:
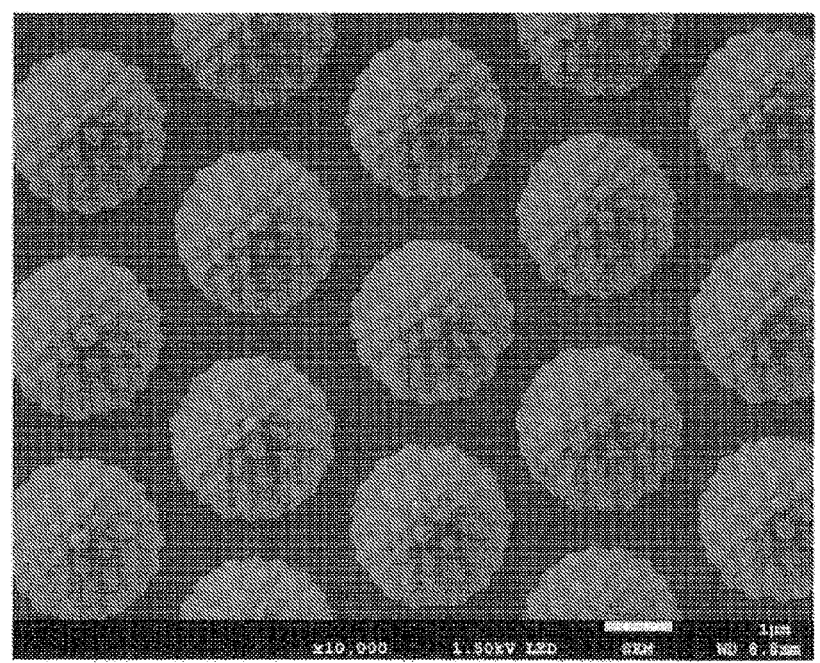
FIG. 44 is a micrograph, taken by a scanning type electron microscope, of a substrate for semiconductor light emitting elements according to a third working example, and is an image of the substrate for semiconductor light emitting elements taken from a direction orthogonal to the substrate.
Figure 45:
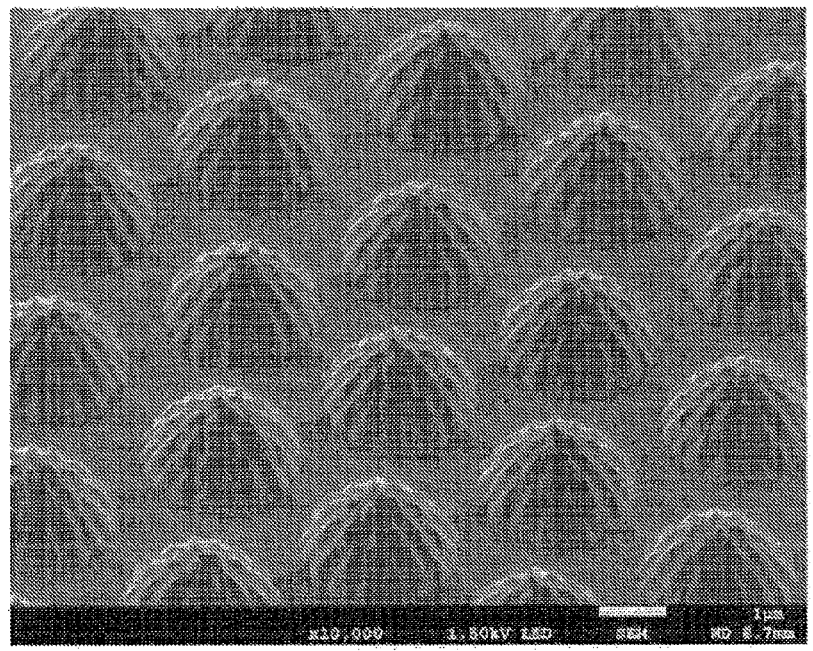
FIG. 45 is a micrograph, taken by a scanning type electron microscope, of the substrate for semiconductor light emitting elements according to the third working example, and is an image of the substrate for semiconductor light emitting elements taken at an angle thereto.

FIGS. 44 and 45 are micrographs, taken by a scanning type electron microscope, of the substrate for semiconductor light emitting elements according to the third working example. As illustrated in FIGS. 44 and 45, according to the third working example, conical-shaped large-diameter projections and small-diameter projections are formed on an upper surface of the substrate for semiconductor light emitting elements. Furthermore, the small-diameter projections are formed only on the outside surfaces of the large-diameter projections. Meanwhile, bridge portions were formed on the upper surface of the substrate for semiconductor light emitting elements.

Fourth Working Example: Manufacture of Semiconductor Light Emitting Element (Small-Diameter Projections not Present in Flat Part, Truncated Cone Shape for Large-Diameter Projections, Conical Shape for Small-Diameter Projections)

The large-diameter particle step was carried out after the small-diameter particle step to obtain a substrate for semiconductor light emitting elements and a semiconductor light emitting element according to the fourth working example. The manufacturing method is described in detail below.

Using SiO$_2$ colloidal silica particles having an average particle diameter of 403 nm (particle diameter coefficient of variation=3.1%), the surface of a sapphire substrate 2 inches in diameter and 0.42 mm thick was microfabricated through the same particle mask method as in the small-diameter particle step according to the second working example. Next, using SiO$_2$ colloidal silica particles having an average particle diameter of 3.02 µm (particle diameter coefficient of variation=0.85%), the sapphire substrate having a plurality of small-diameter base projections was microfabricated, using the same particle mask method as in the large-diameter particle step according to the second working example. The substrate for semiconductor light emitting elements according to the fourth working example, which is a sapphire substrate having a multilayer structure in which a plurality of small-diameter projections are provided on the large-diameter projections, was obtained as a result. The large-diameter projections had a truncated cone shape.

An n-type semiconductor layer, an active layer, and a p-type semiconductor layer, these layers having the same configuration as in the first working example, were formed in that order on the surface, on which the projections are formed, of the substrate for semiconductor light emitting elements obtained in this manner; p electrodes and n electrodes were then formed, thus completing the semiconductor light emitting element according to the fourth working example (where the size of a single element is 300 µm×350 µm).

Figure 46:
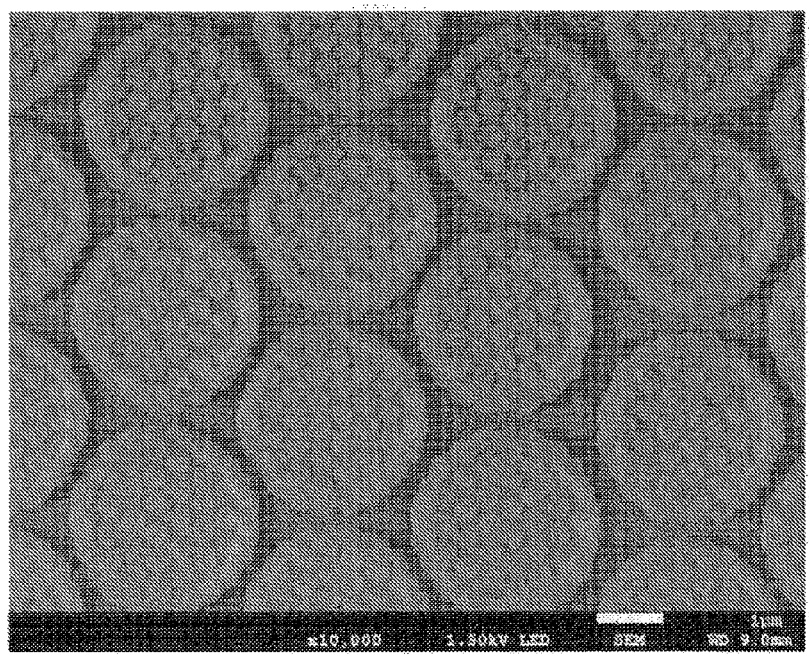
FIG. 46 is a micrograph, taken by a scanning type electron microscope, of a substrate for semiconductor light emitting elements according to a fourth working example, and is an image of the substrate for semiconductor light emitting elements taken from a direction orthogonal to the substrate.
Figure 47:
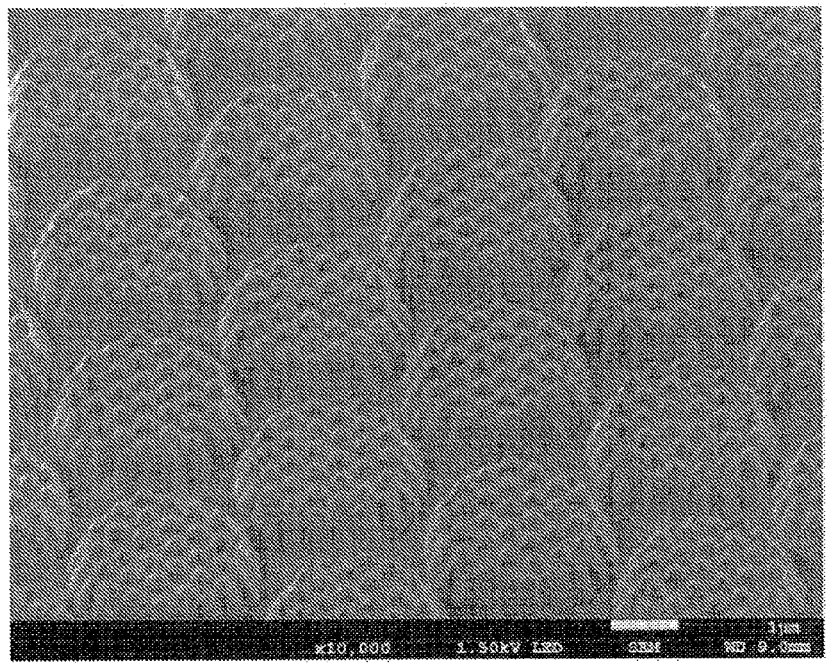
FIG. 47 is a micrograph, taken by a scanning type electron microscope, of the substrate for semiconductor light emitting elements according to the fourth working example, and is an image of the substrate for semiconductor light emitting elements taken at an angle thereto.

FIGS. 46 and 47 are micrographs, taken by a scanning type electron microscope, of the substrate for semiconductor light emitting elements according to the fourth working example. As illustrated in FIGS. 46 and 47, according to the fourth working example, truncated cone-shaped large-diameter projections and conical small-diameter projections are formed on the upper surface of the substrate for semiconductor light emitting elements. Furthermore, the small-diameter projections are formed only on the outside surfaces of the large-diameter projections. Meanwhile, bridge portions were formed on the upper surface of the substrate for semiconductor light emitting elements.

Fifth Working Example: Manufacture of Semiconductor Light Emitting Element (Small-Diameter Projections not Present in Flat Part, Truncated Cone Shape with Flat Surface on Tips for Large-Diameter Projections, Conical Shape for Small-Diameter Projections)

The first step, which is etching using the single-particle film FS constituted of the small-diameter particles SS as a mask, and the second step, which is etching using the single-particle film FL constituted of the large-diameter particles SL, were carried out simultaneously in order to obtain the substrate for semiconductor light emitting elements and the semiconductor light emitting element according to the fifth working example. The manufacturing method is described in detail below.

Using SiO$_2$ colloidal silica particles having an average particle diameter of 395 nm (particle diameter coefficient of variation=3.02%), the single-particle film FS was obtained by forming the single-particle film FS through the same method as in the first working example on the surface of a sapphire substrate 2 inches in diameter and 0.42 mm thick.

Next, using SiO$_2$ colloidal silica particles having an average particle diameter of 3.02 µm (particle diameter coefficient of variation=1.66%), the single-particle film FL was obtained by forming the single-particle film FL through the same method as in the first working example on the sapphire substrate on which the single-particle film FS was formed.

The sapphire substrate obtained in this manner was then dry etched using the single-particle films FS and FL as masks, and the etching was terminated before the large-diameter particles SL were etched away. Specifically, the SiO$_2$ mask/sapphire substrate were dry etched in Cl$_2$ gas at an antenna power of 1,500 W, a bias of 300 W, and a pressure of 1 Pa. The bias was changed to 80 W and the pressure was changed to 5 Pa partway through the etching, and only the particles were dry etched in CF$_4$ gas, to obtain the substrate for semiconductor light emitting elements according to the fifth working example. The large-diameter projections had a truncated cone shape, and the tips of the large-diameter projections had flat surfaces.

An n-type semiconductor layer, an active layer, and a p-type semiconductor layer, there layers having the same configuration as in the first working example, were formed in that order on the surface, on which the projections are formed, of the substrate for semiconductor light emitting elements obtained in this manner; p electrodes and n electrodes were then formed, thus completing the semiconductor light emitting element according to the fifth working example (where the size of a single element is 300 µm×350 µm).

Figure 48:
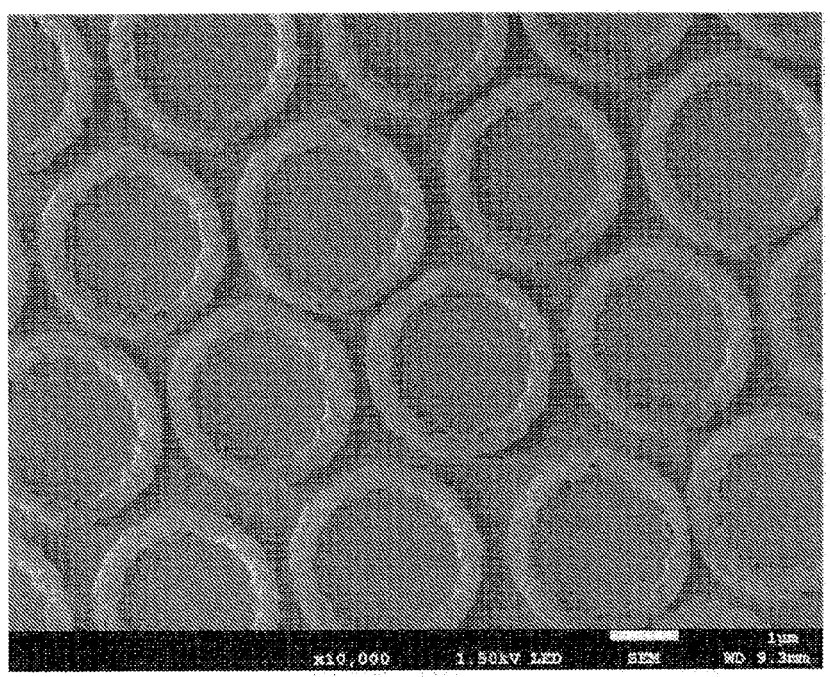
FIG. 48 is a micrograph, taken by a scanning type electron microscope, of a substrate for semiconductor light emitting elements according to a fifth working example, and is an image of the substrate for semiconductor light emitting elements taken from a direction orthogonal to the substrate.
Figure 49:
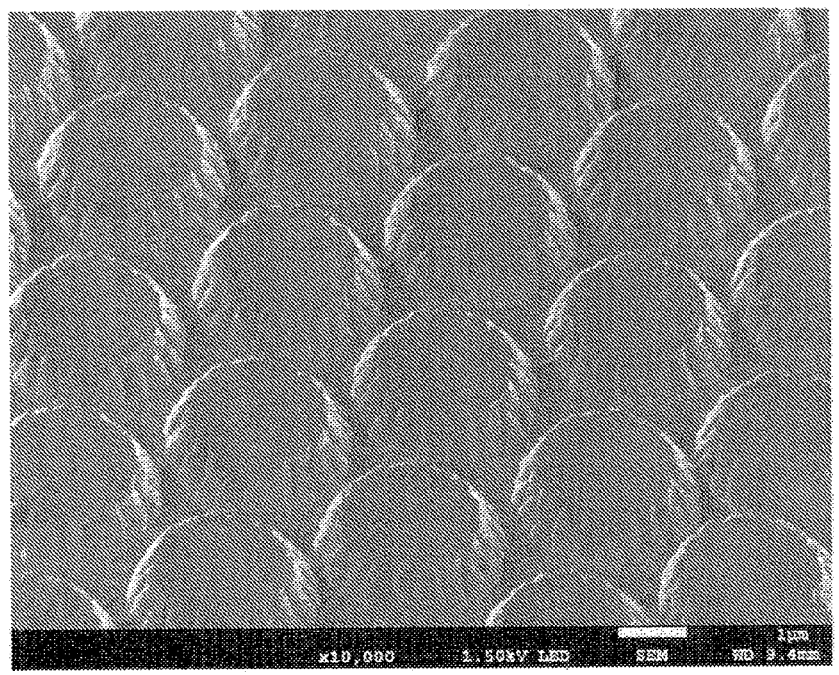
FIG. 49 is a micrograph, taken by a scanning type electron microscope, of the substrate for semiconductor light emitting elements according to the fifth working example, and is an image of the substrate for semiconductor light emitting elements taken at an angle thereto.

FIGS. 48 and 49 are micrographs, taken by a scanning type electron microscope, of the substrate for semiconductor light emitting elements according to the fifth working example. As illustrated in FIGS. 48 and 49, according to the fifth working example, truncated cone-shaped large-diameter projections having tips with flat surfaces and conical small-diameter projections are formed on the upper surface the substrate for semiconductor light emitting elements.

Sixth Working Example: Manufacture of Semiconductor Light Emitting Element (Small-Diameter Projections not Present in Flat Part, Conical Shape for Large-Diameter Projections, Conical Shape for Small-Diameter Projections)

The first step, which is etching using the single-particle film FS constituted of the small-diameter particles SS as a mask, and the second step, which is etching using the single-particle film FL constituted of the large-diameter particles SL, were carried out simultaneously in order to obtain the substrate for semiconductor light emitting elements and the semiconductor light emitting element according to the sixth working example. The manufacturing method is described in detail below.

Using SiO$_2$ colloidal silica particles having an average particle diameter of 395 nm (particle diameter coefficient of variation=3.02%), the single-particle film FS was obtained by forming the single-particle film FS through the same method as in the first working example on the surface of a sapphire substrate 2 inches in diameter and 0.42 mm thick.

Next, using SiO$_2$ colloidal silica particles having an average particle diameter of 3.02 µm (particle diameter coefficient of variation=1.66%), the single-particle film FL was obtained by forming the single-particle film FL through the same method as in the first working example on the sapphire substrate on which the single-particle film FS was formed.

The sapphire substrate obtained in this manner was then dry etched using the single-particle films FS and FL as masks, and the etching was terminated after the large-diameter particles SL were etched away. Specifically, the $SiO_2$ mask/sapphire substrate were dry etched in $Cl_2$ gas at an antenna power of 1,500 W, a bias of 300 W, and a pressure of 1 Pa to obtain the substrate for semiconductor light emitting elements according to the sixth working example. The large-diameter projections and the small-diameter projections both had a conical shape.

An n-type semiconductor layer, an active layer, and a p-type semiconductor layer, these layers having the same configuration as in the first working example, were formed in that order on the surface, on which the projections were formed, of the substrate for semiconductor light emitting elements obtained in this manner; p electrodes and n electrodes were then formed, thus completing the semiconductor light emitting element according to the sixth working example (where the size of a single element is 300 µm×350 µm).

Figure 50:
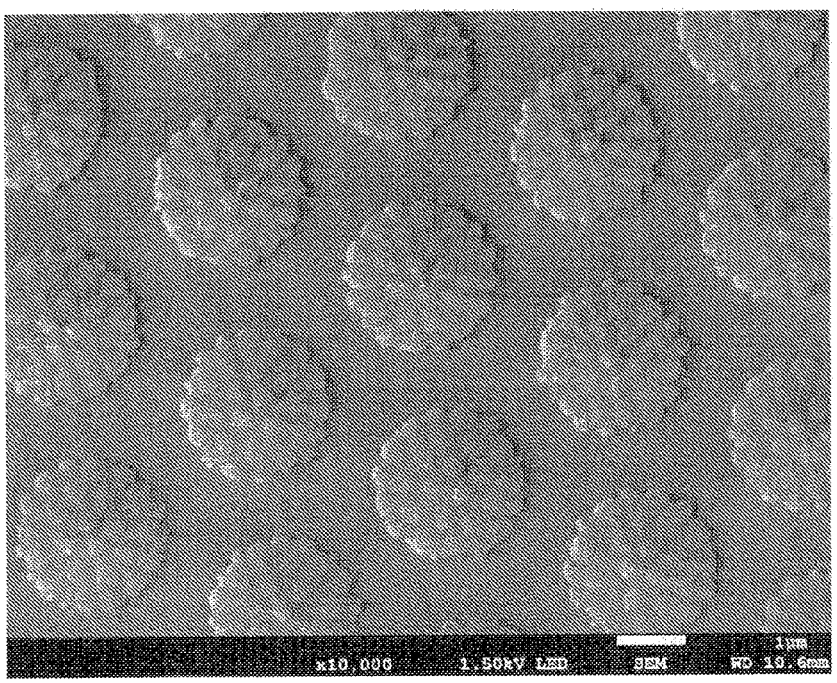
FIG. 50 is a micrograph, taken by a scanning type electron microscope, of a substrate for semiconductor light emitting elements according to a sixth working example, and is an image of the substrate for semiconductor light emitting elements taken from a direction orthogonal to the substrate.
Figure 51:
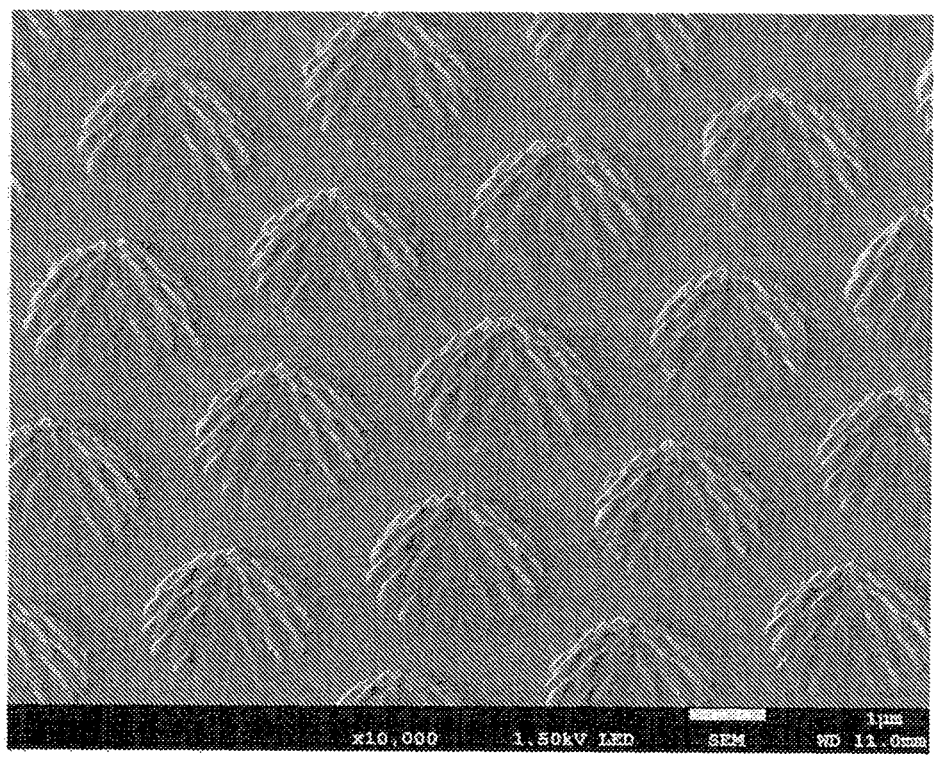
FIG. 51 is a micrograph, taken by a scanning type electron microscope, of the substrate for semiconductor light emitting elements according to the sixth working example, and is an image of the substrate for semiconductor light emitting elements taken at an angle thereto.
Figure 52:
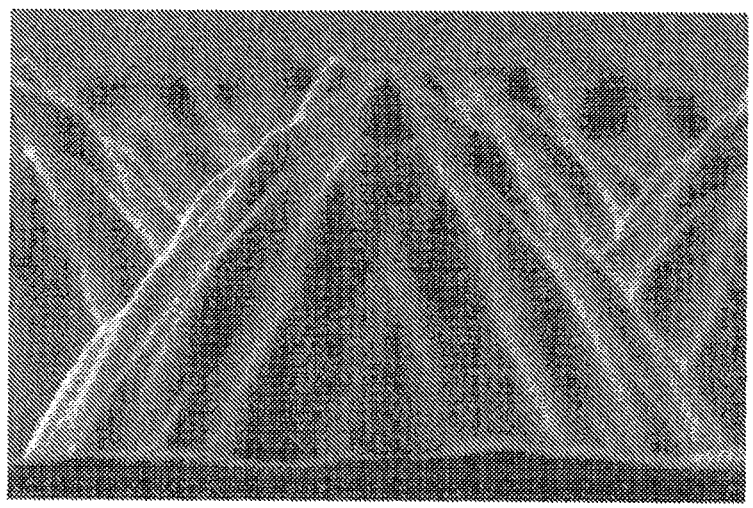
FIG. 52 is a micrograph, taken by a scanning type electron microscope, of the substrate for semiconductor light emitting elements according to the sixth working example, and is an image of the substrate for semiconductor light emitting elements taken from the front thereof.

FIGS. 50 to 52 are micrographs, taken by a scanning type electron microscope, of the substrate for semiconductor light emitting elements according to the sixth working example. As illustrated in each of FIGS. 50 to 52, according to the sixth working example, conical large-diameter projections and conical small-diameter projections are formed on the upper surface of the substrate for semiconductor light emitting elements.

First Comparative Example: Manufacture of Semiconductor Light Emitting Element (No Large-Diameter Projections, No Small-Diameter Projections)

An n-type semiconductor layer, an active layer, and a p-type semiconductor layer, these layers having the same configuration as in the first working example, were formed in that order using a sapphire substrate as the substrate, without carrying out the large-diameter particle step and the small-diameter particle step; p electrodes and n electrodes were then formed, thus completing a semiconductor light emitting element according to a first comparative example (where the size of a single element is 300 µm×350 µm).

Second Comparative Example: Manufacture of Semiconductor Light Emitting Element (Conical Large-Diameter Projections, No Small-Diameter Projections)

Using a sapphire substrate as the substrate, microfabrication was carried out through the same particle mask method as in the third working example, with the exception of the small-diameter particle step. A substrate for semiconductor light emitting elements according to the second comparative example, which is a sapphire substrate provided with a plurality of conical large-diameter projections, was obtained as a result.

An n-type semiconductor layer, an active layer, and a p-type semiconductor layer, these layers having the same configuration as in the first working example, were formed in that order on the surface, on which the projections were formed, of the substrate for semiconductor light emitting elements obtained in this manner; p electrodes and n electrodes were then formed, thus completing the semiconductor light emitting element according to the second comparative example (where the size of a single element is 300 µm×350 µm).

<Evaluation Method>

[External Quantum Efficiency]

The semiconductor light emitting elements (bare chips before being encapsulated in a resin) obtained in each of the working examples and comparative examples that were still in the form of the bare chips were mounted on a small prober (sp-0-2Ls, manufactured by ESS Tech, Inc.), and were turned on at a drive current of 20 to 40 mA using an open probe. In order to confirm the effect of improving the light extraction efficiency, the external quantum efficiency was measured using a Spectraflect integrating sphere and CDS-600-type spectroscope manufactured by Labsphere, Inc.

[Screw Dislocation Density and Edge Dislocation Density]

In GaN formed upon the substrates for semiconductor light emitting elements according to the working examples and the comparative examples, a tilt (a tilt in the crystal axis growth orientation) distribution and a twist (in-plane surface rotation of the crystal axes) distribution were evaluated through the rocking curve method using a horizontal X-ray diffractometer SmartLab, manufactured by Rigaku Corporation, and a screw dislocation density $\rho$ screw ($cm^{-2}$) and an edge dislocation density p edge ($cm^{-2}$) were found.

Note that Burgers vectors of $5.185 \times 10^{-8}$ for b screw (cm) and $3.189 \times 10^{-8}$ for b edge (cm) were used. Slit light receiving widths of 1.0 mm were used in both the tilt measurement for finding the screw dislocation density and the twist measurement for finding the edge dislocation density. A scanning angle ($\omega$) of ±5° was used for the tilt measurement and a scanning angle ($\phi$) of ±0.5° was used for the twist measurement. The measured crystal plane used a GaN (002) plane for the screw transition density and a GaN (302) plane for the edge dislocation density.

The shape characteristics of the large-diameter projections and the small-diameter projections formed on the substrates for semiconductor light emitting elements according to the first to sixth working examples and the first and second comparative examples are indicated in Table 1. Note that the modal pitch PS, height HS, and width DS of the small-diameter projections indicated in Table 1 were measured from the small-diameter projections near the apexes of the large-diameter projections.

Meanwhile, the evaluation results for the external quantum efficiency, the screw dislocation density, and the edge dislocation density are indicated in Table 2.

TABLE 1

| | large-diameter projection shape | large-diameter projection modal pitch PL | large-diameter projection height HL | large-diameter projection width DL | small-diameter projection shape |
|---|---|---|---|---|---|
| Working Example 1 | conical shape | 1.0 µm | 0.4 µm | 0.78 µm | conical shape |
| Working Example 2 | truncated cone shape | 3.0 µm | 0.7 µm | 2.7 µm | conical shape |

TABLE 1-continued

| | | | | | |
|---|---|---|---|---|---|
| Working Example 3 | conical shape | 3.0 μm | 1.5 μm | 2.5 μm | conical shape |
| Working Example 4 | truncated cone shape | 3.0 μm | 0.7 μm | 2.7 μm | conical shape |
| Working Example 5 | truncated cone shape | 3.0 μm | 0.7 μm | 2.7 μm | conical shape |
| Working Example 6 | truncated cone shape | 3.0 μm | 1.5 μm | 2.5 μm | conical shape |
| Comparative Example 1 | — | — | — | — | — |
| Comparative Example 2 | conical shape | 3.0 μm | 1.5 μm | 2.5 μm | — |

| | small-diameter projection modal pitch PS | small-diameter projection height HS | small-diameter projection width DS | small-diameter projection in gap | small-diameter projection on flat part of tip of large-diameter projection |
|---|---|---|---|---|---|
| Working Example 1 | 300 nm | 120 nm | 240 nm | ○ | — |
| Working Example 2 | 400 nm | 160 nm | 320 nm | ○ | ○ |
| Working Example 3 | 400 nm | 160 nm | 320 nm | — | — |
| Working Example 4 | 400 nm | 160 nm | 320 nm | — | ○ |
| Working Example 5 | 400 nm | 160 nm | 320 nm | — | — |
| Working Example 6 | 400 nm | 160 nm | 320 nm | — | — |
| Comparative Example 1 | — | — | — | — | — |
| Comparative Example 2 | — | — | — | — | — |

TABLE 2

| | light extraction efficiency improvement rate (external quantum efficiency) | screw dislocation density ρ screw GaN (002) | edge dislocation density ρ edge GaN (302) |
|---|---|---|---|
| Working Example 1 | 1.9 times | $2.7 \times 10^8$ cm$^{-2}$ | $7.9 \times 10^8$ cm$^{-2}$ |
| Working Example 2 | 2.2 times | $1.3 \times 10^8$ cm$^{-2}$ | $5.0 \times 10^8$ cm$^{-2}$ |
| Working Example 3 | 2.4 times | $2.1 \times 10^8$ cm$^{-2}$ | $6.4 \times 10^8$ cm$^{-2}$ |
| Working Example 4 | 2.0 times | $8.8 \times 10^7$ cm$^{-2}$ | $2.2 \times 10^8$ cm$^{-2}$ |
| Working Example 5 | 1.8 times | $7.5 \times 10^7$ cm$^{-2}$ | $1.1 \times 10^8$ cm$^{-2}$ |
| Working Example 6 | 2.5 times | $2.0 \times 10^8$ cm$^{-2}$ | $6.4 \times 10^8$ cm$^{-2}$ |
| Comparative Example 1 | 1.0 times | $1.8 \times 10^9$ cm$^{-2}$ | $5.2 \times 10^9$ cm$^{-2}$ |
| Comparative Example 2 | 1.6 times | $6.5 \times 10^8$ cm$^{-2}$ | $2.1 \times 10^9$ cm$^{-2}$ |

As indicated in Table 2, it was confirmed that the semiconductor light emitting elements according to the first to sixth working examples, which use the substrate for semiconductor light emitting elements having the large-diameter projections and the small-diameter projections, have improved light extraction efficiencies and lower screw dislocation densities and edge dislocation densities than the semiconductor light emitting element according to the first comparative example, which has neither the large-diameter projections nor the small-diameter projections, and the semiconductor light emitting element according to the second comparative example, which does not have the small-diameter projections. As such, providing the substrate for semiconductor light emitting elements with the large-diameter projections and the small-diameter projections makes it possible to improve the light extraction efficiency and reduce crystal defects.

REFERENCE SIGNS LIST

SL Large-diameter particle
SS Small-diameter particle
FL, FS Single-particle film
PL, PS Pitch
11 Element substrate
11S Light emitting structure formation surface
12, 22 Large-diameter projection
13, 23 Small-diameter projection
14 Flat part
15 Bridge portion
16, 17 Base projection
21 Light emitting structure

The invention claimed is:
1. A method for manufacturing a substrate for semiconductor light emitting elements, the method comprising:
   a first step of etching an upper surface of a substrate using a first single-particle film that is a single layer of first particles having a first particle diameter and closely packed two-dimensionally as a mask; and
   a second step of etching the upper surface of the substrate using a second single-particle film that is a single layer of second particles having a second particle diameter and closely packed two-dimensionally that is different from the first particle diameter as a mask.
2. The method for manufacturing a substrate for semiconductor light emitting elements according to claim 1, further comprising:

a step of forming the first single-particle film on the upper surface of the substrate; and a step of forming the second single-particle film on the upper surface of the substrate after the first step, wherein the etching of the second step is carried out after the etching of the first step.

3. The method for manufacturing a substrate for semiconductor light emitting elements according to claim 1, wherein the first particle diameter is greater than the second particle diameter.

4. The method for manufacturing a substrate for semiconductor light emitting elements according to claim 1, wherein the first particle diameter is smaller than the second particle diameter.

5. The method for manufacturing a substrate for semiconductor light emitting elements according to claim 3, wherein the first particle diameter is no less than 300 nm and no greater than 5 μm, the second particle diameter is no less than 100 nm and no greater than 1 μm, and the second particle diameter is no less than 1/50 and no greater than 1/3 the first particle diameter.

6. The method for manufacturing a substrate for semiconductor light emitting elements according to claim 4, wherein the first particle diameter is no less than 100 nm and no greater than 1 μm, the second particle diameter is no less than 300 nm and no greater than 5 μm, and the first particle diameter is no less than 1/10 and no greater than 1/3 the second particle diameter.

7. The method for manufacturing a substrate for semiconductor light emitting elements according to claim 2, wherein in at least one of the first step and the second step, the single-particle film used as a mask in the step is removed from the upper surface of the substrate before the single-particle film is etched away.

8. A method for manufacturing a semiconductor light emitting element, comprising:

a step of forming a substrate for semiconductor light emitting elements through the method for manufacturing a substrate for semiconductor light emitting elements described in claim 1, the step including forming a stepped portion on the upper surface of the substrate through the etching and forming a light emitting structure including a semiconductor layer on the upper surface.

9. A substrate for semiconductor light emitting elements comprising:

a light emitting structure formation surface in which a light emitting structure including a semiconductor layer is formed, wherein the light emitting structure formation surface includes a flat part that extends along a single crystal plane of the substrate, a plurality of large-diameter projections that project from the flat part, and a plurality of small-diameter projections that are smaller than the large-diameter projections; and at least some of the plurality of small-diameter projections include first small-diameter projections that project from an outside surface of the large-diameter projection.

10. The substrate for semiconductor light emitting elements according to claim 9, wherein a height of each of the first small-diameter projections is lower the closer a position of the first small-diameter projection is to a base of the corresponding large-diameter projection in an outside surface of the large-diameter projection.

11. The substrate for semiconductor light emitting elements according to claim 9, wherein a width of each of the first small-diameter projections on the outside surface of the corresponding large-diameter projection is greater the closer a position of the first small-diameter projection is to the base of the corresponding large-diameter projection in the outside surface of the large-diameter projection.

12. A semiconductor light emitting element comprising:

the substrate for semiconductor light emitting elements described in claim 9; and a light emitting structure including a semiconductor layer, wherein the substrate for semiconductor light emitting elements supports the light emitting structure.

13. The method for manufacturing a substrate for semiconductor light emitting elements according to claim 1, wherein:

the first particle diameter is greater than the second particle diameter;

the first step comprises etching the upper surface of the substrate until at least the first single-particle film is etched away, thereby forming base projections on the upper surface of the substrate;

the second step comprises:

providing the second single-particle film on the upper surface of the substrate on which the base projections are formed; and etching the upper surface of the substrate until at least the second single-particle film is etched away, thereby forming, on the upper surface of the substrate;

a flat part that extends along a single crystal plane of the substrate;

a plurality of large-diameter projections that project from the flat part; and a plurality of small-diameter projections that are smaller than the large-diameter projections;

the plurality of small-diameter projections include:

first small-diameter projections that project from an outside surface of the large-diameter projection; and second small-diameter projections that project from the flat part.

14. The method for manufacturing a substrate for semiconductor light emitting elements according to claim 1, wherein:

the first particle diameter is greater than the second particle diameter;

the first step comprises:

stopping the etching of the upper surface of the substrate before the first single-particle film is etched away; and removing the first single-particle film from the upper surface of the substrate, thereby forming base projections that have a truncated cone shape on the upper surface of the substrate;

the second step comprises:

providing the second single-particle film on the upper surface of the substrate on which the base projections are formed; and etching the upper surface of the substrate until at least the second single-particle film is etched away, thereby forming, on the upper surface of the substrate;

a flat part that extends along a single crystal plane of the substrate;

a plurality of large-diameter projections that project from the flat part and have a truncated cone shape; and a plurality of small-diameter projections that are smaller than the large-diameter projections;

the plurality of small-diameter projections include:
first small-diameter projections that project from an outside surface of the large-diameter projection; and
second small-diameter projections that project from the flat part.

15. The method for manufacturing a substrate for semiconductor light emitting elements according to claim 1, wherein:

the first particle diameter is smaller than the second particle diameter;

the first step comprises etching the upper surface of the substrate until at least the first single-particle film is etched away, thereby forming base projections on the upper surface of the substrate;

the second step comprises:
providing the second single-particle film on the upper surface of the substrate on which the base projections are formed; and
etching the upper surface of the substrate until at least the second single-particle film is etched away, thereby forming, on the upper surface of the substrate;
a flat part that extends along a single crystal plane of the substrate;
a plurality of large-diameter projections that project from the flat part; and
a plurality of small-diameter projections that are smaller than the large-diameter projections and project from an outside surface of the large-diameter projection.

16. The method for manufacturing a substrate for semiconductor light emitting elements according to claim 1, wherein:

the first particle diameter is smaller than the second particle diameter;

the first step comprises etching the upper surface of the substrate until at least the first single-particle film is etched away, thereby forming base projections on the upper surface of the substrate;

the second step comprises:
providing the second single-particle film on the upper surface of the substrate on which the base projections are formed;
stopping the etching of the upper surface of the substrate before the second single-particle film is etched away; and
removing the second single-particle film from the upper surface of the substrate, thereby forming, on the upper surface of the substrate;
a flat part that extends along a single crystal plane of the substrate;
a plurality of large-diameter projections that project from the flat part and have a truncated cone shape; and
a plurality of small-diameter projections that are smaller than the large-diameter projections and project from an outside surface of the large-diameter projection.

17. A method for manufacturing a substrate for semiconductor light emitting elements, the method comprising:

providing a first single-particle film that is a single layer of first particles having a first particle diameter, and closely packed two-dimensionally, on an upper surface of a substrate;

providing a second single-particle film that is a single layer of second particles having a second particle diameter that is different from the first particle diameter, and closely packed two-dimensionally, on the upper surface of a substrate;

etching the upper surface of the substrate using the first single-particle film and the second single-particle film as a mask.

18. The method for manufacturing a substrate for semiconductor light emitting elements according to claim 17, wherein:

the first particle diameter is smaller than the second particle diameter.

19. The method for manufacturing a substrate for semiconductor light emitting elements according to claim 18, wherein:

the second particle diameter is no less than 300 nm and no greater than 5 µm, the first particle diameter is no less than 100 nm and no greater than 1 µm, and the first particle diameter is no less than 1/50 and no greater than 1/3 the second particle diameter.

20. The method for manufacturing a substrate for semiconductor light emitting elements according to claim 1, wherein:

the first particle diameter is smaller than the second particle diameter;

the etching comprises:
stopping the etching of the upper surface of the substrate before the second single-particle film is etched away; and
removing the second single-particle film from the upper surface of the substrate, thereby forming, on the upper surface of the substrate;
a flat part that extends along a single crystal plane of the substrate;
a plurality of large-diameter projections that project from the flat part and have a truncated cone shape; and
a plurality of small-diameter projections that are smaller than the large-diameter projections and project from an outside surface of the large-diameter projection.

21. The method for manufacturing a substrate for semiconductor light emitting elements according to claim 17, wherein:

the first particle diameter is smaller than the second particle diameter;

the etching comprises:
etching the upper surface of the substrate until at least the second single-particle film is etched away, thereby forming, on the upper surface of the substrate;
a flat part that extends along a single crystal plane of the substrate;
a plurality of large-diameter projections that project from the flat part; and
a plurality of small-diameter projections that are smaller than the large-diameter projections and project from an outside surface of the large-diameter projection.

* * * * *